(12) United States Patent
Arita et al.

(10) Patent No.: US 7,059,512 B2
(45) Date of Patent: Jun. 13, 2006

(54) SOLDER ALLOY MATERIAL LAYER COMPOSITION, ELECTROCONDUCTIVE AND ADHESIVE COMPOSITION, FLUX MATERIAL LAYER COMPOSITION, SOLDER BALL TRANSFERRING SHEET, BUMP AND BUMP FORMING PROCESS, AND SEMICONDUCTOR DEVICE

(75) Inventors: Hitoshi Arita, Kanagawa (JP); Akio Kojima, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 322 days.

(21) Appl. No.: 10/701,061

(22) Filed: Nov. 4, 2003

(65) Prior Publication Data

US 2004/0129344 A1    Jul. 8, 2004

(30) Foreign Application Priority Data

Nov. 6, 2002   (JP) .................... 2002-322678
Nov. 25, 2002  (JP) .................... 2002-340384
Nov. 26, 2002  (JP) .................... 2002-342329

(51) Int. Cl.
    *B23K 35/14*    (2006.01)
(52) U.S. Cl. .................. 228/254; 148/23; 228/261; 438/613
(58) Field of Classification Search ............. 228/227, 228/229, 248.5, 180.21, 180.22, 248.1, 261; 156/237.9, 307.3, 327; 29/843, 854, 860; 438/119, 613; 148/23; 428/620; 257/772

See application file for complete search history.

(56) References Cited

U.S. PATENT DOCUMENTS 4,113,578 A  * 9/1978  Del Monte ................ 205/125
5,326,678 A    7/1994  Kojima et al.
5,350,653 A    9/1994  Shoshi et al.
5,387,487 A    2/1995  Shoshi et al.
5,486,438 A    1/1996  Shoshi et al.
5,492,784 A    2/1996  Yoshikawa et al.
5,700,614 A   12/1997  Kawahara et al.
5,750,762 A    5/1998  Kawahara et al.
5,840,417 A  * 11/1998  Bolger ..................... 428/323
5,879,439 A    3/1999  Nagai et al.
5,882,390 A    3/1999  Nagai et al.
5,972,082 A   10/1999  Koyano et al.
5,993,524 A   11/1999  Nagai et al.
6,120,589 A    9/2000  Bannai et al.
6,214,636 B1 *  4/2001  Sawayama et al. ........... 438/57
6,231,652 B1    5/2001  Koyano et al.
6,247,640 B1 *  6/2001  Kuwazaki et al. .......... 228/245
6,261,349 B1    7/2001  Nagai et al.
6,372,547 B1 *  4/2002  Nakamura et al. .......... 438/118
6,613,136 B1    9/2003  Arita et al.
6,792,677 B1 *  9/2004  Oishi et al. ................ 29/840
2002/0051728 A1 * 5/2002  Sato et al. ................. 420/562
2002/0083866 A1    7/2002  Arita et al.
2002/0096085 A1    7/2002  Gotoh et al.
2002/0135650 A1    9/2002  Nagai et al.

(Continued)

*Primary Examiner*—Jonathan Johnson
(74) *Attorney, Agent, or Firm*—Cooper & Dunham LLP

(57) ABSTRACT

An object of the present invention is to provide solder bumps sufficiently satisfying the expected functions and having a small diameter which conventional methods cannot attain, a semiconductor device on which these bumps are mounted, and a bump transferring sheet. The present invention provides a method for forming the bumps, which includes forming a solder alloy material layer and flux material layer one by one on an intermediate metallic layer formed on an external electrode pad in a semiconductor device, and then fusing these layers, wherein each of the solder alloy material layer and flux material layer is formed by a liquid spraying method (e.g., ink jetting method).

8 Claims, 13 Drawing Sheets

U.S. PATENT DOCUMENTS

| | | |
|---|---|---|
| 2003/0010252 A1 | 1/2003 | Arita et al. |
| 2003/0038869 A1 | 2/2003 | Kaneko et al. |
| 2003/0064206 A1 | 4/2003 | Koyano et al. |
| 2003/0079647 A1 | 5/2003 | Kaneko et al. |
| 2003/0107632 A1 | 6/2003 | Arita et al. |
| 2003/0138991 A1* | 7/2003 | Kung .................. 438/106 |

* cited by examiner

FIG. 7
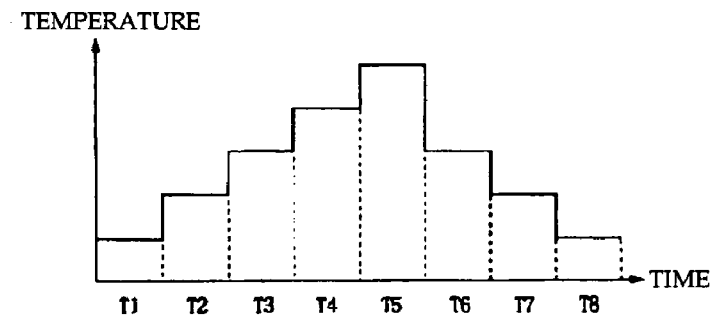
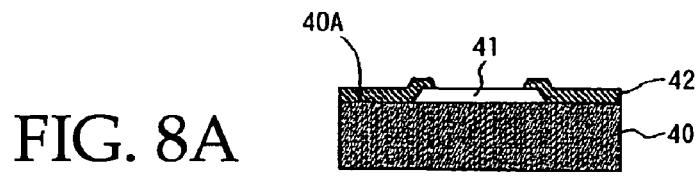
FIG. 8A
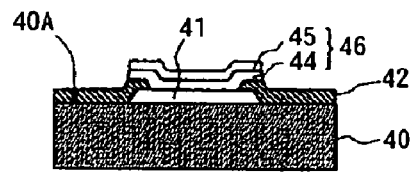
FIG. 8B
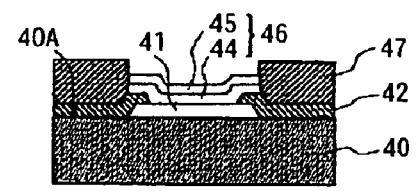
FIG. 8C
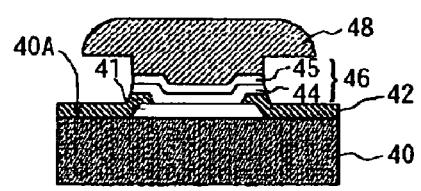
FIG. 8D
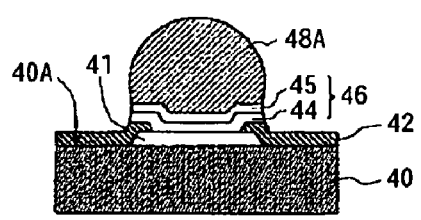
FIG. 8E

FIG. 10
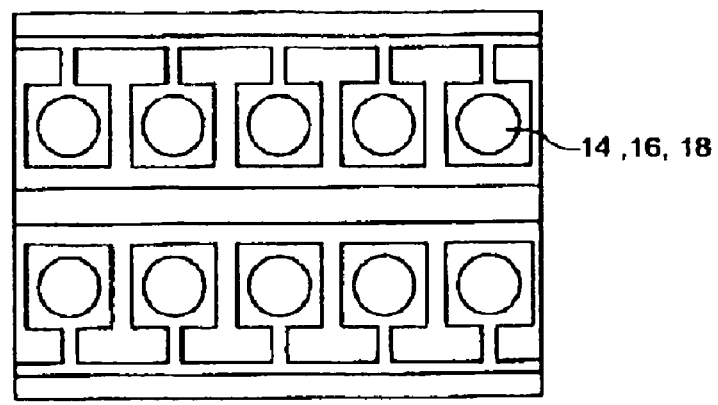
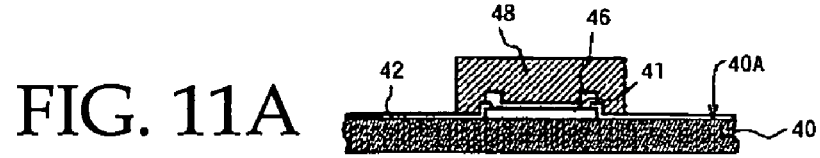
FIG. 11A
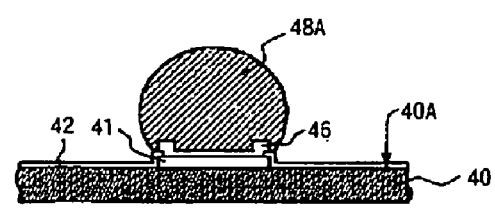
FIG. 11B
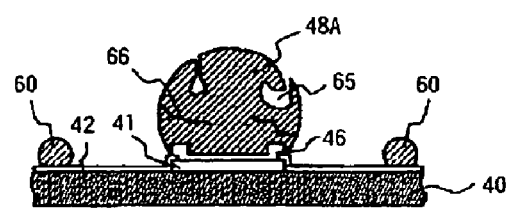
FIG. 11C

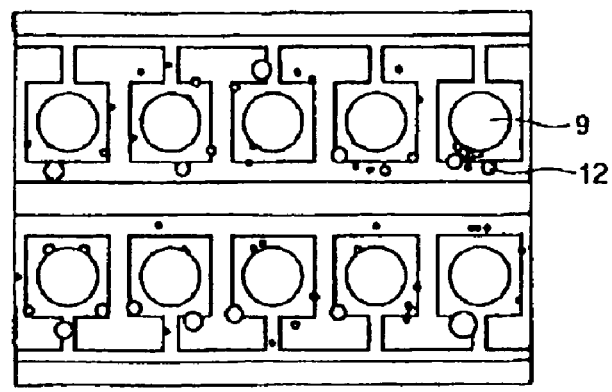
FIG. 15A
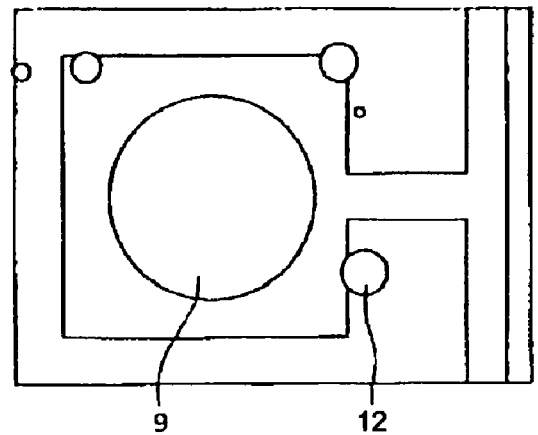
FIG. 15B
FIG. 16
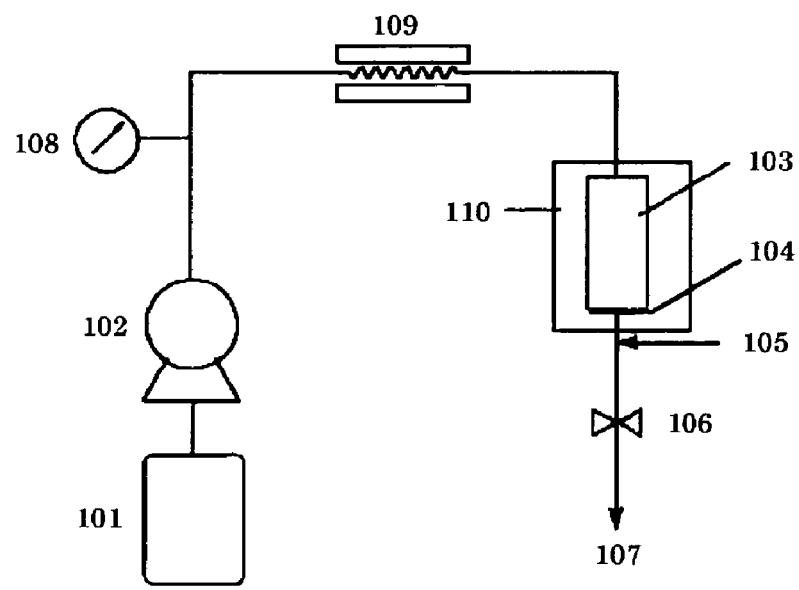

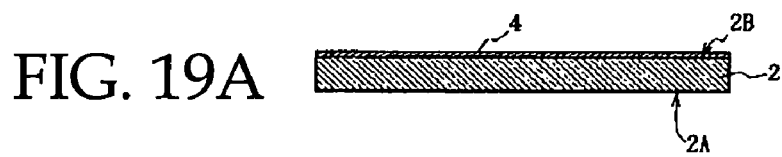
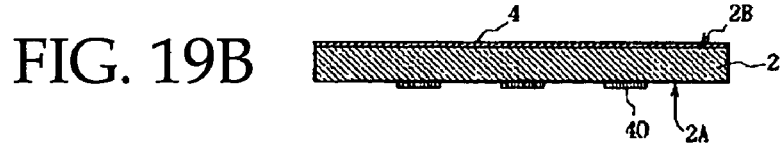
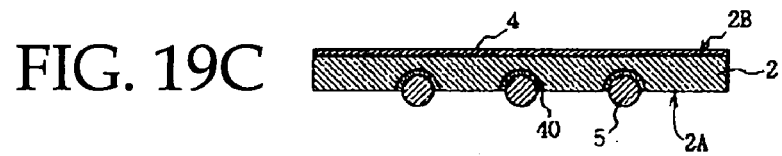
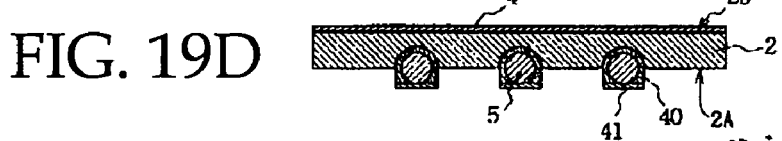
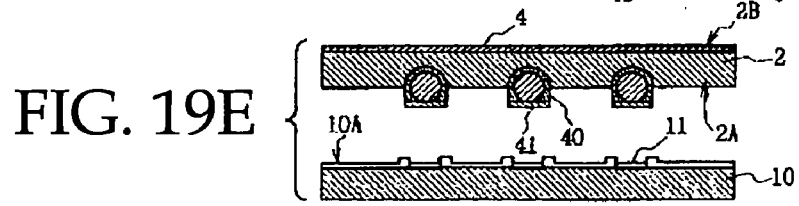
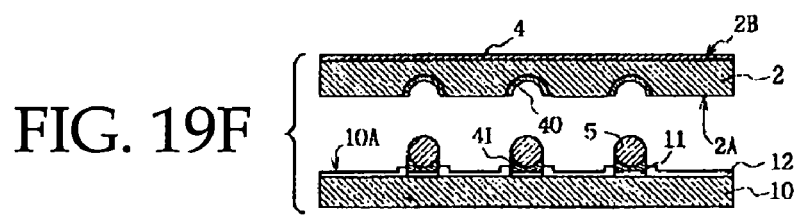
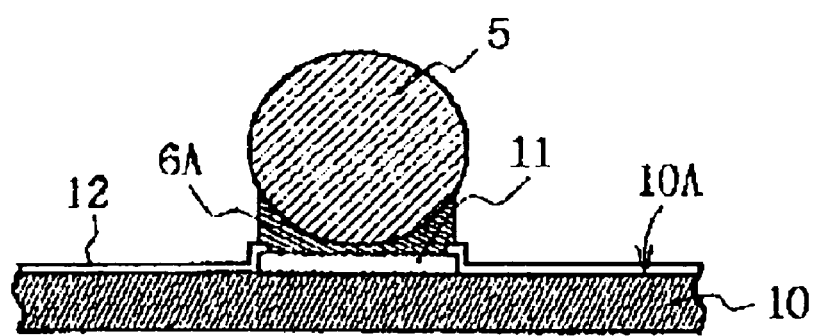

SOLDER ALLOY MATERIAL LAYER COMPOSITION, ELECTROCONDUCTIVE AND ADHESIVE COMPOSITION, FLUX MATERIAL LAYER COMPOSITION, SOLDER BALL TRANSFERRING SHEET, BUMP AND BUMP FORMING PROCESS, AND SEMICONDUCTOR DEVICE

BACKGROUND OF THE INVENTION

1. Field of the Invention

The present invention relates to a solder alloy material layer composition, an electroconductive and adhesive composition, and a flux material forming composition used for forming projected electrodes (the so-called bumps) at bump forming points on an object on which the bumps are to be formed; solder ball transferring sheet; bump forming process for forming the bumps; and semiconductor device with the bumps formed by the bump forming process.

2. Description of the Related Art

Recently, semiconductor packages have been more and more integrated to need more input/output terminals, and becoming more difficult to assemble by lead pins or the like. Therefore, the conventional packaging technology has been replaced by the so-called ball grid array (BGA) technology, which uses solder balls in place of pins for bonding semiconductor chips to a printed-wiring board.

The package type called chip size package (CSP), whose size is decreased as far as possible to a semiconductor chip size, has been developed to realize the package of smaller size and higher density. For the CSPs, the so-called flip chip bonding technology, which bonds semiconductor chips to a board with the pad opening side facing the board, has been attracting attention and extensively studied.

The flip chip bonding technology needs a bump on a chip to bond the chip to a board, and a solder ball is used as the bump in some methods. The method which has been attracting attention for forming the bumps collectively forms a number of solder ball bumps for each semiconductor chip on a silicon wafer before it is diced into individual chips.

The solder bumps may be collectively formed at low cost on electrodes on a silicon wafer by the following known techniques: (1) a creamy solder material is screen-printed on electrodes on a wafer and then fused under heating, or (2) wedge-like cavities are formed in a diamond-shape pattern on a silicon substrate by anisotropic etching, filled with solder paste and heated to form solder balls, which are then transferred to a semiconductor package or semiconductor electrodes (disclosed by, e.g., Japanese Patent Application Laid-Open (JP-A) No. 9-36118).

When bumps are to be formed on an object on which the bumps are to be formed, e.g., wafer with circuits (hereinafter sometimes referred to as "integrated circuits (ICs)") for corresponding IC chips, they are formed on each of external electrodes (pads) on each IC by the following procedure.

First, the periphery around each pad of aluminum or the like for each IC formed on a wafer on one side, is electrically protected with a passivation film. Next, that wafer side is laminated with a positive or negative photoresist film, which is exposed for each pad, and developed to expose the pad. Then, the wafer is set on a sputtering apparatus, and formed on that wafer side by sputtering is a ball limiting metal (BLM) film layer capable of improving adhesion between the pads on the wafer and bumps.

The BLM film layer comprises an adhesive layer of chromium (Cr) or the like and barrier metal layer (or barrier layer) of copper (Cu) or the like, laminated in sequence. It is referred to as an intermediate metallic layer or Cr/Cu/Au layer.

Then, the photoresist film is separated from the wafer to remove the associated BLM film layer laminated on that photoresist film, leaving the BLM film layer laminated on each pad on the wafer.

Then, that wafer side is again laminated with a photoresist film, which is exposed for each pad, and developed to expose the pad. It is laminated with a bump material by an adequate method, e.g., plating, evaporation or printing (in which a metal mask with openings corresponding to each BLM film layer is used, in place of the photoresist film). Then, the photoresist film laminated on one side of the wafer is separated from the wafer to remove the associated bump material laminated on that photoresist film, leaving the bump material on each BLM film layer.

The bump material comprises layers of lead and tin laminated one over another, where it is prepared in such a way that lead accounts for 90 to 98% by mass of the whole bump material and tin for 10 to 2% by mass depending on the amount of lead.

Then, the wafer is spread on one side with a flux by an adequate procedure, and heated at a given temperature in a fusing furnace in an atmosphere of nitrogen, to fuse lead and tin in the bump material. This synthesizes the solder of lead and tin, producing solder spheres by the surface tension of the melt metal and an effect of the flux. Thus, the spherical bumps of the solder are formed on each pad for the ICs on the wafer via the BLM film layer.

The above procedure for forming the bumps invariably needs the steps for forming a photoresist film and for releasing the film, as discussed above, when a BLM film layer is to be laminated on each pad on a wafer (this step is sometimes referred to as "BLM film layer forming step"). It should be noted that number of wafers which a sputtering apparatus can process in one step is limited to around 3 to 5. Therefore, the BLM film layer forming step involves the problems resulting from the complex steps and very time-consuming works it needs.

Moreover, the photoresist film releasing step removes the photoresist film together with the associated BLM film layer, the separated BLM film layer accounting for at least 99% by mass of the whole BLM film layer laminated on the wafer. As a result, 2 or more types of metallic materials for the BLM film laminated on the wafer on one side are wasted almost totally, pushing up the production cost.

Moreover, chromium for the BLM film layer is a metal harmful to human. Still more, a strongly alkaline solution and organic solvent, also harmful to human, are needed for releasing the photoresist film from the wafer. Therefore, the BLM film layer forming step should secure the safe working environment for the workers, and need some facilities therefor and waste treatment system for safely treating the alkaline solution and organic solvent wastes, making the whole system more complex.

The photoresist film releasing step may not completely remove the film, slightly leaving it on the passivation film. The residual photoresist may be scorched on the passivation film, when each bump material on the BLM film layer is fused under heating, which causes other problems.

On the other hand, the step for forming bumps (hereinafter sometimes referred to as "bump material forming step") invariably needs the steps for forming a photoresist film (or metal mask) and for releasing the film, when the bump material is to be laminated on the BLM film layer, as is the case with the BLM film layer forming step, making the bump material forming step more complex.

Moreover, the photoresist film releasing step in the bump material forming step removes the photoresist film together with the associated bump material laminated on the wafer on one side, the separated bump material accounting for at least 99% by mass of the whole bump material laminated on the wafer, as is the case with the BLM film layer forming step. As a result, the bump material (composed of lead and tin) laminated on the wafer on one side is wasted almost totally, pushing up the production cost.

Still more, the photoresist releasing step in the bump material forming step may not completely remove the film, slightly leaving it on the passivation film. The residual photoresist may be scorched on the passivation film, when the bump material is fused under heating, which causes other problems.

The plating treatment, when used for the bump material forming step, needs an acidic solution, alkaline solution and organic solvent harmful to human. Therefore, this step should also secure the safe working environment for the workers, and need some facilities therefor and waste treatment system for safely treating the acidic solution, alkaline solution and organic solvent wastes, making the whole system more complex.

The bump material forming step involving plating for the wafer should cope with irregularities caused by the photoresist film formed beforehand on the wafer on one side, because plating current distribution, which depends on wafer surface conditions, may be uneven. Therefore, it may be difficult for the plating treatment to distribute lead and tin which constitute the bump material on the wafer surface to given thicknesses, possibly causing uneven bump material composition.

Therefore, when the resulting bump material formed on the BLM film layer is fused under heating, after a flux is spread thereon, the fused lead will be unevenly synthesized with tin, to cause defects, e.g., bubble-caused defects (hereinafter sometimes referred to as "voids") or cracks within the bump, and other problems, e.g., formation of bumps with different sizes, formation of distorted bump (hereinafter sometimes referred to as "irregularly shaped bump") or scattering bump on the passivation film (such a bump is hereinafter sometimes referred to as "scattered bump"). These problems can lead to bridging of the adjacent bumps.

On the other hand, the bump material forming step which uses evaporation involves problems resulting from very time-consuming works for laminating a bump material of the BLM film layers for a plurality of wafers, because number of wafers which an evaporator can process in one step is limited to around 3 to 5. Moreover, it may be difficult for an evaporator to distribute the evaporation sources (lead and tin which constitute the bump material) on the wafer surface to a given thickness, because of structural reasons, e.g., the wafer being set up with its surface slanted.

These problems may scatter the bump material composition of lead and tin, as is the case with the step involving plating. Therefore, when the resulting bump material on the BLM film layer is fused under heating to form the bumps, the fused lead will be unevenly synthesized with tin, to cause voids or cracks within the bump, bumps of irregular size or shape, or scattered bumps on the passivation film. These problems can lead to bridging of the adjacent bumps.

On the other hand, the printing treatment, when used for the bump material forming step, puts a creamy solder by a squeezee on the BLM film layers via a metal mask with openings each corresponding to a BLM film layer. This treatment involves problems of deteriorated printing accuracy resulting from, e.g., uneven gap between the squeezee and metal mask to scatter quantity of the creamy solder printed on the BLM film layers via the openings of the metal mask. As a result, it can deteriorate reliability on printing accuracy. Moreover, the unevenly distributed creamy solder may cause bumps of irregular size or shape, which can lead to bridging of the adjacent bumps.

This bump forming process is designed to wash out the residual flux on the wafer with various organic solvents, after forming the bump on each pad on the wafer. Therefore, this washing system should secure the safe working environment for the workers, and need some facilities therefor and waste treatment system for safely treating these organic solvent wastes, making the system more complex.

As discussed above, the conventional bump forming process involves a plurality of steps, and any step failing to satisfy the desired performance makes all the upstream steps useless. Therefore, in this bump forming process, the damage becomes larger as a failure occurs at a more downstream step.

Some bump forming processes have been proposed to solve the above problems. For example, Japanese Patent Application Laid-Open UP-A) No. 9-205095 discloses a process for forming bumps at bump forming points on an object on which these bumps are to be formed, comprising the first step for disposing the bumps on a substrate on one side such that each position of the bump corresponds to a bump forming point on the object on which these bumps are to be formed, second step for supplying an electroconductive adhesive agent to the bumps or the bump forming points on the object on which these bumps are to be formed, third step for positioning each bump and corresponding bump forming point by placing the substrate against the object on which these bumps are to be formed in such a way to bring each bump into contact with the corresponding bump forming point via the adhesive agent, fourth step for fixing the bump on the corresponding bump forming point by solidifying the adhesive agent, and fifth step for releasing the substrate from the bumps fixed on the points on the object (claim 1, and Page 4, from line 44 in the left column to line 7 in the right column of JP-A No. 9-205095). It has been confirmed that this process can shorten the bump forming step.

JP-A No. 9-10988 proposes a flux material for forming solder bumps, comprising at least a rosin, activator and solvent. More specifically, it comprises a natural rosin and hydrogenated rosin, solute incorporated at an optional content in a range from 1 to 99% by mass relative to the total amount of the natural and hydrogenated rosins, activator working at a predetermined temperature, and solvent for dissolving the natural and hydrogenated rosins, solute, and activator claim 1, and from line 13 in the right column in Page 3 to line 18 in the right column in Page 6). The flux material has been confirmed to bring various advantages of, e.g., giving the solder bumps smooth, glossy surface, almost ideal spherical shape and free of voids or cracks inside, and of preventing scattering of solder alloy while the bumps are being formed.

JP-A No. 8-155675 proposes a solder bump forming flux material which brings advantages of giving the bumps of surface gloss, characteristics and shape and of preventing scattering of solder alloy while the bumps are being formed, and comprises at least a rosin, activator containing a component which can be decomposed and sublimated at 100° C. to 300° C. and another component which can be decomposed and activated at 350 to 400° C., and solvent claim 1, and line 33 in the right column in Page 4 to line 19 in Page 5).

However, the bump forming process still involves problems, even when it uses such improved flux. It is normally designed to wash out the residual flux on the wafer with various organic solvents, after forming the bump on each pad on the wafer. Therefore, this washing system should secure the safe working environment for the workers, and need some facilities therefor and waste treatment system for safely treating these organic solvent wastes, making the system more complex.

The conventional bump forming process can give the solder bumps whose size is limited to around 50 µm, and is difficult to produce smaller bumps, particularly on a commercial scale, which is one of the basic problems involved in the conventional method, because of the complex steps to be repeated many times. As a result, the bumps formed tend to be uneven, the tendency being more noted as the bump size decreases, to make it more difficult to give the bumps of uniform size. Moreover, the bumps formed by the conventional method tend to suffer voids, cracks and irregular shape, the tendency being also more noted as the bump size decreases.

In other words, the conventional process needs stricter process management as the bump size decreases, and in addition, since the starting materials are mostly wasted for the final product and the process needs heat treatment, it causes environmental and energy efficiency problems.

However, the Internet society will need ICs integrated to a higher extent and mounted at a higher density. Therefore, development of smaller bumps, in particular those having a size of 30 µm or less, have been recently expected. Nevertheless, however, no proposal has been made to meet these requirements.

Moreover, the bumps formed by the conventional method still involve problems, because they are observed to have voids or cracks, and separate from the intermediate metallic layer or pad.

The solder bumps are normally subjected to the following 5 tests.
(1) Metaloscopic observation of outer appearances of solder bumps
(2) SEM observation of bump cross-sections
(3) Mechanical strength tests (shear test/tensile strength test)
(4) Washability test
(5) Reliability test for an assembly with IC chips bonded to a printed-wiring board The bumps produced by the conventional methods show a number of problems listed below, solutions of which have been strongly demanded.

TABLE 1

| Testing items | Problems | Specified properties or values |
|---|---|---|
| Microscopic observation (outer appearances) | Blackened surface, A number of bumps of irregular shape or scattered bumps observed, A number of bridges observed | Gloss, Surface characteristics, Good shape, Ideally spherical |
| SEM observation (outer appearances and cross-section) | A number of voids observed, A number of cracks observed, A number of bumps of irregular shape observed, Excessive diffusion through the BLM film layer | Good adhesion between the pad and bump |
| Shear test (strength) | 5 gf No Good | >8 gf |
| Tensile test | 500 gf No Good | >1200 gf |
| Washability test | Black or white residue observed | No residue observed |
| Thermal shock program (temperature cycle) test 30–150° C. | No Good in 500 cycles | OK in 1000 cycles |
| Ion migration test | No Good in 500 hours | OK in 1000 hours |
| High-temperature reliability test 120° C. 210° C. | No Good in 500 hours at 120° C. No Good in 100 hours at 210° C. | OK in 1000 hours at 120° C., 210° C. |

It is an object of the present invention to provide a semiconductor device with solder bumps sufficiently satisfying the expected functions and having a small diameter which the conventional process cannot attain.

It is another object of the present invention to provide a semiconductor device with solder bumps with fewer occurrences of voids and cracks.

It is still another object of the present invention to provide a semiconductor device with solder bumps resistant to separation from an intermediate metallic layer or pad.

It is yet another object of the present invention to provide a bump forming process which can greatly reduce the working time, and bump forming compositions (solder alloy material, electroconductive adhesive and flux material layer compositions) for the process.

It is still another object of the present invention to provide an ink-jetting type bump forming process which can greatly simplify the working steps and reduce the working time, form finely pitched, highly reliable solder bumps at a low cost, and greatly improve the product yield; a bump forming compositions (solder alloy material, electroconductive adhesive and flux material layer compositions); solder ball transferring sheet; and a semiconductor device.

SUMMARY OF THE INVENTION

The inventors of the present invention have confirmed, after having extensively studied to solve the above problems, that a liquid spraying method (e.g., ink jetting method) for forming a solder alloy material layer and flux material layer is very effective for producing the desired bumps, because it can easily control the operating parameters, e.g., discharge rate, when these layers are formed one by one on an intermediate metallic layer on an external electrode pad in a semiconductor device and fused under heating to form the bumps.

They have also confirmed that forming an electroconductive adhesive layer in place of intermediate metallic layer by a liquid spraying method (e.g., ink jetting method) is effective.

They have also confirmed that a step carried out in a supercritical or subcritical fluid, when used for producing an ink composition for the liquid spraying method (e.g., ink jetting method) is particularly effective for forming the desired solder bumps, because it can produce the ink composition stably containing superfine, uniformly sized particles of 10 nm or less.

The semiconductor device of the present invention is characterized in that it has solder bumps of 30 µm or less in diameter, believed to be impossible for the conventional method to produce. The solder bump is characterized in that it contains a limited number of voids or cracks, and is resistant to separation from an intermediate metallic layer or pad.

The process for forming the solder bumps of the present invention having the above characteristics is not limited. However, the inventors of the present invention adopt a liquid spraying method (e.g., ink jetting method) to realize such bumps, as discussed above. No method has adopted a liquid spraying method (e.g., ink jetting method) for forming bumps, to the best knowledge of the inventors.

The ink composition for the liquid spraying method (e.g., ink jetting method) preferably contains superfine, uniformly sized particles. It has been confirmed that use of a supercritical or subcritical fluid is particularly preferable for producing the ink composition, as discussed above. The liquid spraying method (e.g., ink jetting method) using such ink composition can form the desired bumps particularly easily.

The solder alloy material layer composition of the present invention comprises at least a solder alloy material, solvent and wetting agent, and characterized in that it is used for forming a solder alloy material layer by a liquid spraying method (e.g., ink jetting method).

The electroconductive, adhesive composition of the present invention comprises at least an electroconductive material, solvent and wetting agent, and characterized in that it is used for forming an electroconductive, adhesive layer by a liquid spraying method (e.g., ink jetting method).

The flux material layer composition of the present invention comprises at least a rosin, activator and solvent, and characterized in that it is used for forming a flux material layer by a liquid spraying method (e.g., ink jetting method).

These compositions of the present invention can easily realize formation of the desired solder bumps by a liquid spraying method (e.g., ink jetting method).

The first aspect of the bump forming process of the present invention forms a solder alloy material layer and flux material layer one by one on an intermediate metallic layer on an external electrode pad in a semiconductor device, and then fuses these layers under heating to form a bump, comprising at least one step selected from the group consisting of:

an electroconductive adhesive layer forming step for forming an electroconductive adhesive layer serving as the intermediate metallic layer on an external electrode pad in a semiconductor device by spraying a liquid of electroconductive, adhesive composition comprising at least an electroconductive material, solvent and wetting agent, a solder alloy material layer forming step for forming a solder alloy material layer on the intermediate metallic layer by spraying a liquid of solder alloy material layer composition comprising at least a solder alloy material, solvent and wetting agent, and a flux material layer forming step for forming a flux material layer on the solder alloy material layer by spraying a liquid of flux material layer composition comprising at least a rosin, activator and solvent.

The first aspect of the bump forming process of the present invention can form the bumps more simply and quickly at a lower cost than the conventional bump forming process. It realizes the bump forming process which can greatly reduce working time for the bump forming steps, and form the small solder bumps, impossible for the conventional process to produce. More specifically, they are 30 µm or less in diameter, 10 µm or less or even 1 µm or less.

The second aspect of the bump forming process of the present invention comprises a solder ball disposing step for disposing solder balls on a substrate on one side in such a way that each solder ball is disposed at a position corresponding to its respective bump forming point on an object on which these bumps are to be formed; electroconductive, adhesive composition supplying step for supplying an electroconductive, adhesive composition by a liquid spraying method to the bump forming points on the object on which these bumps are to be formed; positioning step for positioning each solder ball and corresponding bump forming point by placing the substrate against the object on which the bumps are to be formed in such a way to bring each solder ball into contact with the corresponding bump forming point via the electroconductive, adhesive composition; solder ball fixing step for fixing the solder ball on the corresponding bump forming point by solidifying the electroconductive, adhesive composition; and substrate releasing step for releasing the substrate from the bump fixed on the bump forming point on the object on which the bumps are formed.

The second aspect of the bump forming process of the present invention forms an electroconductive, adhesive layer on external electrode pads in a semiconductor device by a liquid spraying method (e.g., ink jetting method) and transfers solder balls onto the electroconductive, adhesive layer, or forms an electroconductive, adhesive layer on solder balls and transfers the balls onto the pads. As such, it can form the bumps more simply and quickly at a lower cost than the conventional bump forming process. It realizes the bump forming process which can greatly reduce working time for the bump forming steps. Moreover, it forms an electroconductive, adhesive layer in place of an intermediate metallic layer by an ink jetting method, dispensing with the complex, intermediate metallic layer forming step and solvent treatment step.

The bump of the present invention can be produced by spraying a liquid of solder alloy material layer composition comprising at least a solder alloy material, solvent and wetting agent onto an intermediate metallic layer on an external electrode pad in a semiconductor device to form the solder alloy material layer, spraying a liquid of flux material layer composition comprising at least a rosin, activator and solvent onto the solder alloy material layer to form the flux material layer, and fusing the solder alloy material layer and flux material layer under heating.

The solder ball transferring sheet of the present invention comprises a substrate which is provided with bumps at given positions on a substrate on one side.

The solder ball transferring sheet of the present invention is produced by the method which forms an electroconductive, adhesive layer on an external electrode pad in a semiconductor device by a liquid spraying method (e.g., ink jetting method) and transfers solder balls onto the electroconductive, adhesive layer, or forms an electroconductive, adhesive layer on solder balls and transfers the balls onto the pad. As such, it is possible to form bumps more simply and quickly at a lower cost than the conventional bump forming process. It realizes the bump forming process which can greatly reduce working time for the bump forming steps. Moreover, it forms an electroconductive, adhesive layer in place of an intermediate metallic layer by an ink jetting method, dispensing with the complex, intermediate metallic layer forming step and solvent treatment step.

The first aspect of the semiconductor device of the present invention comprises an intermediate metallic layer and bumps formed one by one on external electrode pads, wherein these bumps are formed by a liquid spraying method and have a diameter of 30 μm or less.

The second aspect of the semiconductor device of the present invention is produced by the bump forming process comprising a solder ball disposing step for disposing solder balls on a substrate on one side in such a way that each solder ball is disposed at a position corresponding to its respective bump forming point on an object on which these bumps are to be formed; electroconductive, adhesive composition supplying step for supplying an electroconductive, adhesive composition by a liquid spraying method to the bump forming points on the object on which these bumps are to be formed; positioning step for positioning each solder ball and corresponding bump forming point by placing the substrate against the object on which the bumps are to be formed in such a way to bring each solder ball into contact with the corresponding bump forming point via the electroconductive, adhesive composition; solder ball fixing step for fixing the solder ball on the corresponding bump forming point by solidifying the electroconductive, adhesive composition; and substrate releasing step for releasing the substrate from the bump fixed on the bump forming point on the object on which the bumps are formed. These bumps have a diameter of 30 μm or less.

Each of the semiconductor devices falling into the first or second aspect of the present invention has solder bumps sufficiently satisfying the expected functions and having a small diameter which the conventional process cannot attain. It is of high quality with the bumps having a limited number of voids or cracks.

BRIEF DESCRIPTION OF THE DRAWINGS

FIG. 7 outlines a temperature profile in the wet back treatment conducted in EXAMPLE.

FIGS. 8A to 8E are schematic cross-sectional views illustrating the conventional bump forming scheme.

FIG. 10 outlines the bumps formed with a flux in EXAMPLE.

FIGS. 11A to 11C illustrate an irregularly shaped bump and scattered bump formed by the conventional process.

FIGS. 15A and 15B illustrate a solder bump formed with a conventional flux.

FIG. 16 outlines a supercritical fluid apparatus.

FIGS. 19A to 19F illustrate another bump forming procedure used in EXAMPLE.

FIG. 20 illustrates a bump formed on a wafer pad.

Figure 1:
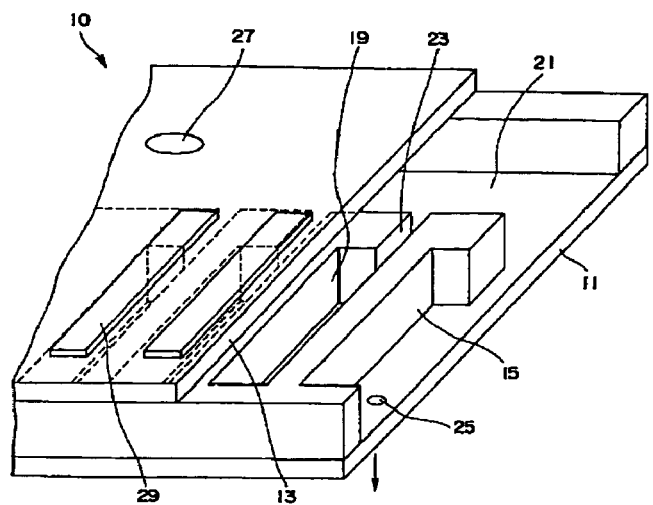
FIG. 1 is a perspective view illustrating a structural example of ink jet printer head used for the bump forming process of the present invention.

DESCRIPTION OF THE PREFERRED EMBODIMENTS (Solder Alloy Material, Electroconductive Adhesive and Flux Material Layer Compositions)

The solder alloy material layer composition of the present invention comprises at least a solder alloy material, solvent and wetting agent, and is used for forming a solder alloy material layer by a liquid spraying method.

The electroconductive, adhesive composition of the present invention comprises at least an electroconductive material, solvent and wetting agent, and is used for forming an electroconductive, adhesive layer by a liquid spraying method.

The flux material layer composition of the present invention comprises at least a rosin, activator and solvent, and is used for forming a flux material layer by a liquid spraying method.

It is particularly effective for production of the solder bump of the present invention to use the solder alloy material, electroconductive adhesive and flux material layer compositions (these compositions are hereinafter sometimes referred to merely as a "bump forming ink composition" or "ink composition") having the following characteristics (1) to (3).

(1) An ink composition to be spread by an ink jetting method used in the bump forming process and comprising one of solder alloy material, electroconductive adhesive material and flux material, characterized in that it has a viscosity of 1 mPa·s to 20 mPa·s, surface tension of 20 mN/m to 70 mN/m and contact angle of 30° to 170° with a material which constitutes the liquid spraying nozzle surface.

The ink composition (1) can secure stable discharge of the liquid from the nozzle for a liquid spraying method (e.g., ink jetting method), in particular for an ink jetting method, because it can reduce clogging of the nozzle pore and curved travel of the ink droplets, and can be discharged smoothly and controlled for discharge rate and timing.

(2) The ink composition (1) which contains solid content of 0.01% by mass to 30.0% by mass.

The ink composition (2), when spread by an ink jetting method, can give a film of desired thickness without losing dischargeability.

(3) The ink composition (1) having a vapor pressure of 0.001 mmHg to 50 mmHg at room temperature.

The ink composition (3) retards drying of the ink component when applying by ink jetting to prevent clogging of the nozzle pore.

A flux material layer composition can sufficiently satisfy the expected functions for forming solder bumps, in particular for the one to be spread by a liquid spraying method (e.g., ink jetting method), when its ink component contains a component as an activator exhibiting effects of removing an oxidized film from the solder alloy material surface, and improving soldering characteristics and surface characteristics (e.g., by imparting gloss to the surface) in the preheating step, and another component exhibiting an effect of removing voids within the bump, preventing scattering of the solder alloy material or uniformly fusing the solder alloy material in the main heating step; or a component exhibiting the above effects in the preheating and main heating steps.

Moreover, a flux material layer composition can sufficiently satisfy the expected functions for forming solder bumps, when it comprises a natural rosin and hydrogenated rosin, solute incorporated at an optional content in a range of from 1% by mass to 99% by mass based on the total amount of natural rosin and hydrogenated rosin, activator which activates at a given temperature, and solvent for dissolving the natural rosin, hydrogenated rosin, solute, and activator.

It is also found that an ink composition can keep the characteristics as an ink jetting ink free of problems associated with discharging stability, when it comprises a rosin, activator, organic solvent, polyol, glycol ether, surfactant and wetting agent.

In other words, the present invention is characterized in that the flux material layer composition for a liquid spraying method (e.g., ink jetting method) comprises at least a rosin, activator containing a component which is decomposed and sublimated at 100° C. to 300° C. and another component which is decomposed and activated at 350° C. to 400° C., and solvent.

The component which is decomposed and sublimated at 100° C. to 300° C. may be an organic acid-based activator leaving behind no residue, and the component which is decomposed and activated at 350° C. to 400° C. may be a halogen compound-based activator leaving behind a residue.

It is preferable, when these components are incorporated, that the flux material layer composition contains an organic acid-based activator at 0.01 to 10% by mass and a halogen compound-based activator at 0.01 to 10% by mass, both based on the solid content of the composition.

The organic acid-based activator will exhibit effects of removing an oxidized film from the solder alloy material surface, and improving soldering characteristics and surface characteristics (e.g., imparting gloss to the surface) at 100° C. to 300° C. in the preheating step.

On the other hand, the halogen compound-based activator will exhibit an effect of removing voids within the bump, preventing scattering of the solder alloy material or uniformly fusing the solder alloy material at 350 to 400° C. in the main heating step.

Each of the organic acid-based activator and halogen compound-based activator may not fully exhibit its effect(s), when present at a content beyond the above range.

More preferably, the organic acid-based activator is incorporated at 0.1% by mass to 5% by mass, and the halogen compound-based activator at 0.1% by mass to 5% by mass, both relative to the solid content in the composition.

Moreover, the organic acid-based activator and halogen compound-based activator are preferably incorporated in the flux material layer composition of the present invention where the ratio M1/M2 is in the range of 1/10 to 10/1, where M1 is organic acid-based activator content and M2 halogen compound-based activator content.

The organic acid-based activator for the flux material layer composition of the present invention is preferably a straight-chain compound having a molecular weight of 40 to 400, or cyclic compound having a molecular weight of 80 to 700.

The halogen compound-based activator for the flux material layer composition of the present invention preferably has a molecular weight of 40 to 700.

More specifically, the organic acid-based activators useful for the flux material layer composition of the present invention include succinic, benzoic, adipic, abietic, glutaric, palmitic, stearic, azelaic and formic acid.

On the other hand, the halogen compound-based activators useful for the flux material layer composition of the present invention include hydrochlorides, e.g., those of ethylamine, methylamine, propenediol, allylamine, 3-amino-1-propene, N-(3-aminopropyl)methacrylamide, o-anisidine, n-butylamine and p-aminophenol; and bromates, e.g., those of ethylamine and methylamine.

One of the flux material layer compositions useful for the present invention has an activator which contains at least a surfactant which is decomposed/sublimated at 100° C. to 300° C. and at least another surfactant which is decomposed/activated at 350° C. to 400° C.

Each of these surfactants works to exhibit effects of removing an oxidized film from the solder alloy material surface, and improving soldering characteristics and surface characteristics (e.g., imparting gloss to the surface) at 100° C. to 300° C. in the preheating step, or an effect of removing voids within the bump, preventing scattering of the solder alloy material or uniformly fusing the solder alloy material at 350° C. to 400° C. in the main heating step.

More specifically, these surfactants useful for the present invention include quaternary ammonium (e.g., Lion Corp.'s ARQUARD C-50® and ETHOQUARD C/12®), lauryltrimethyl ammonium chloride (e.g., Kao Corp.'s QUARTAMIN 24P®), and alkylbenzyldimethyl ammonium chloride (e.g., Kao Corp.'s SANISOL C®).

The solvent for the flux material layer composition preferably has a boiling point of 150° C. to 300° C., more preferably 220° C. to 250° C.

More specifically, the solvents having a boiling point in the above range include 2-(2-n-butoxyethoxy)ethanol, 2-(2-n-butoxyethoxy)ethylacetate, 1-3-butanediol, 1,4-butanediol and N-methyl-2-pyrrolidone.

The rosin for flux material layer composition of the present invention may be natural or hydrogenated, both being decomposed almost completely in the preheating and main heating steps, and remaining as the residue. Moreover, the composition may be further incorporated, as required, with a resin, thermal stabilizer, antioxidant, dispersant and thickener (thixotropic agent), e.g., castor oil.

The aqueous organic solvent for the flux material layer composition preferably contains at least one selected from the group consisting of glycerin, ethylene glycol, diethylene glycol, triethylene glycol, propylene glycol, dipropylene glycol, tripropylene glycol, 1,3-butanediol, 2,3-butanediol, 1,4-butanediol, 1,5-pentanediol, tetraethylene glycol, 1,6-hexanediol, 2-methyl-2,4-pentanediol, polyethylene glycol, 1,2,4-butanetriol, 1,2,6-hexanetriol, thiodiglycol, 2-pyrrolidone, N-methyl-2-pyrrolidone, N-hydroxyethyl-2-pyrrolidone and 1,3-dimethyl-2-imidazolidinone. It can prevent drying of the ink, and adjust ink viscosity to a desired level.

The flux material layer composition preferably contains at least one type of surfactant selected from the group consisting of an acetylene glycol-based surfactant, polyoxyethylene alkyl ether, polyoxyethylene alkyl phenyl ether, polyethylene/polypropylene copolymer and fluorine-based surfactant. The surfactant can improve properties of the ink composition, in particular wettability, and also can adjust its surface tension at a desired level without deteriorating its dischargeability.

The flux material layer composition preferably contains a diol and alkyl ether of 6 or more carbon atoms. These compounds can improve properties of the ink composition, in particular wettability, and also can adjust its surface tension at a desired level without deteriorating its dischargeability.

The flux material layer composition is preferably adjusted so that its pH is from 6 to 11 to keep the nozzle plate in stable contact with the liquid.

(Bump Forming Process)

The process for forming the bumps by a liquid spraying method (e.g., ink jetting method) for the present invention forms a solder alloy material layer and flux material layer one by one on an intermediate metallic layer or electroconductive, adhesive layer on an external electrode pad in a semiconductor device, and then fuses these layers under heating to form the bumps, characterized in that it forms a solder alloy material layer and/or flux material layer and/or electroconductive, adhesive layer by a liquid spraying method (e.g., ink jetting method).

Such a liquid spraying method (e.g., ink jetting method) can perform fine patterning simply in a short time, because it generally sprays an ink composition in such way that the placement and amount of emitted ink composition are accurately controlled, in particular it is possible to dispose accurately very little amount, such as 1 pl, of the ink composition. Moreover, it can spray a required quantity of the ink composition onto required points, wasting no ink material even when it is used for a large substrate.

The ink composition for the liquid spraying method (e.g., ink jetting method) containing a solder alloy material or an electroconductive material is preferably produced by the process which includes at least one step carried out in a supercritical or subcritical fluid. Use of such fluid is particularly effective for forming the desired bumps.

The bump forming process of the present invention having the above characteristics can form small solder bumps impossible for the conventional method to form. More specifically, they are 30 μm or less in diameter, preferably 0.001 μm to 10 μm, more preferably 0.001 μm to 1 μm.

No related art uses an ink composition containing a solder alloy material or electroconductive material, or sprays such a composition by a liquid spraying method (e.g., ink jetting method), needless to say. No related art produces an ink composition containing a solder alloy material or electroconductive material with the aid of a supercritical or subcritical fluid.

For reference, the known techniques which use a supercritical or subcritical fluid include those related to a dye-containing ink for forming images by a liquid spraying method (e.g., ink jetting method) and to electrophotographic conductor provided with a pigment-containing photoconducting layer (disclosed, e.g., by Japanese Patent Application Laid-Open Nos. 2001-172532, 2001-262023, 2002-138229, 2001-92165 and 2002-138216).

1. Method for Dispersing Bump Forming Material by a Step Involving a Supercritical or Subcritical Fluid.

First, methods involving a supercritical or subcritical fluid for dispersing a bump forming material are described.

A variety of compounds may be used as supercritical or subcritical fluid, including solvents based on hydrocarbons, halogenated hydrocarbons, alcohols, ethers, acetals, ketones, esters, fatty acids, aromatics, nitrogen compounds and sulfur compounds; and water, carbon dioxide, nitrogen and ammonia, of which solvents based on ketones, alcohols and aromatics are preferable because of their high solubility for bump forming materials.

The ketone-based solvents include acetone, methylethylketone, isopropylmethylketone, isobutylmethylketone, 2-pentanone, 3-pentanone, cyclohexanone and a mixture thereof.

The alcohol-based solvents include methanol, ethanol, 1-propanol, 2-propanol, 1-butanol, 2-butanol, isobutyl alcohol, tert-butyl alcohol, 1-pentanol, allyl alcohol and a mixture thereof.

The aromatic-based solvents include benzene, toluene, o-xylene, m-xylene, p-xylene, ethylbenzene, isopropylbenzene, 1,3,5-trimethylbenzene, chlorobenzene, o-dichlorobenzene, m-dichlorobenzene, p-dichlorobenzene, phenol, o-cresol, m-cresol, p-cresol, benzyl alcohol, anisole, acetophenone, nitrobenzene, benzonitrile, aniline, methyl benzoate and a mixture thereof.

Of these, the preferable ones are acetone, methylethylketone, methanol, ethanol, 1-propanol, 2-propanol, benzene and toluene. These solvents may be used either individually or in combination.

In particular, many aromatic-based solvents are thermally and chemically stable, and preferable as supercritical or subcritical fluids, because they are resistant to thermal decomposition and unreactive with a solder material or electroconductive material.

The "supercritical fluid" generally means a fluid at least at its critical temperature and critical pressure. Taking acetone as an example, it becomes supercritical at its critical temperature of 235° C. or higher and critical pressure of 4.7 MPa or higher.

Similarly, the following compounds become supercritical at the critical temperature and critical pressure described in the parentheses: methylethylketone (262° C., 4.2 MPa), isopropylmethylketone (280° C., 3.8 MPa), isobutylmethylketone (298° C., 3.3 MPa), 2-pentanone (288° C., 3.7 MPa), 3-pentanone (288° C., 3.7 MPa), cyclohexanone (356° C., 3.8 MPa), methanol (239° C., 8.1 MPa), ethanol (243° C., 6.4 MPa), 1-propanol (264° C., 5.2 MPa), 2-propanol (235° C., 4.8 MPa), 1-butanol (290° C., 4.4 MPa), 2-butanol (263° C., 4.2 MPa), isobutyl alcohol (274° C., 4.3 MPa), tert-butyl alcohol (233° C., 4.0 MPa), 1-pentanol (315° C., 3.9 MPa), allyl alcohol (272° C., 5.7 MPa), benzene (289° C., 4.9 MPa), toluene (319° C., 4.1 MPa), o-xylene (357° C., 3.7 MPa), m-xylene (344° C., 3.5 MPa), p-xylene (343° C., 3.5 MPa), ethylbenzene (344° C., 3.6 MPa), isopropylbenzene (358° C., 3.2 MPa), 1,3,5-trimethylbenzene (364° C., 3.1 MPa), chlorobenzene (359° C., 4.5 MPa), o-dichlorobenzene (424° C., 4.1 MPa), m-dichlorobenzene (411° C., 3.9 MPa), phenol (421° C., 6.1 MPa), o-cresol (422° C., 5.0 MPa), m-cresol (426° C., 4.8 MPa), p-cresol (426° C., 4.7 MPa), anisole (368° C., 4.2 MPa), nitrobenzene (356° C., 4.5 MPa), benzonitrile (426° C., 4.2 MPa), aniline (426° C., 5.3 MPa), methyl benzoate (438° C., 4.0 MPa).

The "subcritical fluid" generally means a fluid at a temperature below its critical temperature.

When a supercritical or subcritical fluid is handled, it may be mixed with an adequate solvent (entrainer) to help efficiently dissolve a bump forming material in the supercritical or subcritical fluid.

The entrainers useful for the present invention include hydrocarbon-based solvents, e.g., hexane, cyclohexane, benzene and toluene; halogenated hydrocarbon-based solvents, e.g., methyl chloride, dichloromethane, dichloroethane and chlorobenzene; alcohol-based solvents, e.g., methanol, ethanol, propanol and butanol; ether-based solvents, e.g., diethyl ether and tetrahydrofuran; acetal-based solvents, e.g., acetoaldehyde diethyl acetal; ketone-based solvents, e.g., acetone and methylethylketone; ester-based solvents, e.g., ethyl acetate and butyl acetate; carboxylic acid-based solvents, e.g., formic acid, acetic acid and trifluoroacetic acid; nitrogen compound-based solvents, e.g., acetonitrile, pyridine and N,N-dimethylformamide; sulfur-compound-based solvents, e.g., carbon disulfide and dimethyl sulfoxide; and water, nitric acid and sulfuric acid.

Temperature at which a supercritical or subcritical fluid is used is basically not limited, so long as it is at least the level at which a bump forming material is soluble therein. However, it is preferably 10° C. to 600° C., more preferably 20° C. to 400° C., because the bump forming material may be soluble in the fluid to an insufficient extent at an excessively low level, whereas it may be decomposed at an excessively high level.

Pressure level at which a supercritical or subcritical fluid is used is basically not limited, so long as it is its critical pressure or higher. However, it is preferably 1 MPa to 100 MPa, because the bump forming material may be soluble in the fluid to an insufficient extent at an excessively low level, whereas some problems, e.g., those associated with durability of the production facility exposed the fluid or operational safety, may occur at an excessively high level.

The system for handling a supercritical fluid is not limited, so long as it can bring the bump forming material into contact with a supercritical or subcritical fluid to be dissolved therein. It may be a batch system in which a supercritical or subcritical fluid is handled in a closed system, or a flow system in which the fluid is recycled.

The system for releasing the bump forming material dissolved in the supercritical or subcritical fluid is not limited, so long as it can separate the crystal out of the solution. For example, it may depend on decreased solubility of the supercritical or subcritical fluid in which the bump forming material is dissolved to separate the crystal; e.g., (I) the supercritical or subcritical fluid in which the bump forming material is dissolved is mixed with another adequate solvent to separate the crystal, (II) the supercritical or subcritical fluid in which the bump forming material is dissolved is cooled slowly or rapidly while keeping pressure unchanged to separate the crystal, (III) the supercritical or subcritical fluid in which the bump forming material is dissolved is depressured slowly or rapidly while keeping temperature unchanged to separate the crystal, (IV) the supercritical or subcritical fluid in which the bump forming material is dissolved is changed both in temperature and pressure to separate the crystal, or (V) the supercritical or subcritical fluid in which the bump forming material is dissolved is mixed with another adequate solvent, and changed in temperature and/or pressure to separate the crystal.

Of these systems, the one in which temperature is changed to separate the crystal is more preferable, because of its simple operational procedure and controllability of crystal releasing conditions.

The temperature level is set after taking into consideration properties of the bump forming material, e.g., thermal stability. It is preferable to decrease temperature slowly or rapidly to separate the crystal, and more preferable to decrease temperature slowly or rapidly while keeping pressure unchanged.

The system which sometimes mixes the solution with a solvent is preferable in that it can easily control crystal type and particle size, because they differ by the solvent species used.

The solvents useful for the present invention include water and a variety of known organic solvents. Mixing temperature and pressure of the liquid solvent may be optionally set for specific production conditions for the bump forming material. It may be mixed as a supercritical or subcritical fluid.

The liquid solvent may be gaseous at normal temperature and pressure, e.g., carbon dioxide, which is used after being liquefied, or may include an inorganic salt to form a solution. Preferable quantity of the solvent to be incorporated in the supercritical or subcritical fluid is 0.1 to 100 times of the fluid.

At below 0.1 times, the solvent can little exhibit the effects of transforming the crystal of the bump forming material and its particle size.

At above 100 times, on the other hand, recovery of a large quantity of the solvent takes much time to decrease production efficiency.

FIG. 16 shows one structural example of flow system for producing the bump forming material with the aid of a supercritical or subcritical fluid.

Referring to FIG. 16, when it involves mixing of a solvent to separate the crystal of the bump forming material, a solvent to be made supercritical or subcritical is withdrawn from the tank 101, which holds the solvent, by a pump 102 and then made to be supercritical or subcritical at a target temperature and pressure. The resulting supercritical or subcritical fluid is sent to the vessel 103, to dissolve the bump forming material held beforehand therein, and the resulting solution is mixed with a solvent at the point 105 just after passing through the filter 104, to separate the crystal out of the solution.

The resulting bump forming material crystal passes through the back-pressure valve 106 and collected at the point 107. In this figure, 108, 109 and 110 are a pressure gauge, preheating section and heat-retaining section, respectively. When crystallization of the bump forming material is effected by temperature difference, the system is provided with a temperature-controlling section in the line between the filter 104 and back-pressure valve 106, where the supercritical or subcritical fluid dissolving the bump forming material is changed in temperature to separate the crystal.

2. Bump Forming Ink Composition

In the present invention, an activator may be used to improve wettability of the ink composition with the external electrode pad surrounded by the passivation film.

The preferable surfactants include polyoxyethylene alkyl ether acetate, dialkylsulfosuccinate, polyoxyethylene alkyl ether, polyoxyethylene alkylphenyl ether, polyoxyethylene/polyoxypropylene block copolymer and acetylene glycol-based surfactant.

More specifically, the anionic surfactants include polyoxyethylene alkyl ether acetate (II), and/or dialkylsulfosuccinate (III) having a branched alkyl chain of 5 to 7 carbon atoms.

(II)

wherein, R is an alkyl group of 6 to 14 carbon atoms, which may be branched; "m" is 3 to 12; M is an alkaline metallic ion, quaternary ammonium or phosphonium, or alkanolamine.

(III)

wherein, $R^5$ and $R^6$ are each a branched alkyl group of 5 to 7 carbon atoms; M is an alkaline metallic ion, quaternary ammonium or phosphonium, or alkanolamine.

The counter ions which can help the surfactant for the present invention exhibit excellent stability of solubility include lithium ion, and quaternary ammonium and phosphonium ion each represented by one of the general formulae described below.

The nonionic surfactants useful for the present invention include a polyoxyethylene alkylphenyl ether represented by the general formula (IV) and acetylene glycol-based surfactant represented by the general formula (V). It can produce a synergistic effect for improving penetrability, when used in combination with the above.

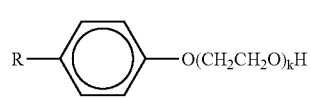
(IV)

wherein, R is a carbon chain of 6 to 14 carbon atoms, which may be branched; and "k" is 5 to 12.

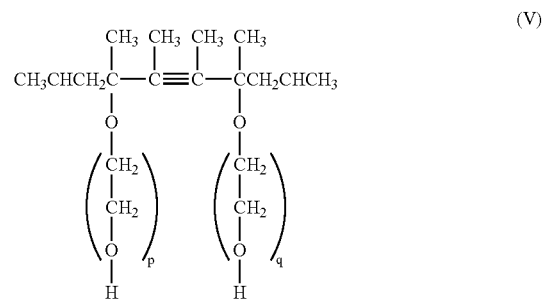
(V)

wherein, "p" and "q" are each 0 to 40.

The ink composition can have storage-stability, when kept at pH 6 or more. The activator represented by the general formula (III), when used, is preferably kept at pH 6 to 9, because it may be decomposed to have changed properties while being stored at above pH 9.

The activator (II), (III), (IV) or (V) useful for the present invention can impart desired penetrability to the ink characteristics required by the printer system, when incorporated at 0.05% by mass to 10% by mass. At below 0.05% by mass, it can exhibit the penetrability-improving effect only to a limited extent. At above 10% by mass, on the other hand, the compound itself may separate out at low temperature to deteriorate its reliability.

The surfactants (II) and (III) useful for the present invention are described more specifically by the free acid form.

(II-1)

(II-2)

(II-3)

(II-4)

(II-5)

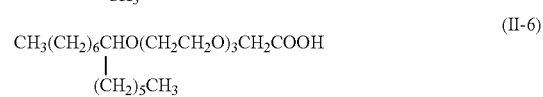
(II-6)

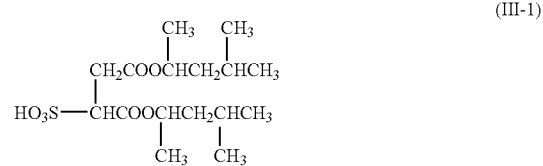
(III-1)

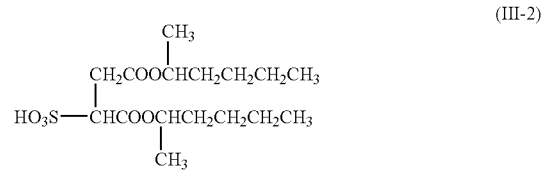
(III-2)

-continued

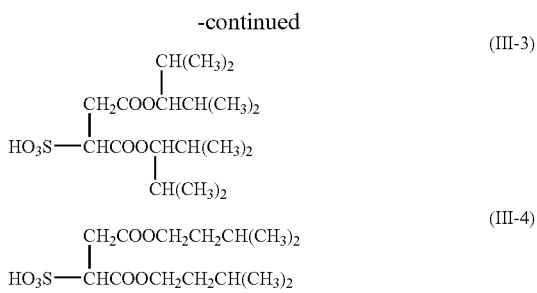

The ink composition of the present invention contains an organic solvent as a liquid medium. However, it may contain an aqueous, organic solvent for various purposes, e.g., preventing ink drying or improving dissolution stability of the compound of the present invention.

The aqueous, organic solvents useful for the present invention include polyhydric alcohols, e.g., ethylene glycol, diethylene glycol, triethylene glycol, polyethylene glycol, polypropylene glycol, 1,3-propanediol, 1,3-butanediol, 1,4-butanediol, 2,3-butanediol, 1,5-pentanediol, 1,6-hexanediol, glycerol, 1,2,6-hexanetriol, 1,2,4-butanetriol, 1,2,3-butanetriol and pentanetriol; polyhydric alcohol/alkyl ethers, e.g., ethylene glycol monoethyl ether, ethylene glycol monobutyl ether, diethylene glycol monomethyl ether, diethylene glycol monoethyl ether, diethylene glycol monobutyl ether, tetraethylene glycol monomethyl ether and propylene glycol monoethyl ether; polyhydric alcohol/aryl ethers, e.g., ethylene glycol monophenyl ether and ethylene glycol monobenzyl ether; nitrogen-containing heterocyclic compounds, e.g., N-methyl-2-pyrrolidone, N-hydroxyethyl-2-pyrrolidone, 2-pyrrolidone, 1,3-dimethylimidazolidinone and ε-caprolactam; amides, e.g., formamide, N-methylformamide, N,N-dimethylformamide; amines, e.g., monoethanolamine, diethanolamine, triethanolamine, monoethylamine, diethylamine and triethylamine; sulfur-containing compounds, e.g., dimethylsulfoxide, sulfolane and thiodiethanol; and propylene carbonate, ethylene carbonate and γ-butyrolactone. These solvents may be used either individually or in combination.

Of these, the particularly preferable ones are diethylene glycol, thiodiethanol, polyethylene glycol, triethylene glycol, glycerol, 1,2,6-hexanetriol, 1,2,4-butanetriol, pentanetriol, 1,3-butanediol, 2,3-butanediol, 1,4-butanediol, 1,5-pentanediol, N-methyl-2-pyrrolidone, N-hydroxyethyl-2-pyrrolidone, 2-pyrrolidone and 1,3-dimethylimidazolidinone. The above solvent can provide the compound of the present invention with excellent effects of enhancing solubility and preventing deteriorated spraying characteristics. In particular, pyrrolidone derivatives, e.g., N-hydroxyethyl-2-pyrrolidone, are cited as the preferable solvents for securing stability of dispersed rosin for the present invention.

The ink composition of the present invention may be incorporated with a penetrant, other than the surfactant represented by one of the general formulae (II) to (V), to adjust surface tension. The penetrants useful for the present invention include alkyl and aryl ethers of polyhydric alcohol, e.g., diethylene glycol monophenyl ether, ethylene glycol monophenyl ether, ethylene glycol monoallyl ether, diethylene glycol monobutyl ether, propylene glycol monobutyl ether, triethylene glycol monobutyl ether and tetraethylene glycol chlorophenyl ether; diols, e.g., 2-ethyl-1,3-hexanediol, 2,2,4-trimethyl-1,3-pentanediol and 2,2-dimethyl-1,3-propanediol; polyoxyethylene/polyoxypropylene block copolymer; fluorine-based surfactant; and lower alcohols, e.g., ethanol and 2-propanol. Of these particularly preferable ones are diethylene glycol monobutyl ether as a polyhydric alcohol alkyl ether, and 2-ethyl-1,3-hexanediol and 2,2,4-trimethyl-1,3-pentanediol as diols of 6 or more carbon atoms. A diol is preferable in that it prevents agglomeration of a water-insoluble colorant.

The penetrant is incorporated preferably at 0.1% by mass to 20% by mass, more preferably 0.5% by mass to 10% by mass, although the desirable content varies depending on its type and intended purposes. It may exhibit insufficient penetration at below the lower limit, and may deteriorate characteristics of the ink composition of being divided into droplets at above the upper limit.

When incorporated, the penetrant improves properties of the ink composition, e.g., wettability with the ink jetting head parts and recording devices, and filling-related properties to prevent recording failure by bubbles.

The ink composition of the present invention may be further incorporated with one or more known additives, in addition to the above penetrant and solvents.

An antiseptic/fungicidal agent is a useful additive for the present invention. The antiseptic/fungicidal agents useful for the present invention include sodium dehydroacetate, sodium sorbate, sodium 2-pyridinethiol-1-oxide, sodium benzoate, sodium pentachlorophenol and isothiazoline.

A pH adjustor is another useful additive for the present invention. The pH adjustor useful for the present invention is not limited, so long as it can adjust the ink composition at pH 7 or more without causing any adverse effect on the ink component.

Examples include amines, e.g., diethanolamine and triethanolamine; hydroxides of alkali metal, e.g., lithium hydroxide and sodium hydroxide; ammonium hydroxide, quaternary ammonium hydroxide and quaternary phosphonium hydroxide; and carbonates of alkali metal, e.g., lithium carbonate, sodium carbonate and potassium carbonate.

A chelating agent is still another useful additive for the present invention. The chelating agents useful for the present invention include sodium ethylenediaminetetraacetate, sodium nitrotriacetate, sodium hydroxyethylethylenediaminetriacetate, sodium diethylenetriaminepentaacetate and sodium uramildiacetate.

A rust preventive is still another useful additive for the present invention. The rust preventives useful for the present invention include an acidic sulfite, sodium thiosulfate, ammonium thiodiglycolate, diisopropyl ammonium nitrite, pentaerythritol tetranitrate and dichlorohexyl ammonium nitrite.

Still more, the ink composition of the present invention may be incorporated with a water-soluble ultraviolet or infrared absorber, depending on its purposes.

3. Flux Material Layer Composition

The flux material layer composition to be discharged and spread by a liquid spraying method (e.g., ink jetting method) contains an activator which is decomposed and sublimated at 100° C. to 300° C. and another activator which is decomposed and activated at 350° C. to 400° C.

The component as an activator which is decomposed and sublimated at 100° C. to 300° C. to exhibit effects of removing an oxidized film from the solder alloy material surface, and improving soldering characteristics and surface characteristics (e.g., by imparting gloss to the surface) may be an organic acid-based activator leaving behind no residue, and the component as an another activator decomposed and activated at 350° C. to 400° C. to exhibit an effect of removing voids within the bump, preventing scattering of the solder alloy material or uniformly fusing the solder alloy material may be a halogen compound-based activator leaving behind a residue. The flux material layer composition which contains the organic acid-based activator at 0.01% by mass to 10% by mass and halogen compound-based activator at 0.01% by mass to 10% by mass, both relative to the solid components in the composition can exhibit the favorable effects in the solder bump forming step, because the organic acid-based activator will exhibit the effects for bump surface characteristics and shape in the preheating step at 100° C. to 300° C., and the halogen compound-based activator will exhibit the effect for forming the bumps in the main heating step at 350° C. to 400° C.

Moreover, the flux material layer composition of the present invention contains at least a surfactant as an activator decomposed/sublimated at 100° C. to 300° C. and another surfactant decomposed/activated at 350° C. to 400° C., the former exhibiting effects of removing an oxide film from the solder alloy material surface, improving soldering characteristics and improving surface characteristics (e.g., by imparting surface gloss) and the latter exhibiting an effect of removing voids present in the bump, preventing scattering of the solder alloy material or uniformly fusing the solder alloy material, and can exhibit the favorable effects over the preheating period at 100° C. to 300° C. and main heating step at 350° C. to 400° C., because these surfactants exhibit the effects for bump surface characteristics and shape or the effect for bump forming.

The solvent for the flux material layer composition can be prevented from being evaporated in the preheating step, when it has a boiling point of 150° C. to 300° C.

The flux material layer composition can have improved resistance to high temperature, such as that used for the wet back treatment, when it comprises a natural rosin, a hydrogenated rosin, a solute which is incorporated in an amount of 1% by mass to 99% by mass relative to a total amount of the natural rosin and hydrogenated rosin, and the activators which is activated at given temperature, dissolved in the solvent.

The flux is composed of rosin, activators, solvent and additives as the basic components, and a polyol, glycol ether, surfactant and wetting agent at a given proportion for improving ink jetting characteristics.

(i) Rosin

The rosin for the present invention is characterized in that it comprises at least one of natural rosin, hydrogenated rosin and resin. The natural rosin is a mixture of water white rosin (hereinafter referred to as WW rosin) having a melting point of around 80° C. to 90° C. and a WW rosin having a melting point of around 150° C., or pine rosin. Hydrogenated resin is a natural resin treated with hydrogen.

The resin is a synthetic (polymerized) resin, natural rubber, synthetic rubber or elastomer, or combination thereof. The resin is incorporated in the rosin at 1% by mass to 99% by mass based on the totaled natural and hydrogenated rosin. The resin enhances heat resistance of the flux, making it resistant to high temperature in the main heating step.

The synthetic (polymerized) resin may be an epoxy, acrylic, polyimide, polyimide (nylon), polyester, polyacrylonitrile, vinyl chloride, vinyl acetate, polyolefin, fluorine-based or ABS resin. They may be used either individually or in combination.

The synthetic rubber is isoprene rubber, styrene/butadiene rubber (SBR), butadiene rubber (BR), chloroprene rubber, nylon rubber, or the like. They may be used either individually or in combination.

The elastomer is nylon-based or polyester-based elastomer. They may be used either individually or in combination.

(ii) Activator (Related to the Bump Forming Characteristics)

Three types of activators are used, an organic acid-based compound activated in the preheating step in the wet back treatment, halogen compound activated in the main heating step, and surfactant. Each activator is incorporated in the flux at around 0.01% by mass to 10% by mass relative to the solids in the composition, preferably around 0.1% by mass to 5% by mass, where the ratio of the organic acid-based compound to halogen compound is optionally changed from 1/10 to 10/1. As a result, the flux can have the activated activators over a wide temperature range covering the preheating and main heating step. The organic acid-based compound and halogen compound may be replaced by a single activator which can be kept activated over a temperature range covering these steps.

The practical organic acid-based compounds includes succinic, benzoic, adipic, abietic, glutaric, palmitic, stearic, azelaic and formic acid. The halogen compounds include hydrochlorides, e.g., those of ethylamine, methylamine, propenediol, allylamine, 3-amino-1-propene, N-(3-aminopropyl)methacrylamide, o-anisidine, n-bytylamine and p-aminophenol. The activators which can be kept activated over a temperature range of preheating step and main heating step include quaternary ammonium, lauryltrimethyl ammonium chloride and alkylbenzyldimethyl ammonium chloride.

(iii) Solvent (Related to Flux Characteristics)

The solvent, in which each activator and rosin are to be dissolved, preferably has a boiling point of 150° C. to 300° C., more preferably 220° C. to 250° C. The practical solvents include 2-(2-n-butoxyethoxy)ethanol, 2-(2-n-butoxyethoxy) ethylacetate, 1-3-butanediol, 1,4-butanediol and N-methyl-2-pyrrolidone.

4. Discharging/Spreading Procedure for Liquid Spraying Method (e.g., Ink Jetting Method)

The bump forming method of the present invention by a liquid spraying method (e.g., ink jetting method) comprises 2 steps, the first step spreading the flux-containing ink forming composition on the intermediate metallic layer formed on the pad on an object on which the bumps are to be formed, and also on the solder alloy material layer formed on the intermediate metallic layer by a liquid spraying method (e.g., ink jetting method), and the second step heating/fusing the ink composition to form the bumps.

It can comprise more steps, the first step spreading the ink forming composition containing an electroconductive material on the pad on the object on which the bumps are to be formed by a liquid spraying method (e.g., ink jetting method) to form the electroconductive, adhesive layer, the second step spreading the ink composition containing a solder material on the electroconductive, adhesive layer or intermediate metallic layer by a liquid spraying method (e.g., ink jetting method) to form the solder layer, the third step spreading the flux-containing ink forming composition on the solder layer by a liquid spraying method (e.g., ink jetting method), and the fourth step heating/fusing the ink compositions to form the bumps, needless to say.

Such a liquid spraying method (e.g., ink jetting method) can perform fine patterning simply in a short time, and spray a required quantity of the ink composition onto required points, wasting no ink material even when it is used for a large substrate.

Figure 2:
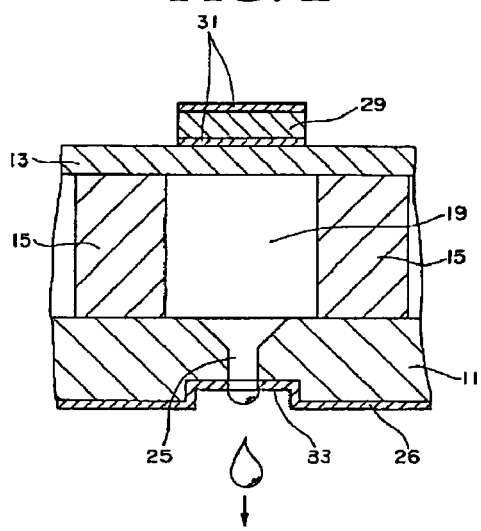
FIG. 2 is a cross-sectional view illustrating one structural example of a nozzle portion of an ink jet printer head used for the bump forming process of the present invention.

FIGS. 1 and 2 illustrate one structural embodiment of an ink jetting printer head which can be used for the bump forming method of the present invention.

The ink jetting printer head 10 is provided with the nozzle plate 11 and vibrating plate 13 of, e.g., stainless steel, which are joining with each other via the partition plate (reservoir plate) 15. A plurality of ink chambers 19 and liquid reservoirs 21 are formed by the partition plates 15 between the nozzle plate 11 and vibrating plate 13.

The ink chamber 19 and liquid reservoir 21, which are filled with the ink composition of the present invention, are in communication with each other via the supply port 23. The nozzle plate 11 is provided with the nozzle pore 25 through which the ink composition is sprayed in a jet from the ink chambers 19.

The ink jetting printer head 10 is provided with the ink inlet pore 27 through which the ink composition is supplied to the liquid reservoirs 21. The piezoelectric elements 29 are bonded to both sides of the vibrating plate 13, one facing the ink chamber 19 and the other opposite thereto, in such a way to correspond to the space 19.

The piezoelectric elements 29 are positioned between a pair of electrodes 31, to curve towards the outside, when switched on, to expand volume of the ink chambers 19.

As a result, the ink composition flows into the ink chamber 19 via the supply port 23 from the liquid reservoir 21 in a quantity corresponding to the expanded volume.

The piezoelectric elements 29, when switched off, return back to the original state. As a result, the space 19 returns back to the original volume, increasing pressure of the ink composition in the ink chamber 19 to jet it towards the substrate via the nozzle pore 25.

The water-repelling layer 26 plated, e.g., with a Ni-tetrafluoroethylene eutectoid is provided around the nozzle pore 25 to prevent curved travel of the ink composition and pore clogging, as shown in FIG. 2.

5. Ink Composition Properties

The bump forming method of the present invention discharges, from the ink jetting printer head, an ink composition, which is one of the solder material forming composition, electroconductive, adhesive forming composition, and flux material forming composition containing an electroconductive material, solder alloy material and flux material, respectively. The ink composition has the following properties.

The ink composition preferably has a viscosity of 1 mPa·s to 20 mPa·s, more preferably 5 mPa·s to 20 mPa·s, most preferably 2 mPa·s to 8 mPa·s. At below 1 mPa·s, the ink composition may be difficult to control its discharge rate and, at the same time, to form a sufficient film because of excessively low solid concentration. At above 20 mPa·s, on the other hand, the ink composition may be difficult to smoothly discharge from the nozzle pore, requiring apparatus specification changes, e.g., for expanded nozzle pore. Moreover, solids tend to separate out in the ink composition to increase nozzle pore clogging frequency.

The ink composition preferably has a surface tension of 20 mN/m to 70 mN/m, more preferably 25 mN/m to 50 mN/m. The composition having a surface tension in the above range can be prevented from being curved while it is discharged.

At below 20 mN/m, the ink composition may be excessively wettable with the nozzle surface and deposited asymmetrically on the nozzle pore periphery, while it is discharged. In such a case, there is an attractive force produced between the composition deposited on the ink pore and deposition to be discharged. This causes the ink composition to be discharged by an uneven force and, in turn, the so-called curved travel, a phenomenon which makes it difficult for the composition to reach the target position, or increases frequency of this phenomenon, needless to say.

At above 70 mN/m, on the other hand, the ink composition may be difficult to control its discharge rate and timing, because of unstable meniscus shape on the nozzle edge.

The ink composition preferably has a contact angle of 30° to 170° with a material which constitutes the liquid spraying nozzle surface, and more preferably 30° to 70°. The ink composition having a contact angle in the above range can give accurate patterns, because of controlled curved travel.

At a contact angle below 30°, the ink composition may be excessively wettable with the nozzle surface to cause the curved travel, as is the case with excessively low surface tension. At above 170°, the interaction between the ink composition and nozzle pore may be minimized, making it difficult to control discharge rate and timing for the composition, because of unstable meniscus shape on the nozzle edge.

The curved travel is defined as a deviation of 50 μm or more from the target dot position to which the ink composition is directed, when discharged from the nozzle. This phenomenon is mainly caused by uneven wettability of the ink composition with the nozzle pore and deposition of its solid component to clog the pore.

The ink composition preferably contains solids at 0.01% by mass to 30% by mass based on the whole composition, more preferably 0.1% by mass to 20.0% by mass, most preferably 0.1% by mass to 10.0% by mass. At a content below the lower limit, the ink composition should be discharged excessively often to secure required film thickness, decreasing mass production efficiency. At above the upper limit, on the other hand, the ink composition may have deteriorated dischargeability, because of excessively high viscosity.

A vapor pressure of the ink composition at room temperature is preferably from 0.001 mmHg to 50 mmHg, and more preferably from 0.01 mmHg to 20 mmHg. Use of an involatile solvent can prevent problems, e.g., drying on the nozzle pore, thickening and agglomeration of the ink composition, and deposition of the solids. However, a solvent having a vapor pressure below 0.001 mmHg is unsuitable, because it is difficult to remove in the film-making step.

The solvents useful for the present invention include aprotonic, cyclic, polar solvents, e.g., 2-ethyl-1,3-hexanediol, 2,2,4-trimethyl-1,3-pentanediol, 2-pyrrolidone, N-hydroxyethyl-2-pyrrolidone, γ-butyrolactone, N-methyl-2-pyrrolidone (NMP), and 1,3-dimethyl-2-imidazolidinone (DMI) and its derivatives; and glycol ether-based acetic acids, e.g., carbitol acetate (CA) and butylcarbitol acetate (BCA). Solvents, e.g., CA and BCA are also effective for improving film-making characteristics of the ink composition.

On the other hand, lower alcohols, e.g., methanol (MeOH), ethanol (EtOH) and propyl alcohol, although effective for adjusting surface tension and viscosity of the ink composition, are incorporated preferably at 20% by mass or less, because of their high volatility.

(Solder Ball Transferring Sheet, and Bump Forming Method Using the Sheet)

The solder ball transferring sheet and bump forming method using the sheet, both of the present invention, are not limited to the types described below, and can be freely altered in type of the substrate, material and thickness of the heat-resistant layer (solder ball forming layer), shape of the opening and type of the semiconductor wafer, within limits of the spirit of the present invention.

The bump forming method of the present invention forms an electroconductive, adhesive layer by ink jetting method, characterized in that it is based on the solder ball transferring method involving at least one step which uses a supercritical or subcritical fluid for production of the ink composition (electroconductive, adhesive composition) constituting the electroconductive material. Such an ink jetting method can perform fine patterning simply in a short time, and spray a required quantity of the ink composition onto required points, wasting no ink material even when it is used for a large substrate.

The electroconductive, adhesive composition may be the same as the one described earlier.

The term "solder ball" is known in the industry related to assembling high-density packages. The ball grid array (BGA) as one of the large scale integrater (LSI) packages is a surface mounting type LSI comprising a small printed-wiring board with solder spheres on both sides, and described in detail in Nikkei Electronics (Nikkei BP, No. 601, Feb. 14, 1994, pp. 59–73). The solder sphere is referred to as solder ball.

The solder balls are supplied by solder material makers.

Figure 17:
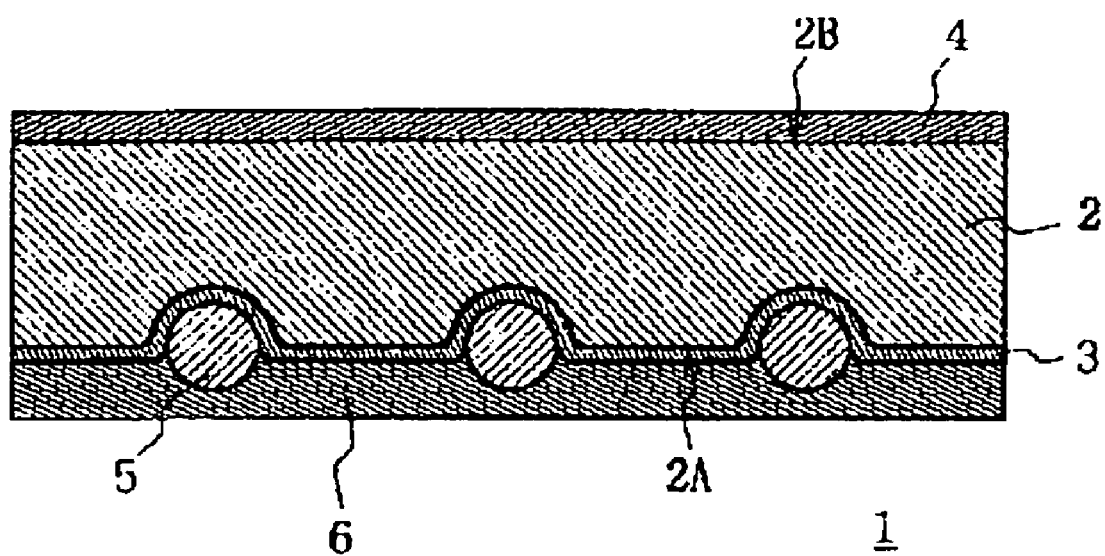
FIG. 17 illustrates a bump transferring sheet structure used for a bump forming method in EXAMPLE.

FIG. 17 is a cross-sectional view of one embodiment of solder ball transferring sheet (or bump transferring sheet).

Referring to FIG. 17, the solder ball transferring sheet 1 comprises a base 2 of polyethylene terephthalate (hereinafter referred to as "PET film") laminated with the releasing layer 3 on one side 2A and acrylic resin layer 4 resistant to heat on the other side 2B. A plurality of the solder balls (solder spheres) 5 are formed on the releasing layer 3 in such a way that they are embedded in the base 2 via the releasing layer 3.

Each of these solder balls 5 is positioned at a point corresponding to each pad in each of the ICs formed on the wafer (not shown), and held by the releasing layer 3, because it is embedded in the base 2 via the releasing layer 3. The releasing layer 3 is laminated with the electroconductive, adhesive layer 6 of electroconductive, adhesive agent by an ink jetting method to cover each solder ball 5. As described above, the bump forming method of the present invention forms the bumps on the corresponding pads by transferring the solder balls 5 formed on the solder ball transferring sheet 1 in such a way to position each ball at the point corresponding to each pad on one side of the wafer.

The resins useful for producing the releasing layer 3 include acryl, polyester, styrol, polyacrylonitrile, vinyl chloride, vinyl acetate, polyolefin, fluorine-based, ABS, epoxy, polyimide and polyamide (nylon) resin, and vinyl chloride/vinyl acetate copolymer. They may be used either individually or in combination. The releasing layer 3 is further incorporated with a releasing agent, e.g., of silicone or fluorine-based resin, in addition to the above resin(s), to easily separate the solder balls, as required.

The electroconductive, adhesive layer 6 formed by an ink jetting method is composed of the ink composition in the form of adhesive paste, containing an electroconductive, adhesive agent of silver, electroconductive carbon or electroconductive resin.

Four types of solder ball transferring sheets (hereinafter referred to as the first, second, third and fourth solder ball transferring sheet) were prepared in EXAMPLES, and used for forming a bump on each pad on one side of the wafer. The bumps for comparison were also formed by the conventional method (these bumps are hereinafter referred to as comparative bumps) on each pad on one side of the wafer, to be compared with the four types of sheets.

The components and their materials of the first to fourth solder ball transferring sheets prepared in EXAMPLES are described in Tables 2 to 5.

As shown in Table 2, the first solder ball transferring sheet comprised the base 2 of PET film (supplied by, e.g., Toray Industries) having a thickness of around 100 μm, laminated with the releasing layer 3 composed of an acryl resin (supplied by, e.g., Denki Kagaku Kogyo K.K.) and silicone resin (supplied by, e.g., Shin-Etsu Chemical Co., Ltd.) accounting for 70% and 30%, respectively based on the whole releasing layer 3. The solder balls had a diameter of around 60 μm (supplied by, e.g., Tarutin Kester Co., Ltd.), and the electroconductive, adhesive layer 6 was of the electroconductive, adhesive layer forming ink composition prepared in Experiment 1.

TABLE 2

| Base | 100 μm thick PET film |
|---|---|
| Releasing layer, 100% by mass | Acryl resin, 70% by mass<br>Silicone resin, 30% by mass |
| Bumps | 60 μm-diameter solder balls (supplied by Tarutin Kester Co., Ltd. |
| Electroconductive, adhesive layer | Electroconductive, adhesive layer forming ink composition prepared in Experiment 1 |

The second solder ball transferring sheet, described in Table 3, comprised the base 2 of PET film (supplied by, e.g., Unitica, Ltd.) having a thickness of around 120 μm, laminated with the releasing layer 3 composed of polyester resin (supplied by, e.g., Toray Industries) and fluorine-based resin (supplied by, e.g., Daikin Industries, Ltd.) accounting for 60% and 40%, respectively based on the whole releasing layer 3. The solder balls had a diameter of around 20 μm (supplied by, e.g., Senju Metal Industry Co., Ltd.), and the electroconductive, adhesive layer 6 was of the electroconductive, adhesive layer forming ink composition prepared in Experiment 2.

TABLE 3

| Base | 120 μm thick PET film |
|---|---|
| Releasing layer, 100% by mass | Polyester resin, 60% by mass<br>Fluorine-based resin, 40% by mass |
| Bumps | 20 μm-diameter solder balls (supplied by Senju Metal Industry Co., Ltd.) |
| Electroconductive, adhesive layer | Electroconductive, adhesive layer forming ink composition prepared in Experiment 2 |

The third solder ball transferring sheet, described in Table 4, comprised the base 2 of PET film (supplied by, e.g., Toyobo Inc.) having a thickness of around 150 μm, laminated with the releasing layer 3 composed of a vinyl chloride resin (supplied by, e.g., Tosoh Corp.) and surfactant (supplied by, e.g., Lion Corp.) accounting for 90% and 10%, respectively based on the whole releasing layer 3. The solder balls had a diameter of around 10 µm (supplied by, e.g., Alpha Metals of Japan Ltd.), and the electroconductive, adhesive layer 6 was of the electroconductive, adhesive layer forming ink composition prepared in Experiment 3.

TABLE 4

| Base | 150 µm thick PET film |
| --- | --- |
| Releasing layer, 100% by mass | Vinyl chloride resin, 90% by maaa Surfactant, 10% by mass |
| Bumps | 10 µm-diameter solder balls (supplied by Alpha Metals of Japan Ltd. |
| Electroconductive, adhesive layer | Electroconductive, adhesive layer forming ink composition prepared in Experiment 3 |

The fourth solder ball transferring sheet, described in Table 5, comprised the base 2 of PET film (supplied by, e.g., Mitsubishi Plastics, Inc.) having a thickness of around 110 µm, laminated with the releasing layer 3 composed of a styrol resin (supplied by, e.g., Tokuyama corp.) and silicone oil (supplied by, e.g., Dow Corning Toray Silicone Co., Ltd.) accounting for 97% and 3%, respectively based on the whole releasing layer (3). The solder balls had a diameter of around 1 µm (supplied by, e.g., Nihon Handa Co., Ltd.), and the electroconductive, adhesive layer 6 was of the electroconductive, adhesive layer forming ink composition prepared in Experiment 4.

TABLE 5

| Base | 110 µm thick PET film |
| --- | --- |
| Releasing layer, 100% by mass | Styrol resin, 97% by mass Silicone oil, 30% by mass |
| Bumps | 1 µm-diameter solder balls (supplied by Nihon Handa Co., Ltd.) |
| Electroconductive, adhesive layer | Electroconductive, adhesive layer forming ink composition prepared in Experiment 4 |

The bump forming method of this embodiment can form the first to fourth solder ball transferring sheets by the procedure illustrated in FIGS. 18 and 19, and the bump on each pad 11 on the side 10A of the wafer 10 using one of these sheets. More specifically, referring to FIG. 18A, the base 2 is laminated with an acryl resin by a gravure printer on the other side 2B to around 10 g/m², to form the acryl resin layer 4. Then, referring to FIG. 18B, the base 2 is laminated with the releasing layer 3 by a gravure printer on the other side 2A to around 10 g/m².

Figure 18A:
FIGS. 18A to 18F illustrate a bump forming procedure used in EXAMPLE.
Figure 18B:
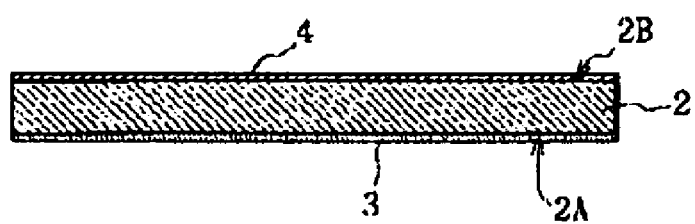
Figure 18C:
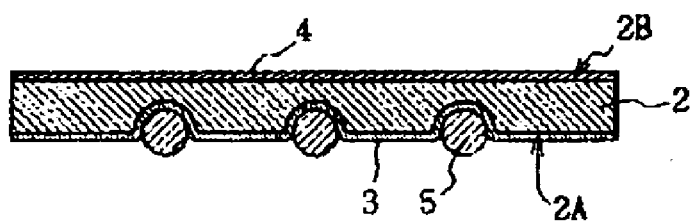

Next, referring to FIG. 18C and FIG. 19C, a plurality of solder balls 5 (e.g., 25 balls), prepared beforehand to have almost the same diameter, are placed on the releasing layer 3 using tweezers with round edges, while confirming that these bumps 25 are pitched at 100 µm as the center-to-center distance at the points each corresponding to each pad 11 on the side 10A of the wafer 10 by a metaloscope (not shown). Then, these solder balls 5 are embedded in the base 2 to around half of their diameter to fix them by applying a pressure to the releasing layer 3 side to an extent not collapse these balls. These bumps are fixed relatively fast to he releasing layer 3 not to easily fall even when the layer is faced down.

Figure 18D:
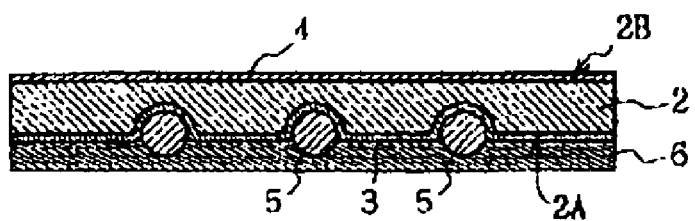

Next, referring to FIG. 18D and FIG. 19D, the electroconductive, adhesive layer 6 is formed on the solder balls 5 by an ink jetting method in such a way to cover these balls, where the ink composition is spread to around 10 g/m², as is the case with the acryl resin layer 4 and releasing layer 3. Thus, the first to fourth solder ball transferring sheets are produced by the procedure illustrated in FIGS. 18A–D and FIGS. 19A–D.

Then, 25 bumps are formed on the corresponding pads 11 on the side 10A of the wafer 10 using one of the first to fourth solder ball transferring sheets.

First, formation of one solder ball 5 on the corresponding pad 11 on the side 10A of the wafer 10 using one of the first to fourth solder ball transferring sheets is described. Referring to FIG. 18D and FIG. 19D, the pads 11 of aluminum or the like, having a diameter of around 10 µm, are formed on the side 10A of the wafer 10, and the passivation film 12 is formed in the periphery around each pad 11.

In this case, the solder ball transferring sheet 1 and the side 10A of the wafer 10 are faced each other in such a way that each solder ball 5 on the sheet 1 comes into contact with each pad 11 on the wafer 10 via the electroconductive, adhesive layer 6.

Next, the solder balls 5 are positioned in such a way that each has the center aligned with that of the corresponding pad 11 on the side 10A of the wafer 10 using a metaloscope. Then, the solder ball transferring sheet 1 is lightly pressed by tweezers or the like from the acryl resin layer 4 side to be positioned/fixed on the wafer 10.

Next, a given region of the electroconductive, adhesive layer 6 corresponding to the solder ball 5 is heated at around 150° C. for around 30 seconds by a heater, e.g., heat sealer, from a given region of the acryl resin layer 4 corresponding to the solder ball 5 via the acryl resin layer 4, base 2 and the like. This solidifies the electroconductive, adhesive layer 6 at the given region between the solder ball 5 and pad 11 on the side 10A of the wafer 10, to fix the bump 5 on the pad 11.

Next, the solder ball transferring sheet 1 is released from the bumps fixed on the pad 11 on the side 10A of the wafer 10. This transfers the bump 5 to the corresponding pad 11 on the side 10A of the wafer 10 via the electroconductive, adhesive layer 6, to form the bump 5 on the pad 11.

FIG. 20 illustrates the bump 5 formed on the corresponding pad 11 on the side 10A of the wafer 10 via the given region 6A of the electroconductive, adhesive layer 6, as observed by a metaloscope (not shown), while retaining its original shape it has when formed on the releasing layer 3 on the solder ball transferring sheet 1, shown in FIGS. 18 and 19.

Figure 18E:
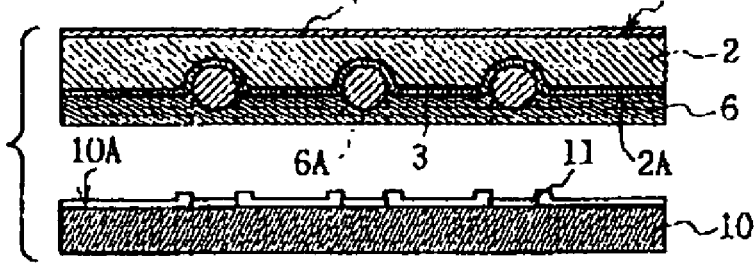

On the other hand, formation of the bump 5 on each of the 25 pads 11 on the side 10A of the wafer 10 using one of the first to fourth solder ball transferring sheets is described by referring to FIGS. 18E and 19E. First, the 25 pads 11 of aluminum or the like, having a diameter of around 10 µm, are formed on the side 10A of the wafer 10, where these pads 11 are pitched at 100 µm as the center-to-center distance, and the passivation film 12 is formed in the periphery around each pad 11 on the side 10A of the wafer 10 to electrically protect the side 10A of the wafer 10.

In this case, the solder ball transferring sheet 1 and the side 10A of the wafer 10 are faced each other in such a way that each solder ball 5 on the sheet 1 comes into contact with each pad 11 on the wafer 10 via the electroconductive, adhesive layer 6. Next, the solder balls 5 are positioned in such a way that each has the center aligned with that of the corresponding pad 11 on the side 10A of the wafer 10 using a metaloscope (not shown). Then, the solder ball transferring sheet 1 is lightly pressed by tweezers or the like from the acryl resin layer 4 side to be positioned/fixed on the wafer 10.

Next, each solder ball 5 and corresponding electroconductive, adhesive layer 6 at the given region 6A are heated at around 150° C. for around 30 seconds by a heater, e.g., heat sealer, from a given region of the acryl resin layer 4 corresponding to the solder ball 5 via the acryl resin layer 4, base 2 and the like. This solidifies the electroconductive, adhesive layer 6 at the given region 6A between the solder ball 5 and pad 11 on the side 10A of the wafer 10, to fix the bump 5 on the corresponding pad 11.

Figure 18F:
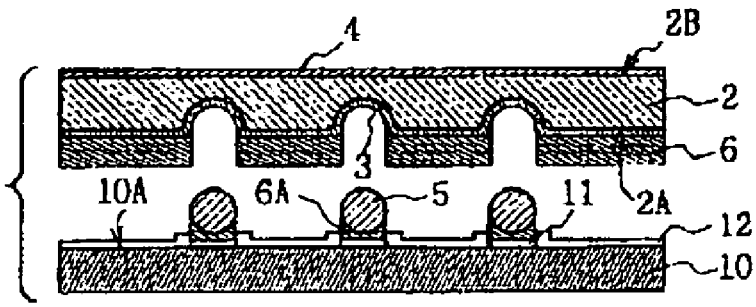

Next, the solder ball transferring sheet 1 is released from the bumps fixed on the pad 11 on the side 10A of the wafer 10, as shown in FIG. 18F and FIG. 19F. This transfers the solder ball 5 to the corresponding pad 11 on the side 10A of the wafer 10 via the electroconductive, adhesive layer 6, to form the bump 5 on the pad 11.

Figure 21A:
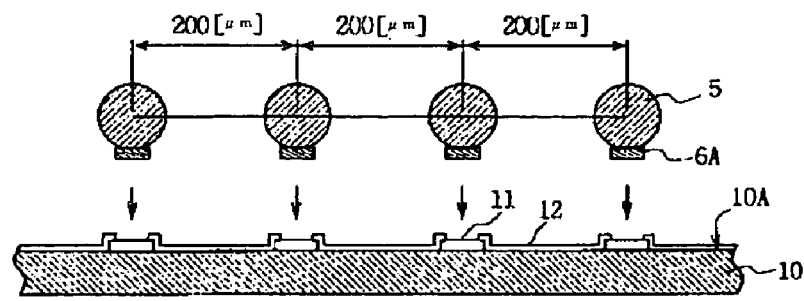
FIGS. 21A and 21B illustrate bumps formed on respective wafer pads.
Figure 21B:
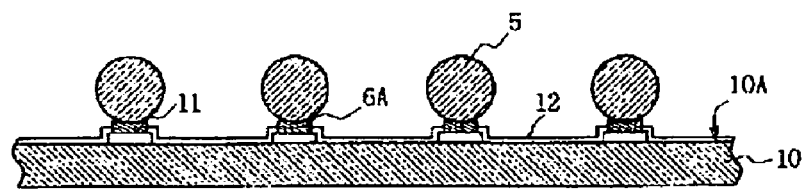

FIGS. 21A and 21B illustrate the solder balls 5, similar to those shown in FIGS. 18 and 19, pitched at 200 μm on the releasing layer 3 on the solder ball transferring sheet 1 (not shown), which are formed on the corresponding pads 11 on the side 10A of the wafer 10 while retaining their original conditions, e.g., pitch and external shape.

2. Formation of the Electroconductive, Adhesive Layer on the Semiconductor Wafer Electrode (1) Method for Forming Solder Ball Transferring Sheet The solder ball transferring sheet of the present invention, formed on a base (substrate), has a heat-resistant layer with a number of openings arranged regularly on the surface. This sheet can hold solder balls in these openings in such a way that they are arranged regularly and have a uniform size, to transfer them collectively from the heat-resistant layer to the semiconductor wafer or the like.

The solder ball transferring sheet is described in more detail.

In this embodiment, the base material can be selected from those excellent in adhesion to the heat-resistant layer, capable of retaining the heat-resistant layer and resistant to temperature at which the solder balls are transferred. These materials include silicon, glass, ceramic, plastic to form an organic base, and metal.

Of these base materials, it is preferable to use the one which has a thermal expansion coefficient almost the same as that for the semiconductor wafer on which the solder balls are to be mounted. Such a base can minimize misalignment resulting from thermal expansion between the solder balls formed in the openings of the solder ball forming film and electrode or other components of the semiconductor, when the semiconductor and base placed thereon are heated for transferring the solder balls.

The base of silicon is particularly preferable, because it has a thermal expansion coefficient almost the same as that for a semiconductor wafer of silicon.

When silicon is used for the base, the heat-resistant layer of polyimide or the like on the base generally has a higher thermal expansion coefficient than the silicon base, which may cause elastic deformation of the heat-resistant layer on the base. However, it generally has a lower Young's modulus than the base, with the result that its heat-caused elastic deformation is larger than that of the base in the vicinity of the surface of the heat-resistant layer, but almost the same in the vicinity of the bottom of the opening. Therefore, the positional misalignment between the heated solder ball and ball at normal temperature is close to expansion of the heated silicon base, because the solder ball is formed in the deepest portion of the heat-resistant layer. Accordingly, the amount of a shift from a room temperature position to a high temperature position of the heat-resistant layer adhered to the silicon base is greatly smaller than that of the heat-resistant layer alone.

When adhesion of the heat-resistant layer to the base is insufficient, an adhesive layer of heat-resistant material may be provided to improve the adhesion.

The base may be deformed by difference between the base and heat-resistant layer in thermal expansion coefficient. Such a deformation is preferably prevented by using the base sufficiently thicker than the heat-resistant layer, or providing the heat-resistant layers of the same thickness on both sides of the base.

When the solder bumps are formed on the semiconductor electrode at finer pitches, positional misalignment of the pattern at the opening of the solder ball forming film on the base may occur while the base and semiconductor wafer are heated for transferring the solder balls, resulting from difference between the base/heat-resistant layer and semiconductor wafer in thermal expansion coefficient.

In such a case, it is preferable to correct the pattern at the opening of the heat-resistant layer beforehand in such a way that the solder ball and semiconductor wafer electrode coincide with each other at temperature at which the solder balls are transferred to the electrode. Minimizing the positional misalignment between them can reduce correction of the pattern at the opening when the semiconductor on which the solder balls are to be mounted increases in size.

The heat-resistant layer material is selected from those adhesive to the base, low in thermal expansion coefficient and chemically inert with the solder material. The preferable materials for the heat-resistant layer include polymers, which can be provided with openings of desired size. They are preferably resistant to melting temperature at which the solder balls are transferred.

These heat-resistant polymers useful for the present invention include polyimide, polyaminobismaleimide, polyether sulfone, polyphenylene sulfone, polyallyl sulfone, polyallylate, polyether ketone, polyether imide, polyethylene tetrafluoride and polyethylenepropylene fluoride.

Of these, polyimide is a preferable material for this embodiment, because of its availability and handleability. A heat-resistant polymer, e.g., polyimide, is chemically inert with the solder to limit adhesion of the solder balls to the heat-resistant layer, thereby facilitating transfer of the solder balls to the wafer and other semiconductor components.

The heat-resistant layer of a heat-resistant polymer, e.g., polyimide, will not be deteriorated by heat for transferring the solder balls. Moreover, such a heat-resistant layer is chemically stable and will not be deteriorated by a solvent, e.g., isopropyl alcohol (IPA), to which it is exposed later. Therefore, the solder ball transferring sheet prepared in this embodiment can be reused repeatedly.

The heat-resistant polymer for the heat-resistant layer may be sensitive or insensitive to light. If the heat-resistant layer comprises a light-sensitive polymer, it can be provided with fine patterns at its openings by photolithography. For example, fine patterns may be drawn at the openings in the heat-resistant layer by exposing the patterns to light by an exposure device, e.g., g-line aligner, developed and cured (thermally treated).

For the heat-resistant layer of light-insensitive material, patterns may be drawn with laser beams, e.g., those from an excimer laser, and then cured.

The film-making method for the heat-resistant layer is not limited. For example, it may be formed on the base to a given thickness by spin coating, dip coating or the like. Or else, another layer is formed on the substrate or base after being provided with openings of given shape, and then coated with a heat-resistant polymer to form the heat-resistant layer.

The solder ball transferring sheet of the present invention can provide the heat-resistant layer (of heat-resistant polymer, in particular) with openings whose shape can be freely controlled by photolithography, or by laser beams or the like. As such, it can provide a larger volume of the openings than the conventional method, and dispose the larger solder balls more accurately. This should lead to formation of the more reliable solder bumps.

(2) Formation of the Electroconductive, Adhesive Layer

Using ink jetting method (liquid spraying), an electroconductive, adhesive layer was formed on the semiconductor wafer electrode, opposite to the sheet described in (1).

(3) Method for Transferring the Solder Balls

The solder ball transferring step transfers the solder balls disposed on the solder ball transferring sheet, described above, to the electrode section on the semiconductor wafer.

The solder balls, formed on the solder ball transferring sheet at the openings in the heat-resistant layer, are placed on the semiconductor wafer, after each ball position is aligned with the corresponding electrode position on the wafer, and heated to transfer the balls to the corresponding electrodes.

The solder ball transferring step preferably comprises the following 3 steps, (i) the semiconductor wafer and substrate are heated, (ii) each ball position is aligned with the corresponding electrode position on the wafer by an aligner while they are being heated, and (iii) the semiconductor wafer and substrate are mounted to collectively transfer the solder balls to the electrodes.

The method of the present invention can minimize the positional misalignment between the solder ball in the openings of the heat-resistant layer and corresponding electrode in the semiconductor wafer, caused by thermal expansion occurring when the semiconductor wafer and substrate placed thereon are heated, by transferring the solder balls with the aid of the solder ball transferring sheet comprising the substrate of a material having a thermal expansion coefficient similar to that of the semiconductor wafer.

Therefore, this embodiment of the present invention can produce, easily in a high yield, the semiconductor device on which the finely pitched, highly reliable solder bumps are mounted.

(Bump)

The bump of the present invention can be produced by spraying a liquid of solder alloy material layer composition comprising at least a solder alloy material, solvent and wetting agent onto an intermediate metallic layer on an external electrode pad in a semiconductor device to form a solder alloy material layer, spraying a liquid of flux material layer composition comprising at least a rosin, activator and solvent onto the solder alloy material layer to form a flux material layer, and fusing the solder alloy material layer and flux material layer under heating.

The bumps mounted thereon have a diameter of 30 μm or less, preferably 0.001 μm to 10 μm, more preferably 0.001 μm to 1 μm.

Shear strength of the bumps of the present invention is preferably 8 kgf or more, and more preferably from 10 kgf to 30 kgf. Tensile strength of bumps of a semiconductor device of the present invention is preferably 1000 kgf or more, and more preferably from 1300 kgf to 2000 kgf.

(Semiconductor Device)

The semiconductor device of the present invention has an intermediate metallic layer and bumps formed one by one on external electrode pads, wherein the bumps are formed by a liquid spraying method to have a diameter of 30 μm or less.

In this case, theses bumps are preferably formed by heating/fusing the solder alloy material layer formed on the intermediate, metallic layer and flux material layer formed on the solder alloy material layer, both formed by a liquid spraying method, the former being of the composition comprising at least a solder alloy material, solvent and wetting agent, and the latter of the composition comprising at least a rosin, activator and solvent.

The semiconductor device of the present invention is produced by the bump forming method comprising a solder ball disposing step for disposing solder balls on a substrate on one side at each bump forming point on an object on which these bumps are to be formed; electroconductive, adhesive composition supplying step for supplying an electroconductive, adhesive composition by a liquid spraying method to the bump forming points on the object on which these bumps are to be formed; positioning step for positioning each solder ball and corresponding bump forming point by checking the substrate with the object on which the bumps are to be formed in such a way to bring each solder ball into contact with the corresponding bump forming point via the electroconductive, adhesive composition; solder ball fixing step for fixing the solder ball on the corresponding bump forming point by solidifying the electroconductive, adhesive composition; and substrate releasing step for releasing the substrate from the bump fixed on the bump forming point on the object on which the bumps are formed. These bumps have a diameter of 30 μm or less.

The semiconductor device of the present invention is characterized in that the bumps mounted thereon have a diameter of 30 μm or less, preferably 0.001 μm to 10 μm, more preferably 0.001 μm to 1 μm.

The method for producing the bumps is not limited, as discussed earlier. However, the inventors of the present invention have realized the method by adopting a liquid spraying method (e.g., ink jetting method).

The solder bumps of the present invention, having a diameter of 30 μm or less, are particularly useful for increasing integration extent of ICs and assembling packages at a higher density.

The liquid spraying method (e.g., ink jetting method) of the present invention can give the bumps of desired diameter, not limited to 30 μm or less, when ink discharging conditions, e.g., discharge rate, are controlled.

Shear strength of bumps of a semiconductor device of the present invention is preferably 8 kgf or more, and more preferably from 10 kgf to 30 kgf. Tensile strength of bumps of a semiconductor device of the present invention is preferably 1000 kgf or more, and more preferably from 1300 kgf to 2000 kgf.

The present invention is described in detail by EXAMPLES, which by no means limit the present invention.

EXAMPLES 1 to 5 describe methods for preparing the solder alloy material layer compositions.

The following metallic nano-particle pastes, stably dispersed with the particles of several nanometers in size, were used as the ink compositions.

In EXAMPLES, the following fine solder particles were used:
(i) Average particle size: 6 nm (Tarutin Kester Co., Ltd.)
(ii) Average particle size: 5 nm (Senju Metal Industry Co., Ltd.)
(iii) Average particle size: 8 nm (Alpha Metals of Japan Ltd.)
(iv) Average particle size: 5 nm (Nihon Handa Co., Ltd.)

EXAMPLE 1

Preparation of Solder Material Layer Composition

The components of the solder material layer compositions were prepared at given proportions:
   Fine solder particles: Fine particles having an average size of 6 nm (Tarutin Kester Co., Ltd.), 5% by mass
   Dispersant: styrene/acryl resin, 5% by mass
   Activator: (II-2), described above, 2% by mass
   Wetting agent: Glycerol, 18% by mass
   Solvent: 1,3-Dimethyl-2-imidazolidinone, 35% by mass
   Solvent: N-methyl-2-pyrrolidone, 11% by mass
   Solvent: 1,4-Butanediol, 24% by mass A stainless pressure vessel (inner volume: 100 ml), equipped with a jacket for warm water and stirrer inside, was charged with 5 g (as the solid) of the fine solder particles (Tarutin Kester Co., Ltd.), into which carbon dioxide gas was blown under pressure, heated and kept under a critical condition ($50\pm1°$ C. and $200\pm5$ atms.) inside for 5 minutes to dissolve the pigment.

Then, the vessel was further charged with 2 g of a 25% aqueous solution of the surfactant and 35 ml of 1,3-dimethyl-2-imidazolidinone, and carbon dioxide was released from the stainless pressure vessel, to separate the fine solder particles and prepare the dispersion 1.

All of the other ink composition components were well mixed with 42 g of the resulting dispersion under stirring, and filtered by a 0.5 μm filter, to prepare the solder alloy material layer composition 1. Solid content and vapor pressure of composition 1 were 10% by mass and 0.1 mmHg (at room temperature), respectively.

Table 6 gives the dispersed condition of each dispersion, filter conditions and characteristics of the solder alloy material layer composition 1.

EXAMPLE 2

Preparation of Solder Material Layer Composition

The components of the solder material layer compositions were prepared at given proportions. The dispersion 2 and solder material layer composition 2 were prepared in the same manner as in EXAMPLE 1, except that the following components were used at given proportions. Solid content and vapor pressure of composition 2 were 10% by mass and 0.08 mmHg (at room temperature), respectively.
   Fine solder particles: Fine particles having an average size of 5 nm (Senju Metal Industry Co., Ltd.), 5% by mass.
   Dispersant: styrene/acryl resin, 5% by mass
   Activator: (II-3), 1% by mass
   Activator: (III-1), 1.2% by mass
   Wetting agent: Glycerol, 18% by mass
   Solvent: 1,3-Dimethyl-2-imidazolidinone, 35% by mass
   Solvent: N-methyl-2-pyrrolidone, 11% by mass
   Solvent: 1,4-Butanediol, 23.8% by mass Table 6 gives the dispersed condition of the dispersion 2, filter conditions and characteristics of the solder alloy material layer composition 2.

EXAMPLE 3

Preparation of Solder Material Layer Composition

The components of the solder material layer compositions were prepared at given proportions:
   Fine solder particles: Fine particles having an average size of 8 nm (Alpha Metals of Japan Ltd.), 5% by mass.
   Dispersant: styrene/acryl resin, 5% by mass
   Activator: Surfactant (II-2), 1% by mass
   Activator: Activator (IV), R: $C_9H_{19}$, "k": 12, 1% by mass
   Wetting agent: Glycerol, 18% by mass
   Solvent: 1,3-Dimethyl-2-imidazolidinone, 35% by mass
   Solvent: N-methyl-2-pyrrolidone, 11% by mass
   Solvent: 1,4-Butanediol, 24% by mass A stainless pressure vessel (inner volume: 100 ml), equipped with a jacket for warm water and stirrer inside, was charged with the fine solder particles (Alpha Metals of Japan Ltd.), into which 92 ml of toluene was introduced at normal temperature and pressure, and kept at 50° C. inside for 5 minutes while the pressure level was unchanged at normal pressure to dissolve the fine solder particles.

Then, the vessel was further charged with 1,3-dimethyl-2-imidazolidinone, described above, and toluene was removed by evaporation, to separate the fine solder particles and prepare the dispersion 3.

A 25% aqueous solution of the surfactant (2 g) and all of the other ink composition components were well mixed with 42 g of the resulting dispersion under stirring, and filtered by a 0.5 μm filter, to prepare the solder alloy material layer composition 3. Solid content and vapor pressure of composition 3 were 10% by mass and 0.01 mmHg (at room temperature), respectively.

Table 6 gives the dispersed condition of the dispersion 3, filter conditions and characteristics of the solder alloy material layer composition 3.

EXAMPLE 4

Preparation of Solder Material Layer Composition

The components of the solder material layer compositions were prepared at given proportions. The dispersion 4 and solder material layer composition 4 were prepared in the same manner as in EXAMPLE 3, except that the following components were used at given proportions. Solid content and vapor pressure of composition 4 were 10% by mass and 0.1 mmHg (at room temperature), respectively.
   Fine solder particles: Fine particles having an average size of 5 nm (Nihon Handa Co., Ltd.), 5% by mass
   Dispersant: styrene/acryl resin, 5% by mass
   Activator: Surfactant (II-4), 1% by mass
   Activator: Activator (V), "p" and "q": 20, 0.8% by mass
   Wetting agent: Glycerol, 18% by mass
   Solvent: 1,3-Dimethyl-2-imidazolidinone, 35% by mass
   Solvent: N-methyl-2-pyrrolidone, 11% by mass
   Solvent: 1,4-Butanediol, 24.2% by mass Table 6 gives the dispersed condition of the dispersion 4, filter conditions and characteristics of the solder alloy material layer composition 4.

EXAMPLE 5

Preparation of Solder Material Layer Composition

The components of the solder material layer compositions were prepared at given proportions. The dispersion 5 and solder material layer composition 5 were prepared in the same manner as in EXAMPLE 1, except that the following components were used at given proportions. Solid content and vapor pressure of composition 5 were 10% by mass and 0.2 mmHg (at room temperature), respectively.

Fine solder particles: Fine particles having an average size of 5 nm (Nihon Handa Co., Ltd.), 5% by mass
Dispersant: styrene/acryl resin, 5% by mass
Activator: Surfactant (I-5), 0.4% by mass
Activator: Activator (IV), R: $C_{10}H_{21}$, "K": 7, 1% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 24.6% by mass Table 6 gives the dispersed condition of the dispersion 5, filter conditions and characteristics of the solder alloy material layer composition 5.

(Property Evaluation of the Solder Alloy Material Layer Compositions)

Each of these ink compositions was evaluated for viscosity, surface tension, contact angle with a material which constituted the ink discharge nozzle face in the ink jetting head, dischargeability, and patterning and film-making characteristics. The results are given in Table 7. The physical properties and dischargeability of the ink compositions were evaluated by the following procedures:

(1) Viscosity: Measured at 20° C. by an E type viscometer
(2) Surface tension: Measured also at 20° C. by the plate method
(3) Contact angle: Measured as static contact angle with a material which constituted the ink discharge nozzle face in the ink jetting head (water-repelling layer plated with a Ni-tetrafluoroethylene eutectoid)
(4) Dischargeability: Measured using an ink jetting printer head (Ricoh Co., IPSIO Jet 300). Extent of curved travel of the ink droplets was measured as scatter of the points at which the droplets were placed on the substrate, which was 0.6 mm apart from the head. Frequency of nozzle pore clogging was measured as time elapsed until the nozzle pore was clogged and was unable to discharge the ink composition, in which the ink was continuously discharged at a frequency of 7,200 Hz.
(5) Patterning and film-making characteristics: As shown in FIG. 8A, the periphery around each of the pads 41 of aluminum or the like, formed on one side 40A of the wafer 40, was covered with the passivation film 42, to electrically protect the side 40A of the wafer 40. Then, the ink composition (4 pl) containing fine solder particles was discharged from the ink jet head 53 of the ink jetting printer 52 onto the pad shown in FIG. 8A. The resulting film, thermally treated in air at 100° C. for 10 minutes after the solvent was removed therefrom at room temperature under a vacuum, was microscopically observed for its properties (extent of agglomeration, flatness and so on). The pad has openings, 20 μm in diameter.

TABLE 6

| | Fine solder particles | Dispersion conditions | Filter conditions | Ink characteristics |
|---|---|---|---|---|
| Example 1 | Average particle size: 6 nm (Tarutin Kester Co., Ltd.) | Uniform | Essentially not clogged | Usable |
| Example 2 | Average particle size: 5 nm (Senju Metal Industry, Co., Ltd.) | Uniform | Not clogged | Usable |
| Example 3 | Average particle size: 8 nm (Alpha Metals of Japan Ltd.) | Uniform | Not clogged | Usable |
| Example 4 | Average particle size: 5 nm (Nihon Handa Co., Ltd.) | Uniform | Not clogged | Usable |
| Example 5 | Average particle size: 5 nm (Nihon Handa Co., Ltd.) | Uniform | Not clogged | Usable |

TABLE 7

| | Example 1 | Example 2 | Example 3 | Example 4 | Example 5 |
|---|---|---|---|---|---|
| Viscosity (mPa · s) | 9.51 | 8.72 | 8.95 | 8.51 | 8.08 |
| Surface tension (mN/m) | 42.6 | 41.9 | 42.5 | 44.2 | 40.9 |
| Contact angle (°) | 38.5 | 44.9 | 38.4 | 34 | 31 |
| Clogging frequency (sec) | >10000 | >10000 | >10000 | >10000 | >10000 |
| Travel scatter (μm) | ±20 | ±25 | ±25 | ±20 | ±20 |
| Patterning characteristics | Good | Good | Good | Good | Good |
| Film-making characteristics | Good | Good | Good | Good | — |

EXAMPLES 6 to 13 describe methods for preparing the electroconductive, adhesive compositions.

The following metallic nano-particle pastes, stably dispersed with the particles of several nanometers in size, were used as the ink compositions.

In EXAMPLES, the following fine electroconductive materials were used:

(6) Fine gold particles: Average particle size: 6 nm (Tamura Kaken Corp.)
(7) Fine silver particles: Average particle size: 5 nm (Tamura Kaken Corp.)
(8) Fine copper particles: Average particle size: 8 nm (Tamura Kaken Corp.)
(9) Fine In particles: Average particle size: 5 nm (Alpha Metals of Japan Ltd.)
(10) Fine electroconductive carbon particles: Average particle size: 5 nm (Kao Corp.)
(11) Electroconductive resin: Average particle size: 7 nm (Lion Corp.)
(12) Anisotropic electroconductive resin: Average particle size: 8 nm (Sony Chemical Corp.)
(13) Anisotropic electroconductive resin: Average particle size: 5 nm (Sony Chemical Corp.)

EXAMPLE 6

Preparation of Electroconductive, Adhesive Composition

The components of the electroconductive, adhesive compositions were prepared at given proportions:

Electroconductive material: Fine gold particles having an average particle size: 6 nm (Tamura Kaken Corp.), 5% by mass
Dispersant: styrene/acryl resin, 5% by mass
Activator: (II-2), described above, 2% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 24% by mass A stainless pressure vessel (inner volume: 5 l), equipped with a jacket for warm water and stirrer inside, was charged with 5 g (as the solid) of the fine gold particles, into which carbon dioxide gas was blown under pressure, heated and kept under a critical condition (50±1° C. and 200±5 atms.) inside for 5 minutes to dissolve the electroconductive material.

Then, the vessel was further charged with 2 g of a 25% aqueous solution of the surfactant and 35 ml of 1,3-dimethyl-2-imidazolidinone, and carbon dioxide was released from the stainless pressure vessel, to separate the electroconductive material and prepare the dispersion 6.

All of the other ink composition components described above were well mixed with 42 g of the resulting dispersion under stirring, and filtered by a 0.5 μm filter, to prepare the solder alloy material layer composition 6. Solid content and vapor pressure of composition 6 were 10% by mass and 0.08 mmHg (at room temperature), respectively.

Table 8 gives the dispersed condition of the dispersion, filter conditions and characteristics of the electroconductive, adhesive composition.

EXAMPLE 7

Preparation of Electroconductive, Adhesive Composition

The components of the electroconductive, adhesive compositions were prepared at given proportions. The dispersion 7 and electroconductive, adhesive composition 7 were prepared in the same manner as in EXAMPLE 6, except that the following components were used at given proportions. Solid content and vapor pressure of composition 7 were 10% by mass and 0.09 mmHg (at room temperature), respectively.

Electroconductive material: Fine silver particles having an average particle size: 5 nm (Tamura Kaken Corp.), 5% by mass
Dispersant: styrene/acryl resin, 5% by mass
Activator: (II-3), 1% by mass
Activator: (III-1), 1.2% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 23.8% by mass Table 8 gives the dispersed condition of the dispersion 7, filter conditions and characteristics of the ink composition components 7.

EXAMPLE 8

Preparation of Electroconductive, Adhesive Composition

The components of the electroconductive, adhesive compositions were prepared at given proportions. The dispersion 8 and electroconductive, adhesive composition 8 were prepared in the same manner as in EXAMPLE 6, except that the following components were used at given proportions. Solid content and vapor pressure of composition 8 were 10% by mass and 0.1 mmHg (at room temperature), respectively.

Electroconductive material: Fine copper particles having an average particle size: 8 nm (Tamura Kaken Corp.), 5% by mass
Dispersant: styrene/acryl resin, 5% by mass
Activator: (II-2), 1% by mass
Activator: (IV), R: $C_9H_{19}$, "k": 12, 1% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 24% by mass Table 8 gives the dispersed condition of the dispersion 8, filter conditions and characteristics of the ink composition components 8.

EXAMPLE 9

Preparation of Electroconductive, Adhesive Composition

The components of the electroconductive, adhesive compositions were prepared at given proportions. The dispersion 9 and electroconductive, adhesive composition 9 were prepared in the same manner as in EXAMPLE 6, except that the following components were used at given proportions. Solid content and vapor pressure of composition 9 were 10% by mass and 0.08 mmHg (at room temperature), respectively.

Electroconductive material: Fine In particles having an average particle size: 5 nm (Alpha Metals of Japan Ltd.), 5% by mass
Dispersant: styrene/acryl resin, 5% by mass
Activator: (II-4), 1% by mass
Activator: (V), "p" and "q": 20, 0.8% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 24.2% by mass Table 8 gives the dispersed condition of the dispersion 9, filter conditions and characteristics of the ink composition components 9.

EXAMPLE 10

Preparation of Electroconductive, Adhesive Composition

The following fine electroconductive materials were used at given proportions:

Electroconductive material: Fine electroconductive carbon particles having an average particle size of 5 nm (Kao Corp.), 5% by mass
Dispersant: Styrene/acryl resin, 5% by mass
Activator: Activator (I-5), 0.4% by mass
Activator: Activator (IV), R: $C_{10}H_{21}$, K: 7, 1% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 24.6% by mass A stainless pressure vessel (inner volume: 5 l), equipped with a jacket for warm water and stirrer inside, was charged with the fine electroconductive carbon particles having an average particle size of 5 nm (Kao Corp.), into which 200 ml of toluene was introduced at normal temperature and pressure, and kept at 50° C. inside for 5 minutes while the pressure level was unchanged at normal pressure to dissolve the electroconductive material.

Then, the vessel was further charged with a 25% aqueous solution of the surfactant and 35 g of 1,3-dimethyl-2-imidazolidinone, and toluene was removed by evaporation, to separate the electroconductive material and prepare the dispersion 10.

All of the other ink composition components were well mixed with 42 g of the resulting dispersion under stirring, and filtered by a 0.5 μm filter, to prepare the electroconductive, adhesive composition 10. Solid content and vapor pressure of composition 10 were 10% by mass and 0.08 mmHg (at room temperature), respectively.

Table 8 gives the dispersed condition of the dispersion 10, filter conditions and characteristics of the electroconductive, adhesive composition 10.

EXAMPLE 11

Preparation of Electroconductive, Adhesive Composition

The components of the electroconductive, adhesive compositions were prepared at given proportions. The dispersion 11 and electroconductive, adhesive composition 11 were prepared in the same manner as in EXAMPLE 10, except that the following components were used at given proportions. Solid content and vapor pressure of composition 11 were 10% by mass and 0.09 mmHg (at room temperature), respectively.

Electroconductive material: Electroconductive resin having an average particle size: 7 nm (Lion Corp.), 5% by mass
Dispersant: styrene/acryl resin, 5% by mass
Activator: (II-1), 0.3% by mass
Activator: (V), "p"+"q"=15, 0.5% by mass
Activator: Activator (V), "p"+"q"=0, 0.5% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 24.7% by mass Table 8 gives the dispersed condition of the dispersion 11, filter conditions and characteristics of the ink composition components 11.

EXAMPLE 12

Preparation of Electroconductive, Adhesive Composition

The components of the electroconductive, adhesive compositions were prepared at given proportions. The dispersion 12 and electroconductive, adhesive composition 12 were prepared in the same manner as in EXAMPLE 10, except that the following components were used at given proportions. Solid content and vapor pressure of composition 12 were 10% by mass and 0.1 mmHg (at room temperature), respectively.

Electroconductive material: Anisotropic electroconductive resin having an average particle size of 8 nm (Sony Chemical Corp.), 5% by mass
Dispersant: styrene/acryl resin, 5% by mass
Activator: (II-4), 0.6% by mass
Activator: (V), "p" and "q": 20, 0.4% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 25% by mass Table 8 gives the dispersed condition of the dispersion 12, filter conditions and characteristics of the electroconductive, adhesive layer forming ink composition 12.

EXAMPLE 13

Preparation of Electroconductive, Adhesive Composition

The components of the electroconductive, adhesive compositions were prepared at given proportions. The dispersion 13 and electroconductive, adhesive composition 13 were prepared in the same manner as in EXAMPLE 10, except that the following components were used at given proportions. Solid content and vapor pressure of composition 13 were 10% by mass and 0.09 mmHg (at room temperature), respectively.

Electroconductive material: Anisotropic electroconductive resin having an average particle size of 5 nm (Sony Chemical Corp.), 5% by mass
Dispersant: styrene/acryl resin, 5% by mass
Activator: (V), "p"+"q"=15, 1% by mass
Activator: (IV), R: $C_{10}H_{21}$, "K": 7, 1.5% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 23.5% by mass Table 8 gives the dispersed condition of the dispersion 13, filter conditions and characteristics of the electroconductive, adhesive composition 13.

TABLE 8

| | Fine particles (average particle size) | Dispersion conditions | Filter conditions | Ink characteristics |
|---|---|---|---|---|
| Example 6 | Gold (6 nm) | Uniform | Essentially not clogged | Usable |
| Example 7 | Silver (5 nm) | Uniform | Not clogged | Usable |
| Example 8 | Copper (8 nm) | Uniform | Not clogged | Usable |
| Example 9 | In (5 nm) | Uniform | Not clogged | Usable |
| Example 10 | Electroconductive carbon (5 nm) | Uniform | Not clogged | Usable |
| Example 11 | Electroconductive resin (7 nm) | Uniform | Not clogged | Usable |
| Example 12 | Anisotropic electroconductive resin (8 nm) | Uniform | Not clogged | Usable |
| Example 13 | Anisotropic electroconductive resin (8 nm) | Uniform | Not clogged | Usable |

(Property Evaluation of the Electroconductive, Adhesive Compositions)

Each of these ink compositions was evaluated for viscosity, surface tension, contact angle with a material which constituted the ink discharge nozzle face in the ink jetting head, dischargeability, and patterning and film-making characteristics. The results are given in Table 9. The physical properties and dischargeability of the ink compositions were evaluated by the same procedures as those for the solder alloy layer forming compositions.

As shown in Table 9, these compositions are sufficiently practical with respect to dischargeability, and patterning and film-making characteristics.

TABLE 9

|  | Viscosity (mPa · s) | Surface tension (mN/m) | Contact angle (°) | Clogging frequency (sec) | Travel scatter (μm) | Patterning characteristics | Film-making characteristics |
|---|---|---|---|---|---|---|---|
| Example 6 | 9.51 | 42.6 | 38.5 | >1000 | ±20 | Good | Good |
| Example 7 | 8.72 | 41.9 | 44.9 | >1000 | ±25 | Good | Good |
| Example 8 | 8.95 | 42.5 | 38.4 | >1000 | ±25 | Good | Good |
| Example 9 | 8.51 | 44.2 | 34 | >1000 | ±20 | Good | Good |
| Example 10 | 8.08 | 40.9 | 31 | >1000 | ±20 | Good | Good |
| Example 11 | 9.12 | 42.1 | 48.5 | >1000 | ±20 | Good | Good |
| Example 12 | 8.34 | 45.4 | 34.9 | >1000 | ±25 | Good | Good |
| Example 13 | 8.28 | 48.3 | 35.2 | >1000 | ±25 | Good | Good |

EXAMPLES 14 to 21 describe methods for preparing the flux material layer compositions.

The following flux material layer compositions were prepared.

EXAMPLE 14

Preparation of Flux Material Layer Composition

The components of the following list were mixed, stirred for 2 hours in a stirrer, and left to stand for 1 day. Then, the mixture was filtered with a 0.5 μm polypropylene filter, and thus a flux material layer composition was prepared. Solid content and vapor pressure of the composition were 15% by mass and 0.5 mmHg (at room temperature), respectively.

| Rosin | |
|---|---|
| Natural rosin: WW rosin | 6 parts by mass |
| Hydrogenated rosin | 6 parts by mass |
| Resin | |
| Epoxy resin | 3 parts by mass |
| Activators | |
| Organic acid-based activator 1: Benzoic acid | 2 parts by mass |
| Organic acid-based activator 2: Abietic acid | 1 part by mass |
| Halogen compound-based activator: 3-Amino-1-propene hydrochloride | 2 parts by mass |
| Wetting agent | |
| Glycerol | 10 parts by mass |
| Solvent | |
| 2-Ethyl-1,3-hexanediol | 2 parts by mass |
| Solvent | |
| 1,4-Butanediol | 68 parts by mass |
| (Total) | 100 parts by mass |

EXAMPLE 15

Preparation of Flux Material Layer Composition

The flux material layer composition was prepared in the same manner as in EXAMPLE 14, except that the following components were used at given proportions. Solid content and vapor pressure of the composition were 16% by mass and 5.7 mmHg (at room temperature), respectively.

| Rosin | |
|---|---|
| Natural rosin: WW rosin | 6 parts by mass |
| Hydrogenated rosin | 6 parts by mass |
| Resin | |
| Isoprene rubber | 4 parts by mass |
| Activator | |
| Organic acid-based activator 1: Adipic acid | 2 parts by mass |
| Halogen compound-based activator: N-butylamine hydrochloride | 1 part by mass |
| Wetting agent | |
| Ethylene glycol | 45 parts by mass |
| Solvent | |
| 2-(2-N-butoxyethoxy)ethanol | 36 parts by mass |
| (Total) | 100 parts by mass |

EXAMPLE 16

Preparation of Flux Material Layer Composition

The flux material layer composition was prepared in the same manner as in EXAMPLE 14, except that the following components were used at given proportions. Solid content and vapor pressure of the composition were 18% by mass and 0.03 mmHg (at room temperature), respectively.

| Rosin | |
|---|---|
| Natural rosin: WW rosin | 7 parts by mass |
| Hydrogenated rosin | 7 parts by mass |
| Resin | |
| Polyester elastomer (Toyobo Co.) | 4 parts by mass |
| Activators | |
| Organic acid-based activator 1: Glutaric acid | 2 parts by mass |
| Organic acid-based activator 2: Azelaic acid | 2 parts by mass |
| Surfactant: Quaternary ammonium (Lion Corp.'s ARQUARD C-50 ®) | 1 part by mass |
| Wetting agent | |
| Triethylene glycol | 44 parts by mass |
| Solvent | |
| N-methyl-2-pyrrolidone | 33 parts by mass |
| (Total) | 100 parts by mass |

EXAMPLE 17

Preparation of Flux Material Layer Composition

The flux material layer composition was prepared in the same manner as in EXAMPLE 14, except that the following components were used at given proportions. Solid content and vapor pressure of the composition were 15% by mass and 0.09 mmHg (at room temperature), respectively.

| Rosin | |
|---|---|
| Natural rosin: WW rosin | 8 parts by mass |
| Hydrogenated rosin | 7 parts by mass |
| Activators | |
| Organic acid-based activator 1: Adipic acid | 3 parts by mass |
| Organic acid-based activator 2: Benzoic acid | 5 parts by mass |
| Wetting agent | |
| Glycerol | 39 parts by mass |
| Solvent | |
| 1,3-Butanediol | 38 parts by mass |
| (Total) | 100 parts by mass |

EXAMPLE 18

Preparation of Flux Material Layer Composition

The flux material layer composition was prepared in the same manner as in EXAMPLE 14, except that the following components were used at given proportions. Solid content and vapor pressure of the composition were 23% by mass and 17.9 mmHg (at room temperature), respectively.

| Rosin | |
|---|---|
| Natural rosin: WW rosin | 10 parts by mass |
| Hydrogenated rosin | 8 parts by mass |
| Resin | |
| Acryl resin | 5 parts by mass |
| Activators | |
| Organic acid-based activator 1: Succinic acid | 3 parts by mass |
| Organic acid-based activator 2: Benzoic acid | 3 parts by mass |
| Surfactant: Surfactant represented by the structural formula (II) | 1 part by mass |
| Wetting agent | |
| Glycerol | 10 parts by mass |
| Solvent | |
| Diethylene glycol monomethyl ether | 60 parts by mass |
| (Total) | 100 parts by mass |

EXAMPLE 19

Preparation of Flux Material Layer Composition

The flux material layer composition was prepared in the same manner as in EXAMPLE 14, except that the following components were used at given proportions. Solid content and vapor pressure of the composition were 21% by mass and 0.09 mmHg (at room temperature), respectively.

| Rosin | |
|---|---|
| Natural rosin: WW rosin | 8 parts by mass |
| Hydrogenated rosin | 8 parts by mass |
| Resin | |
| Polyimide resin | 5 parts by mass |
| Activators | |
| Organic acid-based activator 1: Palmitic acid | 3 parts by mass |
| Organic acid-based activator 2: Abietic acid | 2 parts by mass |
| Surfactant: Surfactant represented by the structural formula (V) | 1 part by mass |
| Wetting agent | |
| N-methyl-2-pyrrolidone | 53 parts by mass |
| Solvent | |
| Ethylene glycol monobutyl ether | 20 parts by mass |
| (Total) | 100 parts by mass |

EXAMPLE 20

Preparation of Flux Material Layer Composition

The flux material layer composition was prepared in the same manner as in EXAMPLE 14, except that the following components were used at given proportions. Solid content and vapor pressure of the composition were 19% by mass and 0.3 mmHg (at room temperature), respectively.

| Rosin | |
|---|---|
| Natural rosin: WW rosin | 6 parts by mass |
| Hydrogenated rosin | 8 parts by mass |
| Resin | |
| Vinyl chloride resin | 5 parts by mass |
| Activators | |
| Organic acid-based activator 1: Stearic acid | 3 parts by mass |
| Organic acid-based activator 2: Benzoic acid | 3 parts by mass |
| Surfactant: Surfactant represented by the structural formula (III) | 2 parts by mass |
| Solvent | |
| 2,2,4-Trimethyl-1,3-pentanediol | 5 parts by mass |
| Solvent | |
| 1,3-Butanediol | 68 parts by mass |
| (Total) | 100 parts by mass |

EXAMPLE 21

Preparation of Flux Material Layer Composition

The flux material layer composition was prepared in the same manner as in EXAMPLE 14, except that the following components were used at given proportions. Solid content and vapor pressure of the composition were 21% by mass and 4.3 mmHg (at room temperature), respectively.

| Rosin | |
|---|---|
| Natural rosin: WW rosin | 8 parts by mass |
| Hydrogenated rosin | 8 parts by mass |
| Resin | |
| Acrylonitrile resin | 5 parts by mass |
| Activators | |
| Organic acid-based activator 1: Formic acid | 3 parts by mass |
| Organic acid-based activator 2: Azelaic acid | 3 parts by mass |
| Surfactant: Surfactant represented by the structural formula (IV) | 1 part by mass |
| Wetting agent | |
| Glycerol | 7.5 parts by mass |
| Solvent | |
| Ethylene glycol monobutyl ether | 64.5 parts by mass |
| (Total) | 100 parts by mass |

Table 10 gives the dispersed condition, filter condition and ink characteristics for each of the flux material layer compositions.

TABLE 10

| | Fine particles (average particle size) | Dispersion conditions | Filter conditions | Ink characteristics |
|---|---|---|---|---|
| Example 14 | Gold (6 nm) | Uniform | Essentially not clogged | Usable |
| Example 15 | Silver (5 nm) | Uniform | Not clogged | Usable |
| Example 16 | Copper (8 nm) | Uniform | Not clogged | Usable |
| Example 17 | In (5 nm) | Uniform | Not clogged | Usable |
| Example 18 | Electroconductive carbon (5 nm) | Uniform | Not clogged | Usable |
| Example 19 | Electroconductive resin (7 nm) | Uniform | Not clogged | Usable |
| Example 20 | Anisotropic electroconductive resin (8 nm) | Uniform | Not clogged | Usable |
| Example 21 | Anisotropic electroconductive resin (8 nm) | Uniform | Not clogged | Usable |

(Property Evaluation of the Electroconductive, Adhesive Compositions)

Each of these ink compositions was evaluated for viscosity, surface tension, contact angle with a material which constituted the ink discharge nozzle face in the ink jetting head, dischargeability, and patterning and film-making characteristics. The results are given in Table 11. The physical properties and dischargeability of the ink compositions were evaluated by the same procedures as those for the solder alloy layer forming compositions.

As shown in Table 11, these compositions are sufficiently practical with respect to dischargeability, and patterning and film-making characteristics.

TABLE 11

| | Viscosity (mPa · s) | Surface tension (mN/m) | Contact angle (°) | Clogging frequency (sec) | Travel scatter (μm) | Patterning characteristics | Film-making characteristics |
|---|---|---|---|---|---|---|---|
| Example 14 | 10.8 | 45.2 | 35.9 | >1000 | ±20 | Good | Good |
| Example 15 | 12.5 | 43.9 | 42.1 | >1000 | ±22 | Good | Good |
| Example 16 | 11.3 | 39.7 | 39.8 | >1000 | ±23 | Good | Good |
| Example 17 | 9.54 | 46.2 | 36.2 | >1000 | ±20 | Good | Good |
| Example 18 | 8.99 | 42.2 | 45.3 | >1000 | ±25 | Good | Good |
| Example 19 | 8.57 | 48.1 | 44.6 | >1000 | ±25 | Good | Good |
| Example 20 | 10.22 | 46.5 | 41.9 | >1000 | ±21 | Good | Good |
| Example 21 | 10.16 | 44.7 | 37.4 | >1000 | ±24 | Good | Good |

(Method for Forming Bumps by Ink Jetting Method)

The solder bump forming method with one of the solder alloy material layer compositions prepared in EXAMPLES 1 to 5, one of the electroconductive, adhesive compositions prepared in EXAMPLES 6 to 13, and one of the flux material layer compositions prepared in EXAMPLES 14 to 21 will be described.

Figure 3:
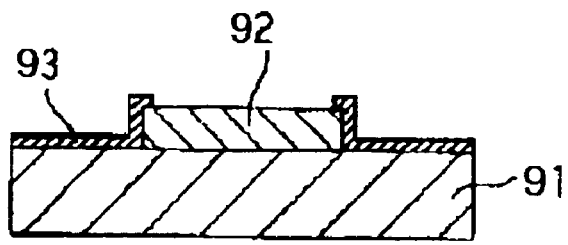
FIG. 3 illustrates a step for forming a passivation film on an LSI wafer in the solder bump forming process, wherein the essential portions are enlarged.

Referring to FIG. 3, the passivation film 93 was formed on the LSI wafer 91 in such a way to partly overlap the aluminum pad 92 on the LSI wafer 91.

Figure 4:
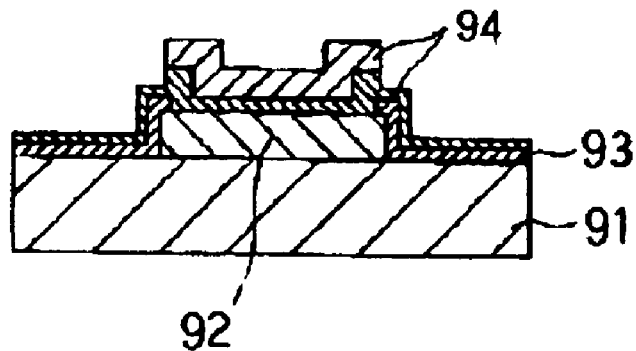
FIG. 4 illustrates a step for forming an intermediate metallic layer in the solder bump forming process, wherein the essential portions are enlarged.

Then, referring to FIG. 4, the intermediate metallic layer 94 was formed on the aluminum pad 92 and passivation film 93.

Figure 5:
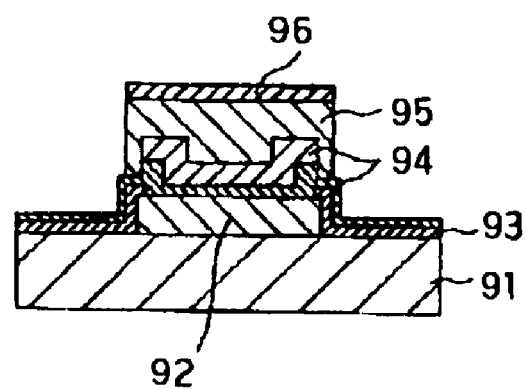
FIG. 5 illustrates steps for forming a solder alloy material layer and flux material layer composition layer in the solder bump forming process, wherein the essential portions are enlarged.

Then, referring to FIG. 5, the solder alloy material layer 95 of tin, lead or the like was formed on the intermediate metallic layer 94 at the position corresponding to the aluminum pad 92, and the flux material layer composition layer 96 was formed on the solder alloy material layer 95.

Figure 6:
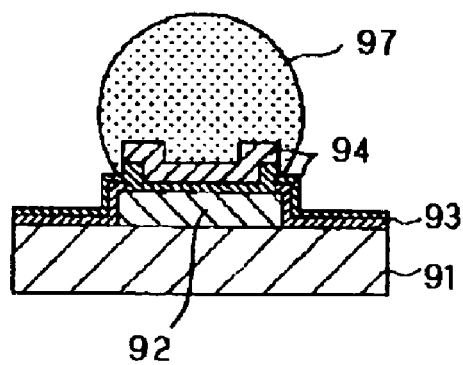
FIG. 6 is a cross-sectional view illustrating a solder bump formed by the solder bump forming process, wherein the essential portions are enlarged.

The LSI wafer 91 laminated with these layers was heated at a given temperature to fuse the solder alloy material and flux. This produced the almost spherical solder bump 97 as a connecting terminal on the aluminum pad 92 via the intermediate metallic layer 94, as shown in FIG. 6.

For heating the laminate, a wet back apparatus (e.g., Yamato Seisakusho's NRY-101V6LU) may be used.

(1) Temperature Profile

FIG. 7 outlines a temperature profile in the wet back treatment, where the treatment started from Zone T1 set at the normal temperature, and was subjected to Zones T2 to T4 set at around 100° C., 200° C. and 300° C. in this order for stepwise preheating.

Then, it was subjected to Zone 5 as the main heating zone set at around 350° C. to 400° C., and then to Zones 6 to 8 set at around 200° C., 100° C. and normal temperature in this order for stepwise cooling, to complete the treatment.

(2) Temperature Conditions for Wet Back Treatment

A wet back apparatus (e.g., Yamato Seisakusho's NRY-101V6LU), when used for the wet back treatment, is equipped with two types of heaters, a hot plate at the lower stage of the wafer passage, coming into contact with the wafer to directly heat it, and an infrared heater which heats the wafer in a non-contacting manner from above. One or both heaters may be used.

Each heating zone was set at 2 temperature levels by the hot plate and infrared (IR) heater, as shown in Table 12.

When the hot plate was used, Zones 1 to 3 were set at around 100° C., 200° C. and 300° C. for preheating, Zone 4 as the main heating zone at around 360° C., and Zones 5 and 6 at around 200° C. to 100° C. for cooling the bumps formed.

When the infrared heater was used, on the other hand, the wet back treatment was designed to start from Zone 2, where Zones 2 and 3 were set at around 250° C. and 350° C. for preheating, Zone 4 as the main heating zone at around 400° C., and Zones 5 at around 300° C. for cooling the solder bumps.

The wet back apparatus treated the semiconductor chip passing through each zone for around 60 seconds in an atmosphere containing nitrogen at around 50 ppm. Table 12 gives the temperature conditions adopted in the wet back treatment in EXAMPLE.

TABLE 12

|  | Hot plate | Infrared (IR) heater |
| --- | --- | --- |
| Zone 1 | 100° C. | — |
| Zone 2 | 200° C. | 250° C. |
| Zone 3 | 300° C. | 350° C. |
| Zone 4 | 360° C. | 400° C. |
| Zone 5 | 200° C. | 300° C. |
| Zone 6 | 100° C. | — |

(Formation of Nos. 1 to 8 Bumps)

Each of the solder alloy material layer compositions (4 pl) prepared in EXAMPLES 1 to 5 was discharged onto the intermediate metallic layer (of ball limiting metal (BLM) layer) on the pad having a 20 μm-diameter pad pore, treated at room temperature under a vacuum to remove the solvent, and then thermally treated at 100° C. in air for 10 minutes to form the solder layer.

Then, each of the flux material layer compositions (4 pl) prepared in EXAMPLES 14 to 21 was discharged onto the above solder layer, and heated/fused under the conditions given in Table 12, to form the 20 μm-diameter solder bumps.

Table 13 describes the 8 examples of the bumps (Nos. 1 to 8) formed on the intermediate metallic layer.

TABLE 13

| Bump No. | Adhesive layer | Solder alloy material layer | Flux material layer |
| --- | --- | --- | --- |
| #1 | Intermediate metallic layer | Example 1 | Example 14 |
| #2 | Intermediate metallic layer | Example 2 | Example 15 |
| #3 | Intermediate metallic layer | Example 3 | Example 16 |
| #4 | Intermediate metallic layer | Example 3 | Example 17 |
| #5 | Intermediate metallic layer | Example 4 | Example 18 |
| #6 | Intermediate metallic layer | Example 4 | Example 19 |
| #7 | Intermediate metallic layer | Example 5 | Example 20 |
| #8 | Intermediate metallic layer | Example 5 | Example 21 |

(Formation of Nos. 9 to 16 Bumps)

Next, the bump was formed using the electroconductive, adhesive composition described above for the intermediate metallic layer 94, shown in FIG. 5.

Each of the electroconductive, adhesive compositions (4 pl) prepared in EXAMPLES 6 to 13 was discharged onto the pad having a 20 μm-diameter pad pore, treated at room temperature under a vacuum to remove the solvent, and then thermally treated at 100° C. in air for 10 minutes to form the electroconductive, adhesive layer.

Then, the solder layer was formed in the manner described above, and the flux material layer composition was discharged onto the solder layer, to form 20 μm-diameter bumps thereon in the heating/fusing manner described above.

The resulting bumps are referred to as Nos. 1 to 16 bumps. FIG. 10 outlines the top view of the bump.

Table 14 describes the 8 examples of the bumps (Nos. 9 to 16) formed on the electroconductive, adhesive layer.

TABLE 14

| Bump No. | Electro-conductive, adhesive layer | Solder alloy material layer | Flux material layer |
|---|---|---|---|
| #9 | Example 6 | Example 1 | Example 14 |
| #10 | Example 7 | Example 2 | Example 15 |
| #11 | Example 8 | Example 3 | Example 16 |
| #12 | Example 9 | Example 3 | Example 17 |
| #13 | Example 10 | Example 4 | Example 18 |
| #14 | Example 11 | Example 4 | Example 19 |
| #15 | Example 12 | Example 5 | Example 20 |
| #16 | Example 13 | Example 5 | Example 21 |

(Formation of Nos. 17 to 20 Bumps (Bump Diameter: 0.5 μm to 5 μm)

First, the electroconductive, adhesive composition (1 pl, 0.6 pl, 0.2 pl and 0.1 pl, respectively) prepared in EXAMPLE 6 was discharged/laminated on pads having pores of 5 μm, 3 μm, 1 μm and 0.5 μm in diameter for patterning, where the composition was discharged by the ink jetting printer 52 (Ricoh Co.'s IPSIO Jet 300) at varying head 53 driving voltage, frequency and pulse width.

Then, it was treated at room temperature under a vacuum (1 torr) for 20 minutes to remove the solvent, and thermally treated on the hot plate at 150° C. for 2 hours in a nitrogen atmosphere, to form the electroconductive, adhesive layer.

Next, the solder alloy material layer composition prepared in EXAMPLE 1 was discharged/laminated, at 1 pl, 0.6 pl, 0.2 pl and 0.1 pl, respectively, on the electroconductive, adhesive layer having corresponding pad pore diameters.

Then, it was treated at room temperature under a vacuum (1 torr) for 20 minutes to remove the solvent, and thermally treated on the hot plate at 150° C. for 30 minutes in a nitrogen atmosphere, to form the solder alloy material layer.

Moreover, the flux material layer composition (1 pl, 0.6 pl, 0.2 pl and 0.1 pl, respectively) prepared in EXAMPLE 14 was discharged/laminated on the solder alloy material layer formed on the pad having a pore diameter of 5 μm, 3 μm, 1 μm or 0.5 μm, and heated/fused under the heating/fusing conditions given in Table 12, to form the solder bumps.

These 4 types of the bumps had a diameter of 5 μm, 3 μm, 1 μm or 0.5 μm.

These 4 types of the bumps are referred to as Nos. 17 to 20 bumps.

As discussed above, the ink jetting method can perform the fine patterning simply in a short time to give the very fine solder bumps, believed to be difficult for the conventional method to produce.

It is possible to change film thickness by changing solid content and discharge rate of the solder alloy material layer composition.

Unlike Nos. 17 to 20 bumps, Nos. 1 to 8 bumps were formed by the ink jetting method for the solder and flux layers. However, the intermediate metallic layer may be formed by the conventional method.

Therefore, the bump may be formed using a combination of a composition not highly suitable for an ink jetting method and an ink composition suitable for an ink jetting method. This expands freedom of the semiconductor designs, which is one of the advantages of the present invention.

In addition to the ink jetting method, the present invention can use the conventional methods, e.g., printing, transfer, dipping, spin coating, casting, capillary, roll coating and bar coating.

(Formation of Solder Bumps by the Conventional Method)

The conventional methods for forming solder bumps are described below.

Referring to FIGS. 8A to 8E, one of the conventional methods forms a bump on the pad 41 on the side 40A of the wafer 40.

First, the periphery around each of the pads 41 of aluminum or the like, formed on the side 40A of the wafer 40, was covered with the passivation film 42, to electrically protect the side 40A of the wafer 40, as shown in FIG. 8A.

Then, each pad 41 on the wafer side 40A was coated with a metal mask (not shown) having an opening corresponding to the pad 41 in such a way to expose the pad 41 (or a photoresist film is formed in such a way to expose the pad 41), as shown in FIG. 8B.

Next, the wafer 40 is set in a sputtering apparatus, and the adhesive layer 44 of chromium or the like and the barrier metal layer 45 of copper or the like are formed one by one on the pad 41 by sputtering. The resulting BLM film layer 46, composed of the adhesive layer 44 functioning to improve adhesion of the bump later formed and barrier metal layer 45.

Then, the metal mask, formed on the side 40A of the wafer 40, is removed. This removes that portion of the BLM film layer 46 formed on the mask.

This leaves the BLM film layer 46 on the pad 41 on the side 40A of the wafer 40.

Next, the photoresist film 47 is formed on the side 40A of the wafer 40, and exposed and developed in such a way to expose the BLM film layer 46, as shown in FIG. 8C.

Then, the bump material 48 of lead and tin is spread on the side 40A of the wafer 40 by plating or evaporation, as shown in FIG. 8D.

Then, the photoresist film 47 laminated on one side 40A of the wafer 40 is separated from the wafer to remove the associated bump material 48 laminated on that photoresist film 47, leaving the bump material 48 on each BLM film layer 46.

The wafer 40 tested for describing the conventional methods was laminated with the bump material 48 on the BLM film layer 46 by plating or evaporation. It was supplied by, e.g., Tanaka Kikinzoku Hanbai K.K. when laminated by plating, and by, e.g., IBM Japan when laminated by evaporation.

Next, a flux (not shown) (e.g., Senju Metal Industry Co., Ltd.'s Deltalux 530®) was spread on the side 40A of the wafer 40 with the bump material 48 on the BLM film layer 46, as shown in FIG. 8E. Approximately 5.0 g to 6.0 g of the flux was spread on a 6-inch wafer.

When a solder heating/fusing apparatus working in a nitrogen ($N_2$) atmosphere (Yamato Seisakusho's $N_2$ Solder Reflow System NRY-101V6LV) was used, the bump material 48 formed on the BLM film layer 46 on the wafer 40 was heated/fused in an $N_2$ atmosphere containing oxygen ($O_2$) at around 25 ppm to 30 ppm.

Lead was synthesized with tin, when the bump material 48 was fused, to form the conventional spherical bump 48A.

The production scheme is outlined in FIGS. 14A to 14D.

As illustrated by the temperature profile shown in Table 12 and FIG. 7, the $N_2$ solder heating/fusing apparatus had 6 zones (Zone 1 to Zone 6) operating at different temperatures, where each zone was set at a given temperature level by the hot plate or infrared (IR) heater.

The apparatus stopped the wafer 40 in each zone for a given time to heat it at a given temperature.

When the hot plate was used to control temperature in the apparatus, the bump material 48 formed on the pad 41 on the wafer 40 was heated stepwise in Zones 1, 2 and 3 set at around 100° C., 150° C. and 250° C.

The bump material 48 formed on the BLM film layer 46 on the wafer 40 was heated in Zone 4 as the main heating zone set at around 350° C.

Then, the bump material 48 heated/fused on the BLM film layer 46 on the wafer 40 was cooled stepwise in Zones 5 and 6 set at around 200° C. and 100° C., to form the conventional bump 48A on the pad 41 on the wafer 40 via the BLM film layer 46.

When the infrared heater was used to control temperature in the apparatus, on the other hand, the bump material 48 formed on the BLM film layer 46 on the wafer 40 was heated stepwise in Zones 1, 2 and 3 set at around 150° C., 250° C. and 350° C., respectively.

The bump material 48 formed on the BLM film layer 46 on the wafer 40 was heated in Zone 4 as the main heating zone set at around 400° C.

Then, the bump material 48 heated/fused on the BLM film layer 46 on the wafer 40 was cooled stepwise in Zones 5 and 6 set at around 350° C. and 250° C., to form the conventional bump 48A on the pad 41 on the wafer 40 via the BLM film layer 46.

In the above procedure, the wafer 40 was stopped in Zones 1 to 6 in the $N_2$ solder heating/fusing apparatus for around 30, 40, 50, 40, 40 and 60 seconds, respectively.

The conventional bump 48A was also formed by solder dipping, in addition to plating and evaporation.

In the dipping method, the solder resist film 47 was laminated on the passivation film 42 formed on the side 40A of the wafer 40, on which the BLM film layer 46 was formed on the pad 41.

Next, a flux (e.g., Senju Metal Industry Co., Ltd.'s Delta-lux 530®) was spread on the side 40A of the wafer 40.

Next, the bump material 48 composed of lead and tin was fused at around 380° C. and put in a dipping tank, where it was prepared in such a way to contain lead at 90% by mass to 98% by mass based on the totaled lead and tin weight and contain tin at a varying content of 10% by mass to 2% by mass according to the amount of lead.

Then, the wafer 40 was immersed in fused lead and tin in the dipping tank, to place the fused lead and tin on the BLM film layer 46 formed on the pad 41 on the wafer 40.

This produced the conventional bump 48A on the BLM film layer 46, made spherical by the surface tension of the fused lead and tin, and action of the flux.

The wafer 40 on which the conventional bumps 48A were formed by plating, evaporation or dipping was washed with a glycol-based detergent (e.g., Asahi Kasei Corp.'s Eliese M9000®) kept at around 50° C., in which it was shaken for around 20 minutes.

Then, the wafer 40 was washed with a detergent (e.g., 2-propanol (isopropanol) supplied by Kanto Kagaku Co., Ltd.) kept at around room temperature, in which it was shaken for around 10 minutes. In this way, the flux remaining on the passivation film 42 was washed off.

This produced the conventional bump 48A formed on each pad 41 on the wafer.

Those bumps formed by plating, evaporation and dipping are referred to as No. 1, No. 2 and No. 3 conventional bumps, respectively.

(Characteristics of the Solder Bumps Formed in EXAMPLES and Conventional Bumps)

The bumps of the present invention (Nos. 1 to 16 bumps) formed by a liquid spraying method (e.g., ink jetting method) and those formed by the conventional methods (Nos. 1 to 3 conventional bumps) were tested for outer appearances, cross-sectional conditions, mechanical strength, washability, and reliability for which the test was carried out for the IC chip cut off from the wafer 40 was actually assembled on a printed-wiring board.

Outer appearances of the solder bump were observed by a metaloscope (Nikon Corp.'s OPTIPHOT XUM-M®) at a magnification of 40.

It was also observed by a scanning electron microscope (hereinafter sometimes referred to as SEM, JOEL Ltd.'s SCANNING MICROSCOPE JSM-5300LU®) at a magnification of 1000 to 3000 for its outer appearances and cross-sectional conditions. The results are given in Table 15.

Shear strength and tensile strength of the bump were determined in the mechanical strength tests by a bump strength tester (Rhesca Co., Ltd.'s PULL TESTER TYPE PTR-01®) under the conditions of Y distance: 0.2 mm, speed: 0.1 mm/s to 1.0 mm/s, 0.1, and locationμ: 5.

In the shear strength test, a stress was applied to the bump at a predetermined point in the direction perpendicular to the wafer 40 thickness direction, to determine the strength at which the bump was torn off.

In the tensile strength test, a tensile stress was applied to the bump off the side 40A of the wafer 40, to determine the strength at which the bump came off from the pad 41 (for Nos. 1 to 16 bumps) or from the BLM film layer 46 (for the conventional bumps 48A). The results are given in Table 15.

The washability test was carried out only for the conventional bumps 48A formed by the conventional method, which uses a flux for forming the bump.

In the washability test, the passivation film 42 on the wafer 40 was observed, after the flux was washed off, whether the flux remained thereon (the remaining flux is hereinafter sometimes referred to as "residue").

The residue was observed by a metaloscope (Nikon Corp.'s OPTIPHOT XUM-M®) at a magnification of 40, and by an SEM (JOEL Ltd.'s SCANNING MICROSCOPE JSM-5300LU®) at a magnification of 1000 to 3000.

Three types of reliability tests were carried out, low temperature shock program and ion migration tests, and high-temperature reliability test in which the specimen was held at high temperature for a given time.

In the low temperature shock program test, the specimen was set in a low temperature shock program tester (ESPEC Corp.'s ESPEC THERMAL SHOCK CHAMBER TSB-2 or TSV-40ST®) to be subjected to atmosphere temperature cycles between −30° C. and 150° C., to observe whether the joint between the bump and pad 41 was cracked or not.

In the tester, the specimen was kept at around −30° C. for around 1 hour, heated to around 150° C. in around 30 minutes, at which it was held for around 1 hour, and then cooled to around −30° C. in around 30 minutes in one cycle lasting around 3 hours.

In the ion migration test, an ion migration analysis system (Kusumoto Chemicals, Ltd.'s SIR10®) was used, where an electrical field was applied to the adjacent bumps formed on each pad 41 in an IC chip under given high temperature and humidity conditions, to confirm whether or not a short circuit resulted between these bumps from the metallic ion releasing out on the cathode side.

In the high-temperature reliability test in which the specimen was held at high temperature, it was held at 120° C. and 210° C. in a constant-temperature, constant-humidity chamber (thermo-hygrostat by Advantest Corp.) to observe conditions of the BLM film layer 46 whether it was deteriorated by the mutual diffusion between the bump and film layer at each temperature level.

The results of these tests are described.

Table 15 gives the test results with Nos. 1 to 3 solder bumps of the present invention formed by a liquid spraying method (e.g., ink jetting method) and Nos. 1 to 3 conventional bumps formed by the conventional method. The results observed with Nos. 4 to 16 solder bumps of the present invention are similar to those with the Nos. 1 to 3 solder bumps.

As shown in Table 15, it was observed by the metaloscopic analysis that the conventional bumps had a blackened surface, and a number of irregularly shaped bumps and scattered bumps, which caused bridging, because the adjacent bumps 48A came into contact with each other.

Figure 9A:
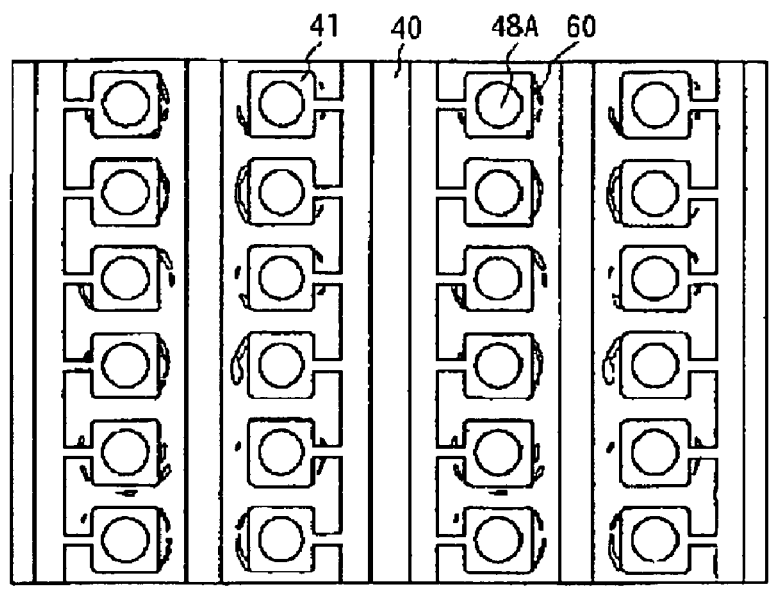
FIGS. 9A to 9C are schematic views illustrating the conventional bumps formed on wafer pads.
Figure 9B:
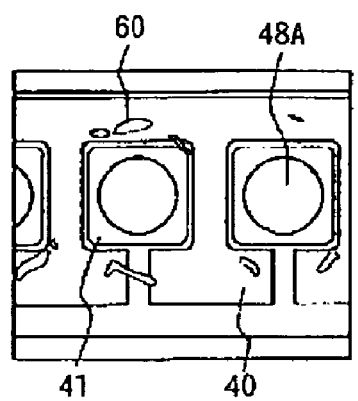
Figure 9C:
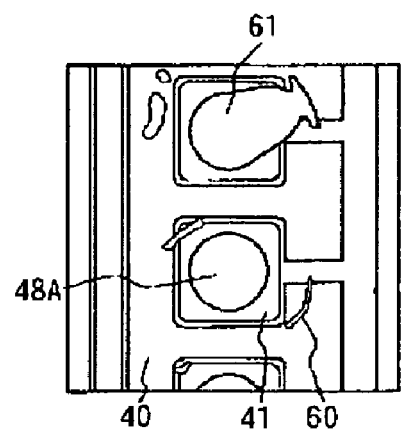

The conventional bumps are further described by referring to FIGS. 9A to 9C, FIGS. 9B and 9C being a magnified version of FIG. 9A. There were plurality of the scattered bumps 60 on the periphery of the conventional bump 48A formed on each pad 41 on the wafer 40, some coming into contact with each other to form the irregularly shaped bumps 61.

By contrast, Nos. 1 to 16 bumps of the present invention were glossy on the surface and ideally spherical, indicating that they are good both in surface characteristics and shape.

The cross-sectional SEM analysis observed that Nos. 1 to 3 conventional bumps 48A had a number of voids and cracks inside, and also a number of irregularly shaped bumps caused by these voids and cracks.

It also confirmed that the BLM film layer 46 on the pad 41 on the wafer 40 and the conventional bump 48A diffused to each other, to deteriorate the BLM film layer 46.

In other words, referring to FIGS. 11A to 11C, the conventional bump 48A of the bump material 48 formed on the BLM film layer 46 on the pad 41 on the wafer 40 (FIG. 11A) inherently becomes spherical, when heated and fused (FIG. 11B).

However, when the bump material 48 has a composition with unevenly distributed lead and tin, the voids 65, cracks 66, and scattered bumps 66 will result, because of uneven synthesis between lead and tin.

By contrast, each of Nos. 1 to 16 bumps of the present invention was free of inside voids 65 and cracks 66, and fast bonded to the pad 41 on the wafer 40.

Next, the strength test results are described.

In the shear test, Nos. 1 to 3 conventional bumps were torn off at a stress of around 5 kgf. By contrast, Nos. 1 to 16 bumps of the present invention were not torn off until the stress was increased to around 10 kgf, not at a stress of around 5 kgf.

In the tensile test, on the other hand, Nos. 1 to 3 conventional bumps were separated from the BLM film layer at a stress of around 500 kgf, whereas Nos. 1 to 16 bumps of the present invention were not separated from the pad (41) until the stress was increased to around 1600 kgf.

It is specified that a bump passes the standard when it is torn off in the shear test at a stress of 8 kgf or more, and fails to pass the standard when it is torn off at a stress below 8 kgf.

TABLE 15

| | No. 1 Bump | No. 2 Bump | No. 3 Bump | No. 4 Bump | No. 1 Comparative bump | No. 2 Comparative bump | No. 3 Comparative bump |
|---|---|---|---|---|---|---|---|
| Microscopic analysis (outer appearances) | Good in gloss, surface characteristics and shape, Ideally spherical | The same as the left | The same as the left | The same as the left | Blackened surface, and a number of irregularly shaped bumps, scattered bumps and bridged bumps observed | The same as the left | The same as the left |
| SEM analysis (outer appearances and cross-sectional conditions) | Good adhesion between the pad and bump | The same as the left | The same as the left | The same as the left | A number of voids, cracks and irregularly shaped bumps observed, Significant diffusion of the BLM film layer | The same as the left | The same as the left |
| Shear test (Strength) | 10 kgf OK | The same as the left | The same as the left | The same as the left | 5 kgf No Good | The same as the left | The same as the left |
| Tensile test | 1600 kgf OK | The same as the left | The same as the left | The same as the left | 500 kgf No Good | The same as the left | The same as the left |
| Washability test | / | / | / | / | Black and white residues observed | The same as the left | The same as the left |
| Low-temperature shock program test −30 to 150° C. | OK in 1000 cycles (passing the specified level) | The same as the left | The same as the left | The same as the left | No Good in 500 cycles | The same as the left | The same as the left |
| Ionmigration test | OK in 1000 hours (passing the specified level) | The same as the left | The same as the left | The same as the left | No Good in 500 hours | The same as the left | The same as the left |
| High-temperature reliability test | OK in 1000 hours both at 120 and 210° C. (passing the specified level) | The same as the left | The same as the left | The same as the left | No Good in 500 hours at 120° C. NG in 100 hours at 210° C. | The same as the left | The same as the left |

It is also specified that a bump passes the standard when it is separated from the BLM film layer 46 or pad 41 in the tensile test at a stress of 1200 kgf or more, and fails to pass the standard when it is separated at a stress below 1200 kgf.

Therefore, Nos. 1 to 3 conventional bumps failed to pass the standard both in the shear test and tensile test, whereas Nos. 1 to 16 bumps of the present invention passed the standard both in the shear test and tensile test.

Nos. 17 to 20 bumps of the present invention were shear- and tensile-tested on the assumption that shear standard was 8 kgf and tensile standard was 1200 kgf for a 20 μm-diameter bump. The results are given in Table 16.

TABLE 16

| | Bump No. | | | |
|---|---|---|---|---|
| | #17 | #18 | #19 | #20 |
| Bump diameter | 5 μm | 3 μm | 1 μm | 0.5 μm |
| Shear strength | 2.5 kg | 1.5 kg | 0.5 kg | 0.25 kg |
| Assumed standard | >2 kg | >1.2 kg | >0.4 kg | >0.2 kg |
| Tensile strength | 400 kg | 240 kg | 80 kg | 40 kg |
| Assumed standard | >300 kg | >180 kg | >60 kg | >30 kg |

Nos. 17 to 20 bumps also showed good results for other tests than shear and tensile tests, similarly to Nos. 1 to 16 bumps.

In the washability test, Nos. 1 to 3 conventional bumps had a flux residue scorched black under heating/fusing (hereinafter referred to as black residue) around themselves and, at the same time, a white residue of organic lead and tin, conceivably resulting from the reactions of lead and tin in the bump material 48 with an organic acid-based compound in the flux.

Figure 12:
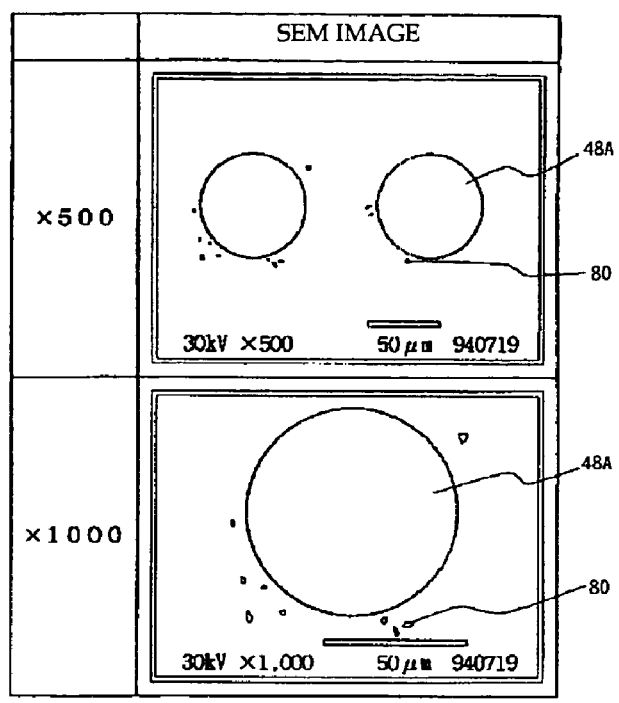
FIG. 12 illustrates a flux residue formed by the conventional process.
Figure 13:
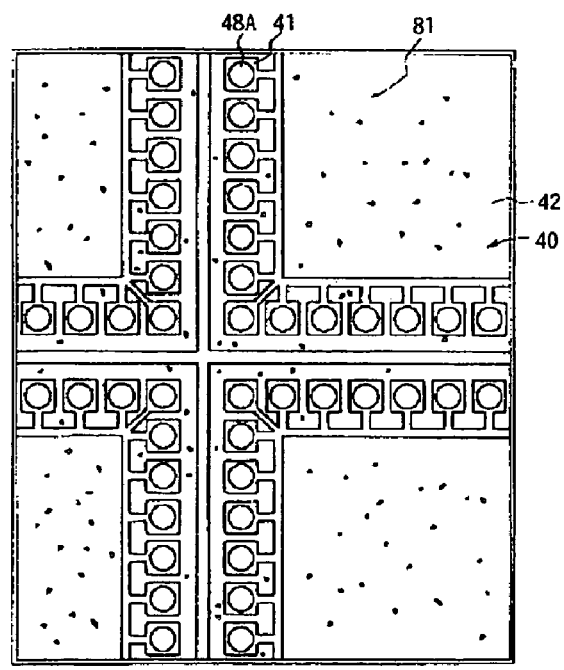
FIG. 13 illustrates a white residue formed on a passivation film by the conventional process.
Figure 14A:
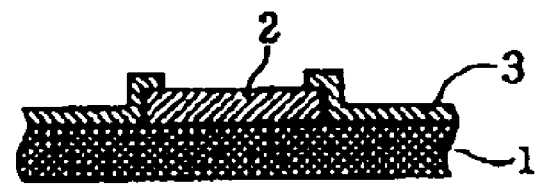
FIGS. 14A to 14D illustrate formation of a solder bump.
Figure 14B:
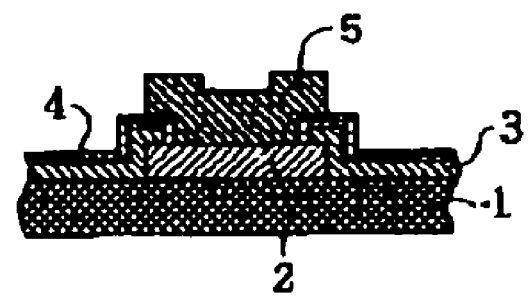
Figure 14C:
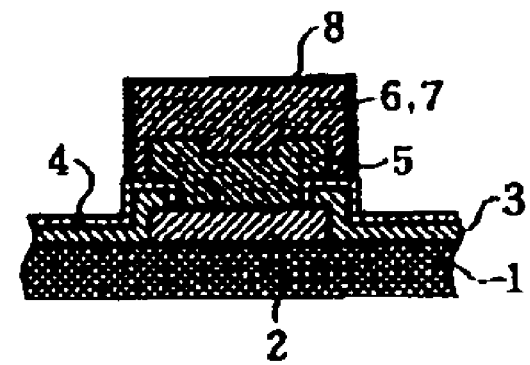
Figure 14D:
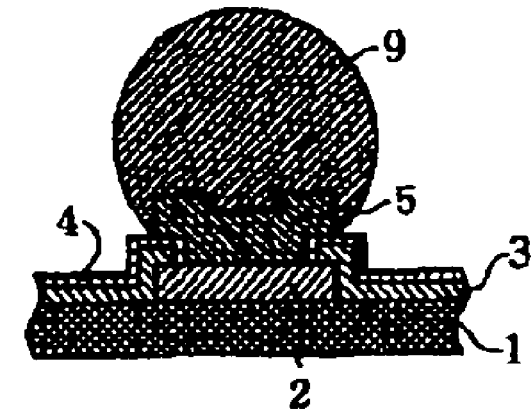

More specifically, referring to FIGS. 12, 13 and 15, Nos. 1 to 3 conventional bumps had a number of the black residue 80 around themselves (FIG. 12) and, at the same time, a number of the white residue 81 on the passivation film 42 on the wafer 40 (FIG. 13), and these black residue 80 and white residue 81 could not be washed out and remained on the wafer 40.

In the low temperature shock program test as one of the reliability tests, Nos. 1 to 3 conventional bumps were cracked in the joint with the BLM film layer 46 at about 500 cycles.

By contrast, Nos. 1 to 16 bumps of the present invention were not cracked in the joint with the intermediate metallic or electroconductive, adhesive layer at 1000 cycles, which is the predetermined standard, confirming that the bump fast bonded to the intermediate metallic or electroconductive, adhesive layer.

In the ion migration test as one of the reliability tests, Nos. 1 to 3 conventional bumps had a short circuit between the adjacent bumps in around 500 hours after the test was started.

By contrast, Nos. 1 to 16 bumps of the present invention showed no short circuit between the adjacent bumps in 1000 hours as the predetermined standard after the test was started, keeping the original conditions on each pad 41 on the wafer 40.

In the high-temperature reliability test as one of the reliability tests, Nos. 1 to 3 conventional bumps had the BLM film layer 46 deteriorated as a result of diffusion of the bump and layer to each other in around 500 hours after the test was started at around 120° C.

Therefore, it was difficult for the BLM film layer 46 in Nos. 1 to 3 conventional bumps to be fast bonded to the pad 41 on the wafer 40 at a predetermined strength. In the test carried out at around 210° C., on the other hand, Nos. 1 to 3 conventional bumps and BLM film layer 46 similarly diffused to each other in around 100 hours after the test was started.

Therefore, it was difficult for the BLM film layer 46 in Nos. 1 to 3 conventional bumps to be fast bonded to the pad 41 on the wafer 40 at a predetermined strength also in this test.

By contrast, Nos. 1 to 16 bumps of the present invention showed no diffusion of the bump and BLM film layer 46 to each other in 1000 hours after the test was started both at 120° C. and 210° C., with the result that each bump was fast bonded to the pad 41 on the wafer 40.

Table 17 compares the bump forming method of the present invention with the conventional method. They are described in more detail later.

TABLE 17

| Items | Bump forming method used in EXAMPLES | Conventional bump forming method |
|---|---|---|
| Waste solution treatment | The system is very simple, or not required. | Required |
| Bump forming process | Simple | Various steps are required, each step consuming time |
| Uniformity of bumps formed | Almost uniform, showing little distribution | Significantly distributed both in height and shape |
| Yield | High (almost 100%) | 90% at the highest |
| Economic efficiency | All of the formed bumps are usable | Materials are mostly discarded, and used for the final BLM film layer and bumps to only 1% or less. |
| Adhesion to pad | Excellent | Bumps may sometimes come off from the pad |

The conventional bump forming method needs waste solution treatment. It is essential, because a large quantity of the waste solution is discharged also from the flux washing-out step subsequent to the bump material heating/fusing step.

By contrast, the bump forming method of the present invention needs a waste solution treatment system of simple structure, because quantity of the make-up flux is limited to the level discharged from the ink jetting step. The system may be even eliminated. As a result, the bump forming process can be simplified.

The conventional bump forming method needs the BLM film layer forming and bump material forming step, the former needing the photoresist film 47 forming step and the latter photoresist film 47 releasing step, which should make the conventional method complex and highly time-consuming.

By contrast, the bump forming method of the present invention is more simply structured, because the above steps can be eliminated.

For uniformity of the bump formed on the pad on the wafer, the conventional bump forming method may sometimes cause distributions of lead and tin in the bump material 48 formed on the BLM film layer 46.

The distributed composition can lead to distributions in height and shape in the bump 48A formed on the pad 41 on the wafer 40.

By contrast, the present invention adopts an ink jetting method which can discharge the ink at a uniformly controlled rate and hence form the bump accurate both in shape and size, with the result that the bump formed on each pad on the wafer is almost uniform both in shape and size.

For bump yield, the conventional bump forming method forms the bump 48A on the pad 41 on the wafer 40, which has not only distributed height and size but also voids and cracks inside, with the result that it can secure a yield of 90% at the highest. By contrast, the bump forming method of the present invention can secure a high yield of almost 100%, because the liquid spraying method (e.g., ink jetting method) it adopts discharges the ink at a uniform rate to form the bump of accurate size.

For economic efficiency for forming the bumps, the conventional bump forming method involves the BLM film layer forming step and photoresist film 47 separation step in the bump material forming steps, where at least 99% by mass of the materials for the BLM film layer 46 formed on the side 40A of the wafer 40 and bump material 48 are removed, leaving behind the BLM film layer 46 and bump material 48 composed of the remaining materials. This should increase the cost.

By contrast, the bump forming method of the present invention adopts the liquid spraying method (e.g., ink jetting method) which discharges the ink at a very low rate, the discharged materials being totally used for forming the bumps. This should greatly improve economic efficiency from that associated with the conventional method.

For adhesion of the bump to the pad 41 on the wafer 40, the BLM film layer 46 (of Cr or Cu) and conventional bump 48A (of Pb and Sn) formed by the conventional method diffuse to each other depending on environmental conditions, e.g., temperature and humidity, to deteriorate the BLM film layer 46 in a short time, even cause the conventional bump 48A to come off from the BLM film layer 46.

By contrast, the bump forming method of the present invention forms the electroconductive, adhesive layer and bump (of Pb and Sn) not diffusing to each other, allowing the bump to be fast bonded to the pad 41 via the electroconductive, adhesive layer for a much longer time than the conventional bump forming method, because the service period is determined only by deterioration of the electroconductive, adhesive layer.

The bump forming method of the present invention needs neither a BLM film layer forming step nor bump material forming step, which should simplify the bump forming step.

The bump forming method of the present invention adopts the liquid spraying method (e.g., ink jetting method) which discharges the ink at a more uniform rate than the conventional bump forming method to form the bumps of uniform size, preventing bridging of the bumps resulting from the bumps of uneven height or size, voids 65 and cracks 66 in the bumps, irregularly shaped bumps and scattered bumps, found in the bumps formed by the conventional bump forming method.

In other words, the bump forming method of the present invention forms the bump of uniform properties (e.g., surface characteristics, shape and composition) on the pad 41, thereby improving bump yield.

Moreover, the bump forming method described in each EXAMPLE dispenses with a step of releasing the photoresist film 47, unlike the conventional bump forming method, which should reduce the cost for forming the bump on each pad 41 on the wafer 40 and greatly improve economic efficiency for bump forming.

Still more, the bump forming method of the present invention forms the bump on each pad 41 on the wafer 40 via an electroconductive, adhesive layer, which should greatly improve adhesion of the bump to each pad 41.

Still more, no diffusion occurs between the electroconductive, adhesive layer and bump, to keep the bump adhesive to the pad 41 for a much longer time.

The bump formed on each pad 41 on the wafer 40 by the bump forming method of the present invention is much more reliable than the one formed by the conventional bump forming method, as confirmed by the reliability tests, e.g., low temperature shock program, thermal shock, ion migration and high-temperature reliability tests.

In the semiconductor device with the bump formed by the bump forming method of the present invention on each pad 41 on the wafer 40, the bump can be easily bonded to the pad 41 via the electroconductive, adhesive layer fast bonded to the bump and pad 41.

Adhesive strength of the each bump to each pad 41 can be kept for a much longer time.

As discussed above, the bump forming method of the present invention can greatly reduce the working time for production of semiconductor devices, because the formed bump can be easily bonded to the corresponding pad 41 via the electroconductive, adhesive layer fast bonded to the bump and pad 41.

EXAMPLES describe the wafer 40 carrying ICs of IC chips as the object on which the bumps are to be formed. The objects for the present invention are not limited to the above wafer, but include a wafer carrying circuits of large scale IC (LSI) chips, ball grid array (BGA) and chip size package (CSP), among others.

EXAMPLES also describe the electroconductive, adhesive layer formed by an ink jetting method. The methods for forming the electroconductive, adhesive layer are not limited to the above. For example, the bump may be formed by an ink jetting method on the electroconductive, adhesive layer 46 formed by metal-masked printing, screen printing or the like on each pad 41 on the wafer 40.

(Advantages of the Flux Material Layer Composition of the Present Invention)

It is confirmed that each of the flux material layer compositions 14 to 21 can be smoothly discharged in a liquid spraying method (e.g., ink jetting method) for forming solder bumps, and are suitable for ink jetting, by including a rosin, activator, solvent, polyol, glycol ether, surfactant and wetting agent in the ink composition, and is applicable for forming a pattern on a wafer.

It is also confirmed that the method of the present invention can form the very fine bumps, believed to be impossible for the conventional method to produce, 30 μm in diameter or less, needless to say, 10 μm or less, even 1 μm or less.

It is also confirmed that the bump of the present invention has good characteristics: Nos. 1 to 20 bumps have a uniform fused composition of lead and tin, and smooth, glossy surfaces, free of missing or other defects to cause irregularly shaped or scattered bumps.

It is also confirmed that the flux material layer compositions 14 to 21 can give the almost ideally spherical solder bumps, e.g., Nos. 1 to 20 solder bumps.

It is also confirmed that the flux material layer compositions 14 to 21 can give the solder bumps free of voids or cracks inside, e.g., Nos. 1 to 20 solder bumps, which are unreactive with the intermediate metallic layer to improve adhesion. Therefore, Nos. 1 to 20 solder bumps are confirmed to have improved shear and tensile strength.

It is also confirmed that, when the flux material layer composition is incorporated with (i) an organic acid-based activator decomposed/sublimated at 100° C. to 300° C. to remove an oxide film from the solder alloy material surface, improve soldering characteristics and improve surface characteristics (e.g., by imparting surface gloss) while forming no residue at a content of 0.01% by mass to 10% by mass based on the composition, in combination with (ii) a halogen compound-based activator decomposed/activated at 350° C. to 400° C. to remove voids present in the bump, prevent scattering of the solder alloy and uniformly fuse the solder alloy material at a content of 0.01% by mass to 10% by mass based on the composition, the resulting solder bump (e.g., each of Nos. 1 to 20 bumps) has the organic acid-based activator and halogen compound-based activator smoothly helping form the solder bump while sufficiently satisfying the expected functions, the former exhibiting the effects for the bump surface characteristics and shape in the preheating step carried out at 100° C. to 300° C., and the latter exhibiting the effect for solder bump forming in the main heating step.

It is also confirmed that that the resulting solder bump has greatly improved characteristics, because it is bonded to the intermediate metallic layer at a sufficiently high adhesive strength, and has a sufficient shear strength and, after being assembled in a device, a sufficient tensile strength.

It is also confirmed that, when the flux material layer composition is incorporated with (iii) an organic acid-based activator decomposed/sublimated at 100° C. to 300° C. to remove an oxide film from the solder alloy material surface, improve soldering characteristics and improve surface characteristics (e.g., by imparting surface gloss) while forming no residue, in combination with (iv) a surfactant decomposed/activated at 100° C. to 300° C. and at 350° C. to 400° C. to remove an oxide film from the solder alloy material surface, improve soldering characteristics and improve surface characteristics (e.g., by imparting surface gloss), remove voids present in the bump, prevent scattering of the solder alloy or uniformly fuse the solder alloy material, the resulting solder bump (e.g., each of Nos. 1 to 20 bumps) has the organic acid-based activator and surfactant smoothly helping form the solder bump while sufficiently satisfying the expected functions over the preheating step carried out at 100° C. to 300° C. and main heating step carried out at 350° C. to 400° C., the former exhibiting the effects for the bump surface characteristics and shape in the preheating step and the latter exhibiting the effect for solder bump forming in the main heating step.

It is also confirmed that the solder bumps formed in EXAMPLES have greatly improved characteristics, because it is bonded to the intermediate metallic layer at a sufficiently high adhesive strength, and has a sufficient shear strength and, after being assembled in a device, a sufficient tensile strength.

It is also confirmed that use of one of the flux material layer compositions prepared in EXAMPLES 14 to 21 can greatly improve productivity.

It is also confirmed that each of the flux material layer compositions 14 to 21 (the flux compositions of EXAMPLES 14 to 21, respectively) can greatly improve heat resistance of rosin in the main heating step in the wet back treatment, when incorporated with a resin, to prevent scorching of the rosin, and the natural rosin improves film-making characteristics of the coating film to be formed on the solder bump.

Moreover, each of the flux material layer compositions 14 to 21 containing a resin to prevent scorching of the rosin can improves washability of the corresponding Nos. 1 to 20 solder bumps, leaving no flux residue.

It is also confirmed that each of Nos. 1 to 20 solder bumps formed using the relevant flux material layer composition selected from the compositions 14 to 21 can have improved quality reliability after it is assembled in a printed-wiring board via the semiconductor chip in which it is used.

It is also confirmed that each of the flux material layer compositions 14 to 21, when incorporated with an organic acid-based and halogen compound as activators, or an organic acid-based compound and activator, the former being activated in the preheating step and the latter in the main heating step, can have improved dispersibility of these activators and thereby to enhance activation efficiency, because these activators can be activated over a wide range of the preheating and main heating steps.

It is also confirmed that each of the flux material layer compositions 14 to 21 can improve drying characteristics of the solvent for the wet back treatment, when the solvent having a boiling point of around 150° C. to 300° C., preferably around 220° C. to 250° C., is used.

As discussed above, a flux material layer composition useful under high temperature conditions, such as those used for the wet back treatment, can be realized, when the flux therefor is composed of a natural and hydrogenated rosin, resin incorporated in the rosin at around 1% by mass to 99% by mass based on the natural and hydrogenated rosin totaled, mixture of an organic acid-based compound and halogen compound as the activator, and solvent having a boiling point of around 150° C. to 300° C., preferably around 220° C. to 250° C.

A resin was used as the solute to be incorporated in rosin at around 1% by mass to 99% by mass based on natural and hydrogenated rosin totaled in above EXAMPLES. However, the solute useful for the present invention is not limited to the above, and can be selected from various ones so long as it can improve heat resistance of natural and hydrogenated rosin, and is soluble in the solvent.

A flux ink was used for making the solder bump spherical by the wet back treatment in above EXAMPLES. However, the present invention is not limited to the above, and is applicable to various processes or the like which handle solder under other high temperature conditions.

EXAMPLES 22 TO 29

Preparation of Electroconductive, Adhesive Compositions

The following metallic nano-particle pastes, stably dispersed with the particles of several nanometers in size, were used as the ink compositions.

In EXAMPLES, the following fine electroconductive materials were used:
(1) Fine gold particles: Average particle size: 6 nm (Tamura Kaken Corp.)
(2) Fine silver particles: Average particle size: 5 nm (Tamura Kaken Corp.)
(3) Fine copper particles: Average particle size: 8 nm (Tamura Kaken Corp.)
(4) Fine In particles: Average particle size: 5 nm (Alpha Metals of Japan Ltd.)
(5) Fine electroconductive carbon particles: Average particle size: 5 nm (Kao Corp.)
(6) Electroconductive resin: Average particle size: 7 nm (Lion Corp.)
(7) Anisotropic electroconductive resin: Average particle size: 8 nm (Sony Chemical Corp.)
(8) Anisotropic electroconductive resin: Average particle size: 5 nm (Sony Chemical Corp.)

EXAMPLE 22

Preparation of Electroconductive, Adhesive Compositions

A stainless pressure vessel (inner volume: 5 l), equipped with a jacket for warm water and stirrer inside, was charged with 5 g (as the solid) of the fine gold particles having an average particle size of 6 nm (Tamura Kaken Corp.), into which carbon dioxide gas was blown under pressure.

The vessel was heated and kept under a critical condition (50±1° C. and 200±5 atms.) inside for 5 minutes to dissolve the pigment.

Then, the vessel was further charged with 2 g of a 25% aqueous solution of the surfactant and 35 ml of 1,3-dimethyl-2-imidazolidinone, and carbon dioxide was released from the stainless pressure vessel, to separate the electroconductive material and prepare the dispersion 1.

All of the other composition components described below were well mixed with 42 g of the resulting dispersion 1 under stirring, and filtered by a 0.5 µm filter, to prepare the ink composition 1. Solid content and vapor pressure of composition 1 were 10% by mass and 0.08 mmHg (at room temperature), respectively.

Table 18 gives the dispersed condition of the dispersion, filter conditions and characteristics of the ink composition 1.

Electroconductive material: Fine gold particles having an average particle size: 6 nm (Tamura Kaken Corp.), 5% by mass
Dispersant: styrene/acryl resin, 5% by mass
Activator: (II-2), 2% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 24% by mass

EXAMPLE 23

Preparation of Electroconductive, Adhesive Composition

The dispersion 2 and ink composition 2 were prepared in the same manner as in EXAMPLE 22, except that the fine silver particles having an average particle size of 5 nm (Tamura Kaken Corp.) was used.

Table 18 gives the dispersed condition of the dispersion 2, filter conditions and characteristics of the ink composition 2. Solid content and vapor pressure of composition 2 were 10% by mass and 0.09 mmHg (at room temperature), respectively.

Electroconductive material: Fine silver particles having an average particle size: 5 nm (Tamura Kaken Corp.), 5% by mass
Dispersant: styrene/acryl resin, 5% by mass
Activator: (II-3), 1% by mass
Activator: (III-1), 1.2% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 23.8% by mass

EXAMPLE 24

Preparation of Electroconductive, Adhesive Composition

The dispersion 3 and ink composition 3 were prepared in the same manner as in EXAMPLE 22, except that the fine copper particles having an average particle size of 8 nm (Tamura Kaken Corp.) was used. Table 18 gives the dispersed condition of the dispersion 3, filter conditions and characteristics of the ink composition 3. Solid content and vapor pressure of composition 3 were 10% by mass and 0.1 mmHg (at room temperature), respectively.

Electroconductive material: Fine copper particles having an average particle size: 8 nm (Tamura Kaken Corp.), 5% by mass
Dispersant: styrene/acryl resin, 5% by mass
Activator: (II-2), 1% by mass
Activator: (IV), R: $C_9H_{19}$, "k": 12, 1% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 24% by mass

EXAMPLE 25

Preparation of Electroconductive, Adhesive Composition

The dispersion 4 and ink composition 4 were prepared in the same manner as in EXAMPLE 22, except that the fine In particles having an average particle size of 5 nm (Alpha Metals of Japan Ltd.) was used. Table 18 gives the dispersed condition of the dispersion 4, filter conditions and characteristics of the ink composition 4. Solid content and vapor pressure of composition 4 were 10% by mass and 0.08 mmHg (at room temperature), respectively.

Electroconductive material: Fine In particles having an average particle size: 5 nm (Alpha Metals of Japan Ltd.), 5% by mass
Dispersant: styrene/acryl resin, 5% by mass
Activator: (II-4), 1% by mass
Activator: (V), "p" and "q": 20, 0.8% by mass
Wetting agent: Glycerol, 18% by mass
Solvent: 1,3-Dimethyl-2-imidazolidinone, 35% by mass
Solvent: N-methyl-2-pyrrolidone, 11% by mass
Solvent: 1,4-Butanediol, 24.2% by mass

EXAMPLE 26

Preparation of Electroconductive, Adhesive Composition

The dispersion 5 was prepared in the same manner as in EXAMPLE 22, except that the fine electroconductive carbon particles having an average particle size of 5 nm (Kao Corp.) was used, and that the pressure vessel was charged 200 ml of toluene at normal temperature and pressure in place of carbon dioxide blown under pressure, kept at 50° C. inside for 5 minutes while the pressure level was unchanged at normal pressure to dissolve the fine electroconductive material, further charged with 2 g of a 25% aqueous solution of the surfactant as the ink composition component, described below, and 35 g of 1,3-dimethyl-2-imidazolidinone, and treated to remove toluene by evaporation, to separate the electroconductive material and prepare the dispersion 5.

All of the other ink composition components described below were well mixed with 42 g of the resulting dispersion 4 under stirring, and filtered by a 0.51 μm filter, to prepare the ink composition 5. Table 18 gives the dispersed condition of the dispersion 5, filter conditions and characteristics of the ink composition 5. Solid content and vapor pressure of composition 5 were 10% by mass and 0.08 mmHg (at room temperature), respectively.

Electroconductive material: Fine electroconductive carbon particles having an average particle size of 5 nm (Kao Corp.), 5% by mass
    Dispersant: styrene/acryl resin, 5% by mass
    Activator: (I-5), 0.4% by mass
    Activator: (IV), R: $C_{10}H_{21}$, "K": 7, 1% by mass
    Wetting agent: Glycerol, 18% by mass
    Solvent: 1,3-Dimethyl-2-imidazolidinone, 35% by mass
    Solvent: N-methyl-2-pyrrolidone, 11% by mass
    Solvent: 1,4-Butanediol, 24.6% by mass

EXAMPLE 27

Preparation of Electroconductive, Adhesive Composition

The dispersion 6 and ink composition 6 were prepared in the same manner as in EXAMPLE 26, except that the electroconductive resin having an average particle size of 7 nm (Lion Corp.) was used. Table 18 gives the dispersed condition of the dispersion 6, filter conditions and characteristics of the ink composition 6. Solid content and vapor pressure of composition 6 were 10% by mass and 0.09 mmHg (at room temperature), respectively.

Electroconductive material: Electroconductive resin having an average particle size of 7 nm (Lion Corp.), 5% by mass
    Dispersant: styrene/acryl resin, 5% by mass
    Activator: (II-1), 0.3% by mass
    Activator: (V), "p"+"q"=15, 0.5% by mass
    Activator: Activator (V), "p"+"q"=0, 0.5% by mass
    Wetting agent: Glycerol, 18% by mass
    Solvent: 1,3-Dimethyl-2-imidazolidinone, 35% by mass
    Solvent: N-methyl-2-pyrrolidone, 11% by mass
    Solvent: 1,4-Butanediol, 24.7% by mass

EXAMPLE 28

Preparation of Electroconductive, Adhesive Composition

The dispersion 7 and ink composition 7 were prepared in the same manner as in EXAMPLE 265, except that the anisotropic electroconductive resin having an average particle size of 8 nm (Sony Chemical Corp.) was used. Table 18 gives the dispersed condition of the dispersion 7, filter conditions and characteristics of the ink composition 7. Solid content and vapor pressure of composition 7 were 10% by mass and 0.1 mmHg (at room temperature), respectively.

Electroconductive material: Anisotropic electroconductive resin having an average particle size of 8 nm (Sony Chemical Corp.), 5% by mass
    Dispersant: styrene/acryl resin, 5% by mass
    Activator: (II-4), 0.6% by mass
    Activator: (V), "p" and "q": 20, 0.4% by mass
    Wetting agent: Glycerol, 18% by mass
    Solvent: 1,3-Dimethyl-2-imidazolidinone, 35% by mass
    Solvent: N-methyl-2-pyrrolidone, 11% by mass
    Solvent: 1,4-Butanediol, 25% by mass

EXAMPLE 29

Preparation of Electroconductive, Adhesive Composition

The dispersion 8 and ink composition 8 were prepared in the same manner as in EXAMPLE 26, except that the anisotropic electroconductive resin having an average particle size of 5 nm (Sony Chemical Corp.) was used. Table 18 gives the dispersed condition of the dispersion 8, filter conditions and characteristics of the ink composition 8. Solid content and vapor pressure of composition 8 were 10% by mass and 0.09 mmHg (at room temperature), respectively.

Electroconductive material: Anisotropic electroconductive resin having an average particle size of 5 nm (Sony Chemical Corp.), 5% by mass
    Dispersant: styrene/acryl resin, 5% by mass
    Activator: (V), "p"+"q"=15, 1% by mass
    Activator: (IV), R: $C_{10}H_{21}$, "K": 7, 1.5% by mass
    Wetting agent: Glycerol, 18% by mass
    Solvent: 1,3-Dimethyl-2-imidazolidinone, 35% by mass
    Solvent: N-methyl-2-pyrrolidone, 11% by mass
    Solvent: 1,4-Butanediol, 23.5% by mass Table 18 gives the dispersed condition of the dispersions and properties of the electroconductive, adhesive compositions, prepared in EXAMPLES 22 to 29.

TABLE 18

| | Fine particles (Average diameter) | Conditions of the dispersions 1 to 8 | Filter conditions | Characteristics of the ink compositions 1 to 8 |
|---|---|---|---|---|
| Example 22 | Gold (6 nm) | Uniform | Essentially not clogged | Usable |
| Example 23 | Silver (5 nm) | Uniform | Not clogged | Usable |
| Example 24 | Copper (8 nm) | Uniform | Not clogged | Usable |
| Example 25 | In (5 nm) | Uniform | Not clogged | Usable |
| Example 26 | Electroconductive carbon (5 nm) | Uniform | Not clogged | Usable |

TABLE 18-continued

|  | Fine particles (Average diameter) | Conditions of the dispersions 1 to 8 | Filter conditions | Characteristics of the ink compositions 1 to 8 |
|---|---|---|---|---|
| Example 27 | Electroconductive resin (7 nm) | Uniform | Not clogged | Usable |
| Example 28 | Anisotropic, electroconductive resin (8 nm) | Uniform | Not clogged | Usable |
| Example 29 | Anisotropic, electroconductive resin (8 nm) | Uniform | Not clogged | Usable |

(Property Evaluation of the Electroconductive, Adhesive Compositions)

Table 19 gives the evaluation results of the electroconductive, adhesive compositions prepared in EXAMPLES 22 to 29 for viscosity, surface tension, contact angle with a material which constituted the ink discharge nozzle face in the ink jetting head, dischargeability, and patterning and film-making characteristics. The physical properties and dischargeability of the ink compositions were evaluated by the following procedures:

(1) Viscosity: Measured at 20° C. by an E type viscometer
(2) Surface tension: Measured also at 20° C. by the plate method
(3) Contact angle: Measured as static contact angle with a material which constituted the ink discharge nozzle face in the ink jetting head (water-repelling layer plated with a Ni-tetrafluoroethylene eutectoid)
(4) Dischargeability: Measured using an ink jetting printer head (Ricoh Co., IPSIO Jet 300). Extent of curved travel of the ink droplets was measured as scatter of the points at which the droplets were placed on the substrate, 0.6 mm apart from the head. Frequency of nozzle pore clogging was measured as time elapsing until the nozzle pore was clogged to be unable to discharge the ink composition, continuously discharged at a frequency of 7,200 Hz.
(5) Patterning and film-making characteristics: As shown in FIG. 18F, the periphery around each of the pads 11 of aluminum or the like, formed on one side 10A of the wafer 10, was covered with the passivation film 12, to electrically protect the side 10A of the wafer 10.

Then, the ink composition (4 pl) containing fine solder particles was discharged from the ink jet head of the ink jetting printer onto the pad shown in FIG. 18F. The resulting film, thermally treated in air at 100° C. for 10 minutes after the solvent was removed therefrom at room temperature under a vacuum, was microscopically observed for its properties (extent of agglomeration, flatness and so on). The pad has openings, 20 μm in diameter.

Figure 22A:
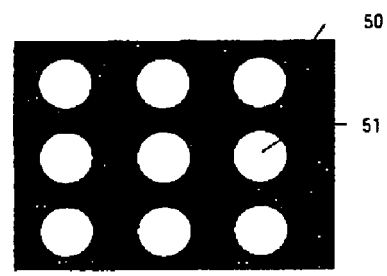
FIGS. 22A and 22B outline a test cell used in EXAMPLE for evaluating patterning and film-making characteristics of an ink composition, wherein pad or the like is not shown.
Figure 22B:
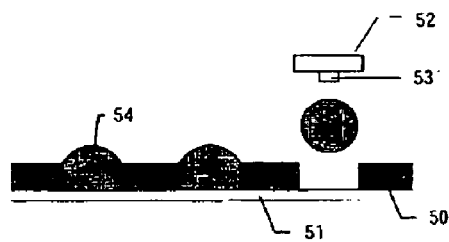

FIGS. 22A and 22B illustrate patterning.

As shown in Table 19, these compositions are sufficiently practical with respect to dischargeability, and patterning and film-making characteristics.

TABLE 19

|  | Viscosity (mPa · s) | Surface tension (mN/m) | Contact angle (°) | Clogging frequency (sec) | Travel scatter (μm) | Patterning characteristics | Film-making characteristics |
|---|---|---|---|---|---|---|---|
| Example 22 | 9.51 | 42.6 | 38.5 | >1000 | ±20 | Good | Good |
| Example 23 | 8.72 | 41.9 | 44.9 | >1000 | ±25 | Good | Good |
| Example 24 | 8.95 | 42.5 | 38.4 | >1000 | ±25 | Good | Good |
| Example 25 | 8.51 | 44.2 | 34 | >1000 | ±20 | Good | Good |
| Example 26 | 8.08 | 40.9 | 31 | >1000 | ±20 | Good | Good |
| Example 27 | 9.12 | 42.1 | 48.5 | >1000 | ±20 | Good | Good |
| Example 28 | 8.34 | 45.4 | 34.9 | >1000 | ±25 | Good | Good |
| Example 29 | 8.28 | 48.3 | 35.2 | >1000 | ±25 | Good | Good |

(Formation of Bumps by the Transfer Method)

The solder bump transferring sheets were prepared using the electroconductive, adhesive compositions in EXAMPLES 22 to 29 by the combinations given below.

First, an electroconductive, adhesive layer (electrode section) was formed on an aluminum pad (not shown) on a wafer which carried IC chips (not shown). The electroconductive, adhesive layer was to facilitate bonding of a solder ball. It was formed by patterning with the electroconductive, adhesive layer forming ink composition prepared in one of EXAMPLES 22 to 29, where the ink composition (1 pl) was discharged/laminated on the pad having pores of 20 μm in diameter by an ink jetting printer (Ricoh Co.'s IPSIO Jet 300) at varying head driving voltage, frequency and pulse width. Then, it was treated at room temperature under a vacuum (1 torr) for 20 minutes to remove the solvent. The cycle of the ink composition discharging and solvent removal was repeated until the film thickness reached 2 μm. It was then thermally treated on a hot plate at 150° C. for 2 hours in a nitrogen atmosphere, to form the electroconductive, adhesive layer.

The electroconductive, adhesive layer forming ink composition was spread on the solder ball in a similar manner, and the cycle of the ink composition discharging and solvent removal was repeated until the film thickness reached 2 μm.

It was then thermally treated on a hot plate at 150° C. for 2 hours in a nitrogen atmosphere, to form the electroconductive, adhesive layer.

The electroconductive, adhesive compositions given below correspond to the electroconductive, adhesive layer forming ink compositions prepared in EXAMPLES 22 to 29.

TABLE 20

| Bump No. | Bump transferring sheet No. | Electroconductive, adhesive layer forming ink composition | Electroconductive, adhesive layer forming side |
| --- | --- | --- | --- |
| #1 | #1 | Example 22 | Pad side |
| #2 | #2 | Example 23 | Pad side |
| #3 | #3 | Example 24 | Pad side |
| #4 | #4 | Example 25 | Pad side |
| #5 | #1 | Example 26 | Pad side |
| #6 | #2 | Example 27 | Pad side |
| #7 | #3 | Example 28 | Pad side |
| #8 | #4 | Example 29 | Pad side |

TABLE 21

| Bump No. | Bump transferring sheet No. | Electroconductive, adhesive layer forming ink composition | Electroconductive, adhesive layer forming side |
| --- | --- | --- | --- |
| #9 | #1 | Example 22 | Pad side |
| #10 | #2 | Example 23 | Pad side |
| #11 | #3 | Example 24 | Pad side |
| #12 | #4 | Example 25 | Pad side |
| #13 | #1 | Example 26 | Pad side |
| #14 | #2 | Example 27 | Pad side |
| #15 | #3 | Example 28 | Pad side |
| #16 | #4 | Example 29 | Pad side |

(Formation of Solder Bumps by the Conventional Method)

The bump forming method used in EXAMPLES is compared with the conventional solder bump forming method.

The conventional bump forming method is described below. Referring to FIGS. 8A to 8E, one of the conventional methods can form a bump on the pad 41 on the side 40A as part of the wafer 40. First, the periphery around each of the pads 41 of aluminum or the like, formed on the side 40A as part of the wafer 40, was covered with the passivation film 42, to electrically protect the side 40A of the wafer 40, as shown in FIG. 8A.

Then, each pad 41 on the side 40A of the wafer 40 was coated with a metal mask (not shown) having an opening corresponding to the pad 41 in such a way to expose the pad 41 (or a photoresist film is formed in such a way to expose the pad 41), as shown in FIG. 8B. Next, the wafer 40 is set in a sputtering apparatus, and the adhesive layer 44 of chromium or the like, functioning to improve adhesion between the pad 41 and bump on the side 40A of the wafer 40, and the barrier metal layer 45 of copper or the like are formed one by one on the pad 41 by sputtering, to form the laminated BLM film layer 46 composed of the adhesive layer 44 and barrier metal layer 45.

Then, the metal mask, formed on the side 40A of the wafer 40, is removed. This removes that portion of the BLM film layer 46 formed on the mask, leaving the BLM film layer 46 on the pad 41 on the side 40A of the wafer 40.

Next, the photoresist film 47 is formed on the side 40A of the wafer 40, and exposed and developed in such a way to expose the BLM film layer 46, as shown in FIG. 8C. Then, the bump material 48 of lead and tin is spread on the side 40A of the wafer 40 by plating or evaporation, as shown in FIG. 8D. Then, the photoresist film 47 formed on the side 40A of the wafer 40 is removed, together with that portion of the bump material 48 formed thereon. This leaves the bump material 48 on the corresponding BLM film layer 46.

In the conventional bump forming method, the wafer 40 laminated with the bump material 48 on the BLM film layer 46 was supplied by, e.g., Tanaka Kikinzoku Hanbai K.K. when it was laminated by plating, and by, e.g., IBM Japan when it was laminated by evaporation.

Next, a flux (not shown) (e.g., Senju Metal Industry Co., Ltd.'s Deltalux 530®) was spread on the side 40A of the wafer 40 with the bump material 48 on the BLM film layer 46, as shown in FIG. 8E. Approximately 5.0 g to 6.0 g of the flux was spread on a 6-inch wafer.

When a solder heating/fusing apparatus working in a nitrogen ($N_2$) atmosphere (Yamato Seisakusho's $N_2$ Solder Reflow System NRY-101V6LV) was used, the bump material 48 formed on the BLM film layer 46 on the wafer 40 was heated/fused in an $N_2$ atmosphere containing oxygen ($O_2$) at around 25 to 30 ppm. Lead was synthesized with tin, when the bump material 48 was fused, to form the comparative spherical bump 48A.

Figure 23:
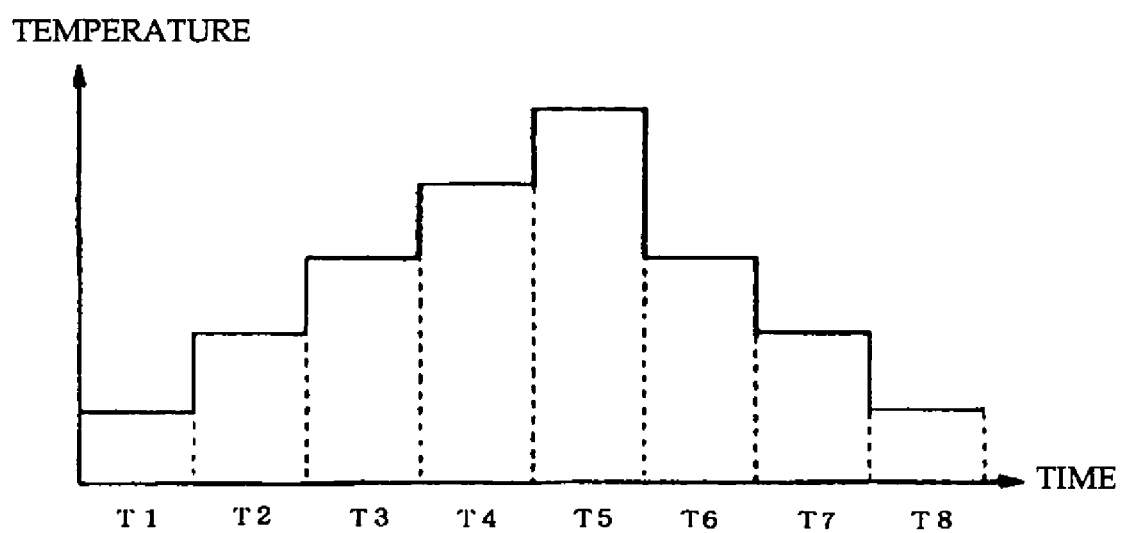
FIG. 23 outlines a temperature profile in the wet back treatment conducted in EXAMPLE.

As shown in FIG. 23, the $N_2$ solder heating/fusing apparatus had 6 zones (Zone 1 to Zone 6) operating at different temperature, where each zone was set at a given temperature level by the hot plate or infrared (IR) heater. The apparatus stopped the wafer 40 in each zone for a given time to heat it at a given temperature.

When the hot plate was used to control temperature in the apparatus, the bump material 48 formed on the pad 41 on the wafer 40 was heated stepwise in Zones 1, 2 and 3 set at around 100° C., 150° C. and 250° C. The bump material 48 formed on the BLM film layer 46 on the wafer 40 was heated in Zone 4 as the main heating zone set at around 350° C. Then, the bump material 48 heated/fused on the BLM film layer 46 on the wafer 40 was cooled stepwise in Zones 5 and 6 set at around 200° C. and 100° C., to form the comparative bump 48A on the pad 41 on the wafer 40 via the BLM film layer 46.

When the infrared heater was used to control temperature in the apparatus, on the other hand, the bump material 48 formed on the BLM film layer 46 on the wafer 40 was heated stepwise in Zones 1, 2 and 3 set at around 150° C., 250° C. and 350° C. The bump material 48 formed on the BLM film layer 46 on the wafer 40 was heated in Zone 4 as the main heating zone set at around 400° C. Then, the bump material 48 heated/fused on the BLM film layer 46 on the wafer 40 was cooled stepwise in Zones 5 and 6 set at around 350° C. and 250° C., to form the conventional bump 48A on the pad 41 on the wafer 40 via the BLM film layer 46.

In the above procedure, the wafer 40 was stopped in Zones 1 to 6 in the $N_2$ solder heating/fusing apparatus for around 30, 40, 50, 40, 40 and 60 seconds, respectively.

The comparative bump 48A was also formed by solder dipping, in addition to plating and evaporation. In the dipping method, the solder resist film 47 was laminated on the passivation film 42 formed on the side 40A of the wafer 40, on which the BLM film layer 46 was formed on the pad 41.

Next, a flux (e.g., Senju Metal Industry Co., Ltd.'s Deltalux 530®) was spread on the side 40A of the wafer 40. Next, the bump material 48 composed of lead and tin was fused at around 380° C. and put in a dipping tank, where it was prepared in such a way to contain lead at 90% by mass to 98% by mass based on the totaled lead and tin weight and contain tin at a varying content of 10% by mass to 2% by mass based on lead.

Then, the wafer 40 was immersed in fused lead and tin in the dipping tank, to place the fused lead and tin on the BLM film layer 46 formed on the pad 41 on the wafer 40. This produced the comparative bump 48A on the BLM film layer 46, made spherical by the surface tension of the fused lead and tin, and action of the flux.

The wafer 40 on which the comparative bumps 48A were formed by plating, evaporation or dipping was washed with a glycol-based detergent (e.g., Asahi Kasei Corp.'s Eliese M9000®) kept at around 50° C., in which it was shaken for around 20 minutes. Then, the wafer 40 was washed with a detergent (e.g., 2-propanol (isopropanol) supplied by Kanto Kagaku Co., Ltd.) kept at around room temperature, in which it was shaken for around 10 minutes. In this way, the flux remaining on the passivation film 42 was washed off. This produced the comparative bump 48A formed on each pad 41 on the wafer.

(Characteristics Comparison Between the Solder Bumps Formed in EXAMPLES and Comparative Bumps)

The bumps of the present invention formed in EXAMPLES 22 to 29 by a liquid spraying method (e.g., ink jetting method) (these bumps are hereinafter referred to as Nos. 1 to 16 bumps) and 3 types of the bumps formed by the conventional method (these bumps are hereinafter referred to as Nos. 1 to 3 comparative bumps) were tested for outer appearances, cross-sectional conditions, mechanical strength, washability, and reliability for which the test was carried out for the IC chip cut off from the wafer 40 was actually assembled on a printed-wiring board.

Outer appearances and cross-sectional conditions of the solder bump were observed by a metaloscope (Nikon Corp.'s OPTIPHOT XUM-M®) at a magnification of 40.

It was also observed by a scanning electron microscope (hereinafter sometimes referred to as SEM, JOEL Ltd.'s SCANNING MICROSCOPE JSM-5300LU®) at a magnification of 1000 to 3000 for its outer appearances and cross-sectional conditions.

Shear strength and tensile strength of the bump were determined in the mechanical strength tests by a bump strength tester (Rhesca Co., Ltd.'s PULL TESTER TYPE PTR-01®) under the conditions of Y distance: 0.2 mm, speed: 0.1 to 1.0 mm/second, 0.1, and location: 5. In the shear strength test, a stress was applied to the bump at a given point in the direction perpendicular to the wafer 40 thickness direction, to determine the strength at which the bump was torn off. In the tensile strength test, a tensile stress was applied to the bump off the side 40A of the wafer 40, to determine the strength at which the bump came off from the pad 41 (for Nos. 1 to 16 bumps) or from the BLM film layer 46 (for the comparative bumps 48A).

The washability test was carried out only for the conventional bumps 48A formed by the conventional method, which uses a flux for forming the bump. In the washability test, the passivation film 42 on the wafer 40 was observed, after the flux was washed off, whether the flux remained thereon (the remaining flux is hereinafter sometimes referred to as "residue").

The residue was observed by a metaloscope (Nikon Corp.'s OPTIPHOT XUM-M®) at a magnification of 40, and by an SEM (JOEL Ltd.'s SCANNING MICROSCOPE JSM-5300LU®) at a magnification of 1000 to 3000.

Three types of reliability tests were carried out, low temperature shock program and ion migration tests, and high-temperature reliability test in which the specimen was held at high temperature for a given time.

In the low temperature shock program test, the specimen was set in a low temperature shock program tester (ESPEC Corp.'s ESPEC THERMAL SHOCK CHAMBER TSB-2 or tsv40ST®) to be subjected to atmosphere temperature cycles between −30 and 150° C., to observe whether the joint between the bump and pad 41 was cracked or not.

In the tester, the specimen was kept at around −30° C. for around 1 hour, heated to around 150° C. in around 30 minutes, at which it was held for around 1 hour, and then cooled to around −30° C. in around 30 minutes in one cycle lasting around 3 hours.

In the ion migration test, an ion migration analysis system (Kusumoto Chemicals, Ltd.'s SIR10®) was used, where an electrical field was applied to the adjacent bumps formed on each pad 41 in an IC chip under given high temperature and humidity conditions, to confirm whether or not a short circuit resulted between these bumps from the metallic ion releasing out on the cathode side.

In the high-temperature reliability test in which the specimen was held at high temperature, it was held at 120° C. and 210° C. in a constant-temperature, constant-humidity chamber (Advantest Corp.) to observe conditions of the BLM film layer 46 whether it was deteriorated by the mutual diffusion between the bump and film layer at each temperature level.

Table 22 compares Nos. 1 to 16 bumps with Nos. 1 to 3 comparative bumps, where the comparison is predicted based on the comparative test results.

Table 22 gives the test results with Nos. 1 to 4 solder bumps of the present invention and Nos. 1 to 3 comparative bumps formed by the conventional method. The results observed with Nos. 5 to 16 solder bumps of the present invention are similar to those with No. 1 solder bumps.

As shown in Table 22, it was observed by the metaloscopic analysis that Nos. 1 to 3 comparative bumps had a blackened surface, and a number of irregularly shaped bumps and scattered bumps, which caused bridging, because the adjacent bumps 48A came into contact with each other.

The conventional bumps are further described by referring to FIGS. 9A, 9B and 9C, each of FIGS. 9B and 9C being a magnified version of FIG. 9A. There were plurality of the scattered bumps 60 on the periphery of the comparative bump 48A formed on each pad 41 on the wafer 40, some coming into contact with each other to form the irregularly shaped bumps 61.

By contrast, Nos. 1 to 16 bumps of the present invention were glossy on the surface and ideally spherical, indicating that they are good both in surface characteristics and shape.

TABLE 22

| | No. 1 Bump | No. 2 Bump | No. 3 Bump | No. 4 Bump | No. 1 Comparative bump | No. 2 Comparative bump | No. 3 Comparative bump |
|---|---|---|---|---|---|---|---|
| Microscopic analysis (outer appearances) | Good in gloss, surface characteristics and shape, Ideally spherical | The same as the left | The same as the left | The same as the left | Blackened surface, and a number of irregularly shaped bumps, scattered bumps and bridged bumps observed | The same as the left | The same as the left |
| SEM analysis (outer appearances and cross-sectional conditions) | Good adhesion between the pad and bump | The same as the left | The same as the left | The same as the left | A number of voids, cracks and irregularly shaped bumps observed, Significant diffusion of the BLM film layer | The same as the left | The same as the left |
| Shear test (Strength) | 10 kgf OK | The same as the left | The same as the left | The same as the left | 5 kgf NG | The same as the left | The same as the left |
| Tensile test | 1600 kgf OK | The same as the left | The same as the left | The same as the left | 500 kgf NG | The same as the left | The same as the left |
| Washability test | / | / | / | / | Black and white residues observed | The same as the left | The same as the left |
| Low-temperature shock program test −30 to 150° C. | OK in 1000 cycles (passing the specified level) | The same as the left | The same as the left | The same as the left | NG in 500 cycles | The same as the left | The same as the left |
| Ion migration test | OK in 1000 hours (passing the specified level) | The same as the left | The same as the left | The same as the left | NG at 500 hours | The same as the left | The same as the left |
| High-temperature reliability test 120° C., 210° C. | OK in 1000 hours both at 120 and 210° C. (passing the specified level) | The same as the left | The same as the left | The same as the left | NG in 500 hours at 120° C. NG in 100 hours at 210° C. | The same as the left The same as the left | The same as the left The same as the left |

The cross-sectional SEM analysis observed that Nos. 1 to 3 comparative bumps had a number of voids and cracks inside of the comparative bumps 48A, and also a number of irregularly shaped bumps caused by these voids and cracks. It also confirmed that the BLM film layer 46 on the pad 41 on the wafer 40 and the conventional bump 48A diffused to each other, to deteriorate the BLM film layer 46.

In other words, referring to FIGS. 11A to 11C, the comparative bump 48A of the bump material 48 formed on the BLM film layer 46 on the pad 41 on the wafer 40 (FIG. 11A) inherently becomes spherical, when heated and fused (FIG. 11B).

However, when the bump material 48 has a composition with unevenly distributed lead and tin, the voids 65, cracks 66, and scattered bumps 70 will result, because of uneven synthesis between lead and tin.

By contrast, each of Nos. 1 to 16 bumps was free of inside voids 65 and cracks 66, and fast bonded to the pad 41 on the wafer 40.

The strength test results are described. In the shear test, Nos. 1 to 3 comparative bumps were torn off at a stress of around 5 kgf. By contrast, Nos. 1 to 16 bumps were not torn off until the stress was increased to around 10 kgf. In the tensile test, on the other hand, Nos. 1 to 3 comparative bumps were separated from the BLM film layer at a stress of around 500 kgf, whereas Nos. 1 to 16 bumps were not separated from the pad 41 until the stress was increased to around 1600 kgf.

It is specified that a bump passes the standard when it is torn off in the shear test at a stress of 8 kgf or more, and fails to pass the standard when it is torn off at a stress below 8 kgf. It is also specified that a bump passes the standard when it is separated from the BLM film layer 46 or pad 41 at a stress of 1200 kgf or more, and fails to pass the standard when it is separated at a stress below 1200 kgf. Therefore, Nos. 1 to 3 comparative bumps failed to pass the standard both in the shear test and tensile test, whereas Nos. 1 to 16 bumps passed the standard both in the shear test and tensile test.

In the washability test, Nos. 1 to 3 comparative bumps had a flux residue scorched black under heating/fusing (hereinafter referred to as black residue) around themselves and, at the same time, a white residue of organic lead and tin, resulting from the reactions of lead and tin in the bump material 48 with an organic acid-based compound in the flux.

More specifically, referring to FIGS. 12 and 13, these bumps had a number of the black residue 80 around themselves (FIG. 12) and, at the same time, a number of the white residue 81 on the passivation film 42 on the wafer 40 (FIG. 13), and these black residue 80 and white residue 81 could not be washed out and remained on the wafer 40.

In the low temperature shock program test, Nos. 1 to 3 comparative bumps were cracked in the joint with the BLM film layer 46 at about 500 cycles. By contrast, Nos. 1 to 16 bumps were not cracked in the joint with the electroconductive, adhesive layer 6 at 1000 cycles as the predetermined standard, confirming that the bump fast bonded to the electroconductive, adhesive layer 6.

In the ion migration test, Nos. 1 to 3 comparative bumps had a short circuit between the adjacent bumps in around 500 hours after the test was started. By contrast, Nos. 1 to 16 bumps of the present invention showed no short circuit between the adjacent bumps in 1000 hours as the predetermined standard after the test was started, keeping the original conditions on each pad 41 on the wafer 40.

In the high-temperature reliability test, Nos. 1 to 3 comparative bumps had the BLM film layer 46 deteriorated as a result of diffusion of the bump and layer to each other in around 500 hours after the test was started at around 120° C. Therefore, it was difficult for the BLM film layer 46 in Nos. 1 to 3 comparative bumps to be fast bonded to the pad 41 on the wafer 40 at a predetermined strength. In the test carried out at around 210° C., on the other hand, Nos. 1 to 3 comparative bumps and BLM film layer 46 similarly diffused to each other in around 100 hours after the test was started. Therefore, it was difficult for the BLM film layer 46 in Nos. 1 to 3 comparative bumps to be fast bonded to the pad 41 on the wafer 40 at a predetermined strength also in this test.

By contrast, Nos. 1 to 16 bumps showed no diffusion of the bump and BLM film layer 46 to each other in 1000 hours after the test was started both at 120° C. and 210° C., with the result that each bump was fast bonded to the pad 41 on the wafer 40.

Table 23 compares the bump forming method of the present invention with the conventional method, based on the comparative test results. The conventional bump forming method needs waste solution treatment. It is essential, because a large quantity of the waste solution is discharged also from the flux washing-out step subsequent to the bump material heating/fusing step. By contrast, the bump forming method described in EXAMPLES needs a waste solution treatment system of simple structure, because quantity of the make-up flux is limited to the level discharged from the ink jetting step. The system may be even eliminated. As a result, the bump forming process can be simplified.

at the highest. By contrast, the bump forming method described in EXAMPLES can secure a high yield of almost 100%, because the liquid spraying method (e.g., ink jetting method) it adopts discharges the ink at a uniform rate to form the bump of accurate size.

For economic efficiency for forming the bumps, the conventional bump forming method involves the BLM film layer forming step and photoresist film 47 separation step in the bump material forming steps, where at least 99% by mass of the materials for the BLM film layer 46 formed on the side 40A of the wafer 40 and bump material 48 are removed, leaving behind the BLM film layer 46 and bump material 48 composed of the remaining materials. This should increase the cost. By contrast, the bump forming method described in EXAMPLES adopts the ink jetting method which discharges the ink at a very low rate, the discharged materials being totally used for forming the bumps. This should greatly improve economic efficiency from that associated with the conventional method.

For adhesion of the bump to the pad 41 on the wafer 40, the BLM film layer 46 (of Cr or Cu) and conventional bump 48A (of Pb and Sn) formed by the conventional method diffuse to each other depending on environmental conditions, e.g., temperature and humidity, to deteriorate the BLM

TABLE 23

| Item | Bump forming method used in EXAMPLES | Conventional bump forming method |
|---|---|---|
| Waste solution treatment | The system is very simple, or not required. | Required |
| Bump forming process | Simple | Various steps are required, each step consuming time |
| Uniformity of bumps formed | Almost uniform, showing little distribution | Significantly distributed both in height and shape |
| Yield | High (almost 100%) | 90% at the highest |
| Economic efficiency | All of the formed bumps are usable | Materials are mostly discarded, and used for the final BLM film layer and bumps to only 1% or less. |
| Adhesion to pad | Excellent | Bumps may sometimes come off from the pad |

The conventional bump forming method needs the BLM film layer forming and bump material forming step, the former needing the photoresist film 47 forming step and the latter photoresist film 47 releasing step, which should make the conventional method complex and highly time-consuming. By contrast, the bump forming method described in EXAMPLES is more simply structured, because the above steps can be eliminated.

For uniformity of the bump formed on the pad 41 on the wafer 40, the conventional bump forming method may sometimes cause distributions of lead and tin in the bump material 48 formed on the BLM film layer 46. The distributed composition can lead to distributions in height and shape in the bump 48A formed on the pad 41 on the wafer 40. By contrast, the bump forming method described in EXAMPLES adopts an ink jetting method which can discharge the ink at a uniformly controlled rate and hence form the bump accurate both in shape and size, with the result that the bump 5 formed on each pad 41 on the wafer 40 is almost uniform both in shape and size.

For bump yield, the conventional bump forming method forms the bump 48A on the pad 41 on the wafer 40, which has not only distributed height and size but also voids and cracks inside, with the result that it can secure a yield of 90% film layer 46 in a short time, even cause the conventional bump 48A to come off from the BLM film layer 46. By contrast, the bump forming method described in EXAMPLES forms the electroconductive, adhesive layer 6 and bump 5 (of Pb and Sn) not diffusing to each other, allowing the bump 5 to be fast bonded to the pad 41 via the electroconductive, adhesive layer 6 for a much longer time than the conventional bump forming method, because the service period is determined only by deterioration of the electroconductive, adhesive layer 6.

The bump forming method described in EXAMPLES needs neither a BLM film layer forming step nor bump material forming step, which should simplify the bump forming step.

The bump forming method described in EXAMPLES adopts the ink jetting method which discharges the ink at a more uniform rate than the conventional bump forming method to form the bumps of uniform size, preventing bridging of the bumps resulting from the bumps of uneven height, voids 65 and cracks 66 in the bumps, irregularly shaped bumps and scattered bumps, found in the bumps formed by the conventional bump forming method. In other words, the bump forming method described in EXAMPLES forms the bump 5 of uniform properties (e.g., surface characteristics, shape and composition) on the pad 41, thereby improving bump yield.

Moreover, the bump forming method described in EXAMPLES dispenses with a step of releasing the photoresist film 47, unlike the conventional bump forming method, which should reduce the cost for forming the bump on each pad 41 on the wafer 40 and greatly improve economic efficiency for bump forming.

Still more, the bump forming method described in EXAMPLES forms the bump 5 on each pad 41 on the wafer 40 via the electroconductive, adhesive layer 6, which should greatly improve adhesion of the bump 5 to each pad 41. Still more, no diffusion occurs between the electroconductive, adhesive layer 6 and bump 5, to keep the bump adhesive to the pad 41 for a much longer time.

The bump formed on each pad 41 on the wafer 40 by the bump forming method described in EXAMPLES is much more reliable than the one formed by the conventional bump forming method, as confirmed by the reliability tests, e.g., low temperature shock program, thermal shock, ion migration and high-temperature reliability tests.

In the semiconductor device with the bump formed by the bump forming method described in EXAMPLES on each pad 41 on the wafer 40, the bump can be easily bonded to the pad 41 via the electroconductive, adhesive layer 6 fast bonded to the bump 5 and pad 41. Adhesive strength of the each bump 5 to each pad 41 can be kept for a much longer time.

As discussed above, the bump forming method described in EXAMPLES can greatly reduce the working time for production of semiconductor devices, because the formed bump 5 can be easily bonded to the corresponding pad 41 via the electroconductive, adhesive layer 6 fast bonded to the bump 5 and pad 41.

EXAMPLES describe the wafer 40 carrying ICs of IC chips as the object on which the bumps are to be formed. The objects for the present invention are not limited to the above wafer, but include a wafer carrying circuits of large scale IC (LSI) chips, ball grid array (BGA) and chip size package (CSP), among others.

EXAMPLES also describe the electroconductive, adhesive layer formed by an ink jetting method. The methods for forming the electroconductive, adhesive layer are not limited to the above. For example, the bump may be formed by an ink jetting method on the electroconductive, adhesive layer 46 formed by metal-masked printing, screen printing or the like on each pad 41 on the wafer 40.

The present invention heats/fuses the solder alloy material and flux material layer, formed one by one by a liquid spraying method (e.g., ink jetting method) on an intermediate metallic layer on an external electrode pad in a semiconductor device, to form the bumps. As such, it can form the bumps more simply and quickly at a lower cost than the conventional bump forming method, and hence realize the bump forming method which can greatly reduce working time for the bump forming step.

Moreover, the bump forming method of the present invention forms an electroconductive, adhesive layer in place of intermediate metallic layer by a liquid spraying method (e.g., ink jetting method) to dispense with the complicated steps and solvent treatment steps involved in the conventional method. The present invention can also provide the solder alloy layer forming ink composition, flux layer forming ink composition and electroconductive, adhesive layer forming composition excellent in dischargeability and patterning and film-making characteristics by including a step which uses a supercritical or subcritical fluid.

The present invention also realizes the bump forming method which can form the patterns more simply and easily at a lower cost than the conventional bump forming method, and hence greatly reduce working time for the bump forming step by adopting a liquid spraying method (e.g., ink jetting method).

Moreover, the present invention can form the very fine bumps, difficult for the conventional method to produce, 30 µm in diameter or less, needless to say, 10 µm or less, even 1 µm or less.

The flux material layer composition of the present invention, spread by a liquid spraying method (e.g., ink jetting method), contains an activator decomposed/sublimated at 100° C. to 300° C. and another activator decomposed/activated at 350° C. to 400° C.

One example of the activator component decomposed/sublimated at 100° C. to 300° C. exhibiting effects of removing an oxide film from the solder alloy material surface, improving soldering characteristics and improving surface characteristics (e.g., by imparting surface gloss) is an organic acid-based activator which leaves no residue, and one example of the activator component decomposed/activated at 350° C. to 400° C. exhibiting an effect of removing voids present in the bump, preventing scattering of the solder alloy material or uniformly fusing the solder alloy material is a halogen compound-based activator leaving a residue. Such a flux material layer composition, containing the organic acid-based activator at 0.01% by mass to 10% by mass and halogen compound-based activator also at 0.01% by mass to 10% by mass, both based on the solids in the composition, can sufficiently satisfy the expected functions for forming the solder bumps, desirably form the solder bumps and improve productivity, because the organic acid-based activator exhibits its effects for surface characteristics and shape of the solder bump during the preheating step at 100° C. to 300° C., and the halogen compound-based activator exhibits its effect for bump forming during the main heating step at 350° C. to 400° C.

Moreover, the flux material layer composition of the present invention, spread by a liquid spraying method (e.g., ink jetting method), contains at least a surfactant as an activator decomposed/sublimated at 100° C. to 300° C. and another surfactant decomposed/activated at 50° C. to 400° C., the former exhibiting effects of removing an oxide film from the solder alloy material surface, improving soldering characteristics and improving surface characteristics (e.g., by imparting surface gloss) and the latter exhibiting an effect of removing voids present in the bump, preventing scattering of the solder alloy material or uniformly fusing the solder alloy material, can sufficiently satisfy the expected functions for forming the solder bumps, desirably form the solder bumps and improve productivity, because these surfactants exhibit the effects for surface characteristics and shape of the solder bump or the effect for bump forming over the preheating period at 100 to 300° C. and main heating step at 350° C. to 400° C.

Moreover, the flux useful under high temperature conditions, such as those used for the wet back treatment, can be realized by dissolving, in a solvent, a solute composed of a natural and hydrogenated rosin, and resin incorporated in the rosin at around 1 to 99% by mass based on the natural and hydrogenated rosin totaled; and activators working at given temperature.

The bump forming method described in EXAMPLES needs a waste solution treatment system of simple structure for treating the waste solution, e.g., organic solvent discharged from the washing step, because quantity of the make-up flux is limited to the level discharged from the liquid spraying method (e.g., ink jetting step), which should further simplify the bump forming step.

The present invention also provides the bump forming method forms an electroconductive, adhesive layer on an external electrode pad in a semiconductor device by a liquid spraying method (e.g., ink jetting method) and transfers solder balls onto the electroconductive, adhesive layer, or forms an electroconductive, adhesive layer on solder balls and transfers the balls onto the pad. As such, it can form the bumps more simply and quickly at a lower cost than the conventional bump forming method. It realizes the bump forming method which can greatly reduce working time for the bump forming step. Moreover, it forms an electroconductive, adhesive layer in place of an intermediate metallic layer by an ink jetting method, dispensing with the complex, intermediate metallic layer forming step and solvent treatment step.

The present invention provides the solder alloy layer forming ink composition, flux layer forming ink composition and electroconductive, adhesive layer forming ink composition excellent in dischargeability, and patterning and film-making characteristics by including a step which uses a supercritical or subcritical fluid. The present invention also realizes the bump forming method which can form the patterns more simply and easily at a lower cost than the conventional bump forming method, and hence greatly reduce working time for the bump forming step by adopting a liquid spraying method (e.g., ink jetting method).

Moreover, the present invention can form the very fine bumps, difficult for the conventional method to produce, 30 µm in diameter or less, needless to say, 10 µm or less, even 1 µm or less.

Still more, the bump forming method described in EXAMPLES needs no flux, dispensing with a waste solution treatment system treating the waste solution, e.g., organic solvent discharged from the washing step, which should further simplify the bump forming step.

What is claimed is:

1. A process for forming a bump comprising the steps of:
forming an intermediate, metallic layer;
forming a solder alloy material layer on the intermediate, metallic layer;
forming a flux material layer on the solder alloy material layer; and
heating and fusing the solder alloy material layer and the flux material layer, wherein the bump is formed on an external electrode pad of a semiconductor device, and wherein the process includes at least one step of:
forming the electroconductive, adhesive layer as the intermediate, metallic layer by liquid-spraying an electroconductive, adhesive composition on the external electrode pad of the semiconductor device, the electroconductive, adhesive composition containing at least:
an electroconductive material;
a solvent; and
a wetting agent;
forming the solder alloy material layer by liquid-spraying a solder alloy material layer composition on the intermediate, metallic layer, the solder alloy material layer composition containing at least:
a solder alloy material;
a solvent; and
a wetting agent; and
forming the flux material layer by liquid-spraying a flux material layer composition on the solder alloy material layer, the flux material layer composition containing at least:
rosin;
an activator; and
a solvent.

2. A process for forming a bump according to claim 1, comprising:
forming the solder alloy material layer by liquid-spraying the solder alloy material layer composition on the intermediate, metallic layer; and
forming the flux material layer by liquid-spraying the flux material layer composition on the solder alloy material layer.

3. A process for forming a bump according to claim 1, wherein, for each of the electroconductive, adhesive composition, the solder alloy material layer composition, and the flux material layer composition,
a solid content thereof is from 0.01% by mass to 30.0% by mass;
a viscosity thereof is from 1 mPa·s to 20 mPa·s;
a surface tension thereof is from 20 mN/m to 70 mN/m;
a vapor pressure thereof at room temperature is from 0.001 mmHg to 50 mmHg; and
a contact angle thereof is from 30° to 170° with a material which constitutes a liquid spraying nozzle surface.

4. A process for forming a bump according to claim 1, wherein the electroconductive, adhesive composition, the solder alloy material layer composition, and the flux material layer composition are each produced by a process comprising at least one of:
contacting the electroconductive material with one of supercritical fluid and subcritical fluid;
dissolving the electroconductive material in one of the fluids; and
separating the electroconductive material from one of the fluids.

5. A bump forming process comprising:
disposing solder balls on one side of a substrate so that a position of each solder ball corresponds to a bump forming point on an object on which bumps are to be formed;
supplying an electroconductive, adhesive composition by a liquid spraying method to the bump forming points on the object on which bumps are to be formed;
positioning each solder ball and corresponding bump forming point by placing the substrate against the object on which bumps are to be formed in such a way to bring each solder ball into contact with the corresponding bump forming point via the electroconductive, adhesive composition;
fixing the solder ball on the corresponding bump forming point by solidifying the electroconductive, adhesive composition; and
releasing the substrate from a bump which is formed and fixed on the bump forming point on the object.

6. A bump forming process according to claim 5, wherein the positioning step is carried out to align electrodes on a semiconductor wafer with the solder balls on the substrate by an aligner while the semiconductor wafer and the substrate are being heated, and a collective transferring step is included to collectively transfer the solder balls to the electrodes by mounting the substrate on the semiconductor wafer.

7. A bump forming process according to claim 5, wherein, for the electroconductive, adhesive composition,
- a solid content thereof is from 0.01% by mass to 20.0% by mass;
- a viscosity thereof is from 1 mPa·s to 20 mPa·s;
- a surface tension thereof is from 20 mN/m to 70 mN/m;
- a vapor pressure thereof at room temperature is from 0.001 mmHg to 50 mmHg; and
- a contact angle thereof is from 30° to 170° with a material which constitutes a liquid spraying nozzle surface.

8. A bump forming process according to claim 5, wherein the electroconductive, adhesive composition is produced by a process comprising at least one of:
- contacting the electroconductive material with one of supercritical fluid and subcritical fluid;
- dissolving the electroconductive material in one of the fluids; and
- separating the electroconductive material from one of the fluids.

* * * * *